(12) United States Patent
Sako et al.

(10) Patent No.: US 9,147,686 B2
(45) Date of Patent: Sep. 29, 2015

(54) METHOD FOR FORMING SEMICONDUCTOR DEVICE

(75) Inventors: Nobuyuki Sako, Tokyo (JP); Eiji Hasunuma, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 524 days.

(21) Appl. No.: 13/271,874

(22) Filed: Oct. 12, 2011

(65) Prior Publication Data
US 2012/0100678 A1   Apr. 26, 2012

(30) Foreign Application Priority Data

Oct. 21, 2010   (JP) .................................. 2010-236488

(51) Int. Cl.
| | |
|---|---|
| *H01L 21/44* | (2006.01) |
| *H01L 27/108* | (2006.01) |
| *H01L 21/768* | (2006.01) |

(52) U.S. Cl.
CPC .... *H01L 27/10894* (2013.01); *H01L 21/76816* (2013.01); *H01L 21/76897* (2013.01); *H01L 27/10855* (2013.01); *H01L 27/10888* (2013.01)

(58) Field of Classification Search
USPC ............. 257/68, 382; 438/197, 675, 586, 572
See application file for complete search history.

(56) References Cited

U.S. PATENT DOCUMENTS

| | | | |
|---|---|---|---|
| 6,426,255 B1 | 7/2002 | Asano et al. | |
| 2001/0019142 A1 | 9/2001 | Nakahata et al. | |
| 2003/0183822 A1* | 10/2003 | Lane et al. ...................... | 257/68 |
| 2003/0186491 A1* | 10/2003 | Kubo et al. ................... | 438/197 |
| 2009/0212370 A1* | 8/2009 | Ikei .............................. | 257/368 |

FOREIGN PATENT DOCUMENTS

| | | |
|---|---|---|
| JP | 10-163477 A | 6/1998 |
| JP | 11-163294 A | 6/1999 |
| JP | 2000-315778 A | 11/2000 |
| JP | 2002-009174 A | 1/2002 |
| JP | 2002-299571 A | 10/2002 |
| JP | 2009-200255 A | 9/2009 |

* cited by examiner

*Primary Examiner* — Errol Fernandes

(57) ABSTRACT

A method of forming a semiconductor device includes the following processes. A first interlayer insulating film is formed over a cell transistor and a peripheral transistor. A cell contact hole is formed in the first interlayer insulating film, the cell contact hole reaching the cell transistor. A lower contact plug is formed at a bottom of the cell contact hole. A peripheral contact hole is formed in the first interlayer insulating film, the peripheral contact hole reaching the peripheral transistor. A first peripheral contact plug is simultaneously formed in the peripheral contact hole and an upper contact plug in the cell contact hole, the upper contact plug being disposed on the lower contact plug.

5 Claims, 41 Drawing Sheets (C-C')  (A-A')

(C-C')     (A-A')

(D-D')

(C-C')   (A-A')

(D-D')

METHOD FOR FORMING SEMICONDUCTOR DEVICE

BACKGROUND OF THE INVENTION

1. Field of the Invention

The present invention generally relates to a method for forming a semiconductor device.

Priority is claimed on Japanese Patent Application No. 2010-236488, filed Oct. 21, 2010, the content of which is incorporated herein by reference.

2. Description of the Related Art

Japanese Unexamined Patent Application, First Publication, No. JP-A-2002-009174 discloses a semiconductor device which has a memory cell region, such as a DRAM. Japanese Unexamined Patent Application, First Publications, Nos. JP-A-2002-009174 also discloses a technique in which storage elements (for example, capacitors) disposed in the memory cell region and MOS transistors used for selecting are connected via a plurality of contact plugs.

With advances in the microstructuring of semiconductor devices, because the size of contact plugs disposed in the memory cell region has also been shrinking, the operational characteristics tend to be influenced by an increase in the electrical resistance value. If the contact plugs that are disposed in the memory cell region and directly connected to the semiconductor substrate are formed from metal, there has been concern with a worsening of storage operation characteristics, caused by the influence of an increase in the junction leakage current or the like.

Given this, Japanese Unexamined Patent Application, First Publications, Nos. JP-A-2002-299571 and JP-A-2009-200255 disclose that plugs that use metal for parts that are not directly connected to a semiconductor substrate are formed, thereby suppressing an increase in the electrical resistance value.

SUMMARY

In one embodiment, a method of forming a semiconductor device may include, but is not limited to, the following processes. A first interlayer insulating film is formed over a cell transistor and a peripheral transistor. A cell contact hole is formed in the first interlayer insulating film, the cell contact hole reaching the cell transistor. A lower contact plug is formed at a bottom of the cell contact hole. A peripheral contact hole is formed in the first interlayer insulating film, the peripheral contact hole reaching the peripheral transistor. A first peripheral contact plug is simultaneously formed in the peripheral contact hole and an upper contact plug in the cell contact hole, the upper contact plug being disposed on the lower contact plug.

In another embodiment, a method for forming a semiconductor device may include, but is not limited to, the following processes. A cell transistor is formed a cell region of a semiconductor substrate. A peripheral transistor is formed in a peripheral circuit region of the semiconductor substrate. A first interlayer insulating film is formed over the cell transistor and the peripheral transistor. A cell contact hole is formed in the first interlayer insulating film. The cell contact hole reaches a first diffusion region of the cell transistor. A peripheral contact hole is formed in the first interlayer insulating film. The peripheral contact hole reaches a second diffusion region of the peripheral transistor. A silicon film which fills the cell contact hole is formed. The silicon film is removed to leave the silicon film at the bottom of the cell contact hole. A peripheral contact plug is simultaneously formed in the peripheral contact hole and a cell contact plug in the cell contact hole. The cell contact plug is disposed on the silicon film.

In still another embodiment, a method for forming a semiconductor device may include, but is not limited to, the following processes. A first transistor including a first diffusion layer is formed in a cell region of a semiconductor substrate. A second transistor including a second diffusion layer is formed in a peripheral circuit region of the semiconductor substrate. A first contact layer including silicon is formed. The first contact layer is in contact with the first diffusion layer. A metal film is formed over the first and second transistors. The metal film is in contact with the first metal contact layer, the metal film being in contact with the second diffusion layer. The metal film is patterned to form a first contact plug being in contact with the first contact layer and a second contact plug being in contact with the second diffusion layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1A:
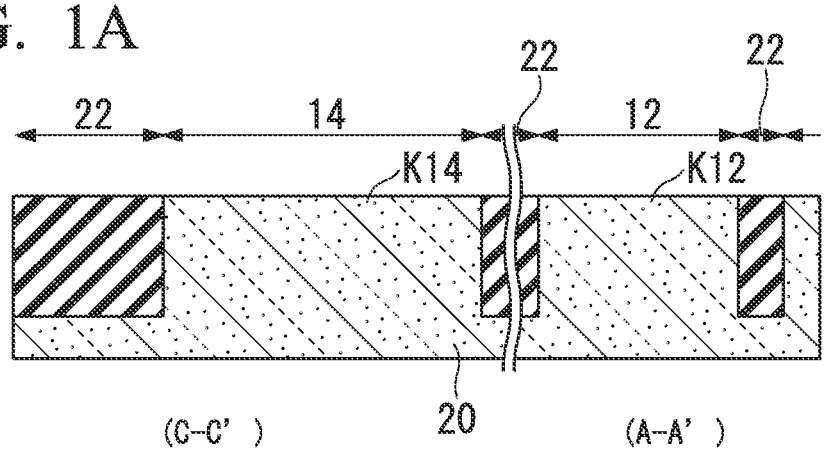
FIG. 1A is a fragmentary cross sectional elevation view, taken along the A-A' line and C-C' line of FIG. 1B, illustrating a semiconductor device in a step involved in a method of forming the semiconductor device, in which an isolation region and an active region are formed in a peripheral circuit region and a memory cell region on a semiconductor substrate, in accordance with one embodiment of the present invention.

Before describing the present invention, the related art will be explained in order to facilitate the understanding of the present invention.

When laminating first and second contact plugs, the formation using metal for only the first plug provided over the second plug (for example, as in Japanese Unexamined Patent Application, First Publication, No. JP-A-2002-299571) facilitates manufacturing. However, there is a limit to the effect of lowering the resistance value because it is not possible to reduce the resistance value of the first plug provided below the second plug.

In contrast, the method of depositing silicon on only a part that makes contact with the bottom surface within one contact hole and filling the inside of the contact hole above silicon with a metal (for example, as in Japanese Unexamined Patent Application, First Publication, No. JP-A-2009-200255), has an effect in reducing the resistance value, but has the problem of a complex manufacturing process.

Also, in a peripheral circuit region that it outside the memory cell region, to suppress an increase in the resistance value the contact plugs formed are generally formed by metal only. For this reason, it has been necessary to form different types of contact plugs in the memory cell region and the peripheral circuit region, thereby presenting a complex manufacturing process.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, the following processes. A first interlayer insulating film is formed over a cell transistor and a peripheral transistor. A cell contact hole is formed in the first interlayer insulating film, the cell contact hole reaching the cell transistor. A lower contact plug is formed at a bottom of the cell contact hole. A peripheral contact hole is formed in the first interlayer insulating film, the peripheral contact hole reaching the peripheral transistor. A first peripheral contact plug is simultaneously formed in the peripheral contact hole and an upper contact plug in the cell contact hole, the upper contact plug being disposed on the lower contact plug.

In some cases, the method may further include, but is not limited to, the following processes. The cell transistor is formed in a cell region of a semiconductor substrate. The peripheral transistor is formed in a peripheral circuit region of the semiconductor substrate.

In some cases, forming the cell contact hole may include, but is not limited to, forming the cell contact hole to reach a first diffusion region of the cell transistor. Forming the peripheral contact hole may include, but is not limited to, forming the peripheral contact hole to reach a second diffusion region of the peripheral transistor.

In some cases, forming the lower contact plug may include, but is not limited to, forming a silicon film which fills the cell contact hole and etching back the silicon film to leave the silicon film at the bottom of the cell contact hole.

In some cases, simultaneously forming the first peripheral contact plug and the upper contact plug may include, but is not limited to, forming a metal film which fills the cell contact hole and the peripheral contact hole and removing the metal film outside the cell contact hole and the peripheral contact hole.

In some cases, forming the cell transistor may include, but is not limited to, the following processes. A first gate insulating film is formed over the semiconductor substrate. A first gate conductive film is formed on the first gate insulating film. A first gate protection film is formed on the first gate conductive film to form a stacked structure. The stacked structure is patterned to form cell gate electrode structures which are separate from each other. Gate side wall insulating films are formed on side walls of the cell gate electrode structures.

In some cases, forming the cell contact hole may include, but is not limited to, forming a resist film over the first interlayer insulating film, the resist film having an opening between the gate side walls of adjacent ones of the cell gate electrode structures and selectively removing the first interlayer insulating film by using the resist film as a mask.

In some cases, forming the cell contact hole may further include, but is not limited to, forming separate circular opening patterns between the gate side walls of adjacent ones of the cell gate electrode structures.

In some cases, forming the resist film may include, but is not limited to, forming stripe opening patterns in the resist film, the stripe opening patterns extending across the cell gate electrode structures.

In some cases, forming the silicon film may include, but is not limited to, forming a phosphorous-doped polysilicon film by a chemical vapor deposition method.

In some cases, forming the silicon film may include, but is not limited to, forming a single crystal film by a selective epitaxial method.

In some cases, forming the metal film may include, but is not limited to, forming a contact layer, forming a barrier layer on the contact layer, and forming a core layer on the barrier layer. The contact layer includes at least one of titanium and cobalt.

In some cases, the method may further include, but is not limited to, carrying out a silicidation reaction between silicon of the semiconductor substrate and the at least one of titanium and cobalt of the contact layer in the peripheral contact hole and between silicon of the lower contact plug and the at least one of titanium and cobalt of the contact layer in the cell contact hole. The semiconductor substrate includes silicon.

In some cases, forming the peripheral contact hole may include, but is not limited to, forming first and second peripheral contact holes to reach source and drain regions of the peripheral transistor, respectively. Forming the first peripheral contact plug may include, but is not limited to, forming first and second peripheral contact plugs in the first and second peripheral contact holes, respectively. The method may further include, but is not limited to, forming third and fourth peripheral contact plugs which are connected to the first and second peripheral contact plugs, respectively.

In another embodiment, a method for forming a semiconductor device may include, but is not limited to, the following processes. A cell transistor is formed a cell region of a semiconductor substrate. A peripheral transistor is formed in a peripheral circuit region of the semiconductor substrate. A first interlayer insulating film is formed over the cell transistor and the peripheral transistor. A cell contact hole is formed in the first interlayer insulating film. The cell contact hole reaches a first diffusion region of the cell transistor. A peripheral contact hole is formed in the first interlayer insulating film. The peripheral contact hole reaches a second diffusion region of the peripheral transistor. A silicon film which fills the cell contact hole is formed. The silicon film is removed to leave the silicon film at the bottom of the cell contact hole. A peripheral contact plug is simultaneously formed in the peripheral contact hole and a cell contact plug in the cell contact hole. The cell contact plug is disposed on the silicon film.

In still another embodiment, a method for forming a semiconductor device may include, but is not limited to, the following processes. A first transistor including a first diffusion layer is formed in a cell region of a semiconductor substrate. A second transistor including a second diffusion layer is formed in a peripheral circuit region of the semiconductor substrate. A first contact layer including silicon is formed. The first contact layer is in contact with the first diffusion layer. A metal film is formed over the first and second transistors. The metal film is in contact with the first metal contact layer, the metal film being in contact with the second diffusion layer. The metal film is patterned to form a first contact plug being in contact with the first contact layer and a second contact plug being in contact with the second diffusion layer.

In some cases, the method may further include, but is not limited to, forming a first interlayer film over the first and second transistors and forming a first contact hole. The first contact hole reaches the first diffusion layer. Forming the first contact layer may include, but is not limited to, forming the silicon film to fill the first contact hole and etching back the silicon film so that a top of the silicon film is lower than a top of the first interlayer film.

In some cases, the method may further include, but is not limited to, forming a second contact hole before forming the metal film, the second contact hole reaching the second diffusion layer.

In some cases, the forming the metal film may include, but is not limited to, forming a second contact layer, forming a barrier layer on the second contact layer, and forming a core layer on the barrier layer. The second contact layer includes at least one of titanium and cobalt.

In some cases, the method may further include, but is not limited to, heating the semiconductor substrate after forming the first and second contact plugs to form a first silicide layer between the first contact layer and the first contact plug and a second silicide layer between the second diffusion layer and the second contact plug.

Hereinafter, a semiconductor device according to an embodiment of the invention will be described in detail with reference to the drawings. As a convenience, in assisting an understanding of the features, the drawings used in the following descriptions sometimes show such features enlarged, and the dimensional ratios and the like of constituent elements are not necessarily the same as in actuality. Also, the raw materials and dimensions and the like given as examples in the following descriptions are only examples, and the present invention is not restricted thereto, it being possible to embody arbitrarily variations within a scope that does not change the essence thereof.

First Embodiment

A first embodiment of a method for forming a semiconductor device according to the present invention is described below.

FIGS. 1A, 2A, 3A, 4A, 5A, 6, 7A, 8A, 9A, 10, 11A, 12A, 13A, and 14A are fragmentary cross sectional elevation views illustrating a semiconductor device in steps involved in a method of forming the semiconductor device in accordance with one embodiment of the present invention. FIGS. 1B, 2B, 3B, 4B, 5B, 7B, 8B, 9A, 11B, 12B, 13B, and 14B are fragmentary plan views illustrating the semiconductor device in steps involved in the method of forming the semiconductor device in accordance with one embodiment of the present invention. An example of this embodiment is that a semiconductor (storage) device 10 as a DRAM element having the cross-sectional structure shown in FIG. 14A can be formed by embodying the method for forming described below based on FIG. 1A to FIG. 14B.

Before describing the method for forming the semiconductor device according to the present embodiment, an example of the structure of the semiconductor device such as a DRAM element or the like that is to be formed by the method of the present embodiment is described below, making reference to FIG. 14A. The DRAM element to be formed by the present embodiment has a plurality of memory cell regions disposed over the DRAM element. A plurality of memory cell regions are disposed on the DRAM elements in the present embodiment, and within each of the memory cell regions memory cells having MOS transistors for selection and capacitors are disposed with a prescribed spacing therebetween to form a memory cell array. A peripheral circuit region is provided so as to be adjacent to each of the memory cell regions. The peripheral circuit region has disposed therein circuit blocks other than the memory cell array, including a sense amplifier circuit, a decoder circuit, and an input/output circuit form/to the outside of the DRAM elements.

Figure 14A:
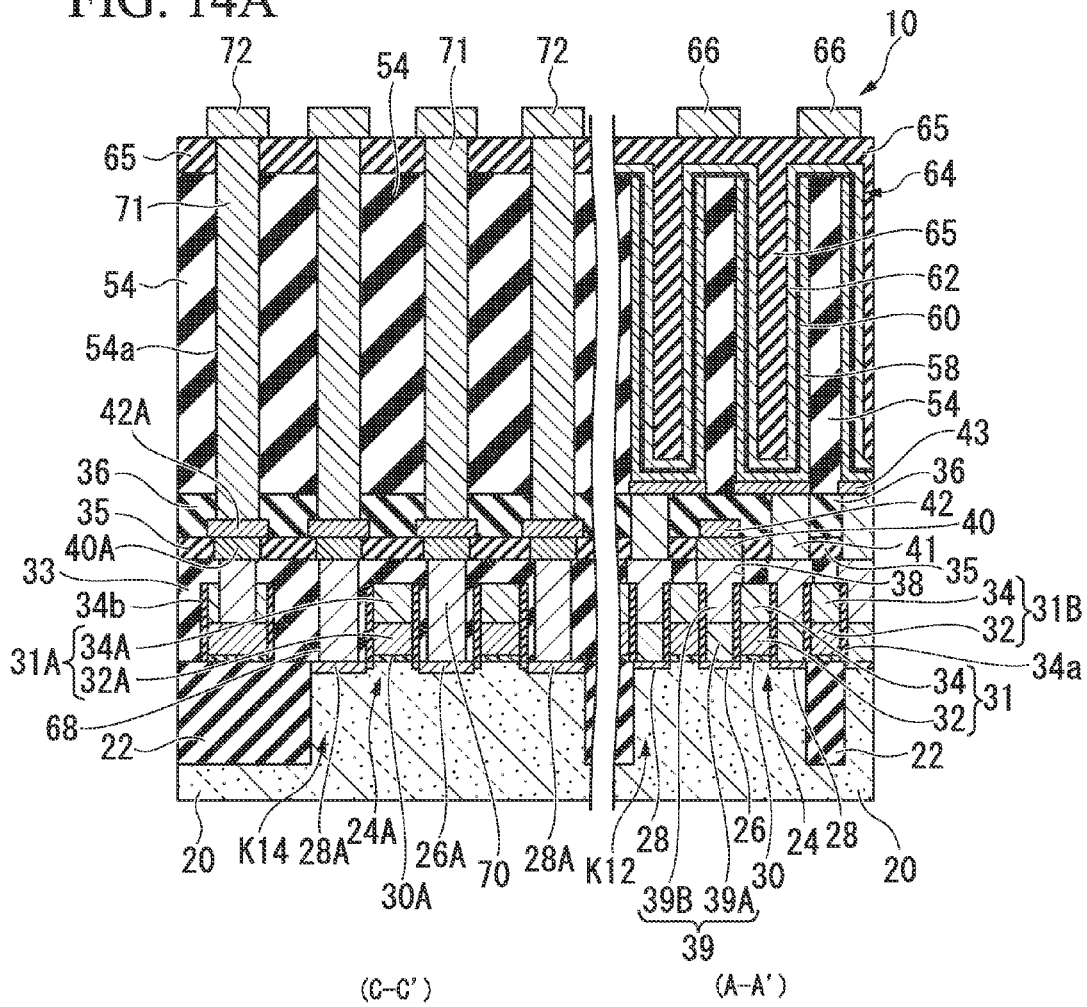
FIG. 14A is a fragmentary cross sectional elevation view, taken along the A-A' line and C-C' line of FIG. 14B, illustrating the semiconductor device in a step, subsequent to the step of FIG. 13A, involved in the method of forming the semiconductor device, in which a contact plug and a wiring are formed in the peripheral circuit region on the semiconductor substrate and a capacitor is formed in the memory cell region, in accordance with one embodiment of the present invention.
Figure 14B:
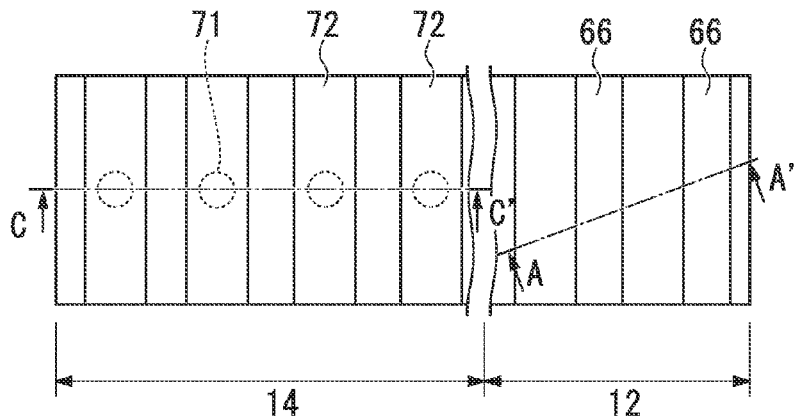
FIG. 14B is a fragmentary plan view illustrating the semiconductor device in a step, subsequent to the step of FIG. 13B, involved in the method of forming the semiconductor device in accordance with one embodiment of the present invention.

FIG. 14A is a fragmentary cross sectional elevation view, taken along the A-A' line and C-C' line of FIG. 14B, illustrating the semiconductor device that has a memory cell region of the above-noted DRAM cell and a peripheral circuit region. The semiconductor device 10 of the present embodiment may include, but is not limited to, a memory cell region 12 of the DRAM cell and a peripheral circuit region 14 on one and the same semiconductor substrate 20. In FIG. 14A, the cross sectional elevation view of a memory cell region 12 is on the right side, and the cross sectional elevation view of the peripheral circuit region 14 is on the left side.

First, the memory cell region 12 will be described.

The semiconductor substrate 20 may be, but is not limited to, a p-type silicon substrate. An isolation film 22 is provide for the purpose of partitioning and providing insulation and separation of the transistor formation regions of the semiconductor substrate 20 from other parts thereof. The isolation film 22 may be made of, but is not limited to, a silicon oxide ($SiO_2$) film.

In the memory cell 12 shown in FIG. 14A, diffusion layers 26 and 28 doped with an n-type impurity element are disposed on the center portion and both ends of an active region K12 that is partitioned by the isolation films 22. The diffusion layers 26 and 28 serve as the source region and the drain region respectively.

A gate insulating film 30 is formed above the semiconductor substrate 20 between the diffusion layers 26 and 28. A gate conductive film 32 is formed over the gate insulating film 30. A cell transistor 24 includes the diffusion layers 26 and 28, the gate insulating film 30, and the gate conductive film 32, but is not limited thereto. The cell transistor 24 is a selection transistor in the DRAM cell.

In the cell transistor 24, the gate insulating film 30 is formed by thermal oxidation as a silicon oxide film on the surface of the semiconductor substrate 20. The material of the gate insulating film 30 is not limited in this manner, however, and may be a high dielectric film (high-K film) such as a silicon oxynitride (SiON) film or a nitrided hafnium aluminate (HfAlON) film.

The gate conductive film 32 is formed by a multilayer film of polycrystalline silicon film that includes phosphorus and a metal film. The polycrystalline silicon film may be a doped polycrystalline silicon film formed by including an impurity element such as phosphorus therein when forming by CVD (chemical vapor deposition). The metal film can be high melting point metal film such as a tungsten (W) film, a tungsten nitride (WN) film, or a tungsten silicide film. One example of the gate conductive film 32 is a laminated structure of a polycrystalline silicon film that includes phosphorus, a tungsten nitride film, and a tungsten film.

A gate protective film 34 made of a silicon nitride film ($Si_3N_4$) is formed on the gate conductive film 32. The gate conductive film 32 and the gate protective film 34 form a cell gate electrode 31. The insulating film of silicon nitride film forms a gate side wall insulating film 34a on the side wall of the gate conductive film 32 and the gate protective film 34.

In the memory cell region 12, although the gate conductive film 32 and the gate protective film 34 are laminated over the isolation film 22 as well, what is formed over the isolation film 32 is a dummy gate electrode 31B, which is made of the gate conductive film 32 and the gate protective film 34.

In the memory cell region 12, a first interlayer film 33, a second interlayer insulating film 35, and a third interlayer film 36 are formed over the semiconductor substrate 20 and the gate protective film 34. The first interlayer insulating film 33, a second interlayer film 35, and a third interlayer film 36 may be formed, but is not limited to, by silicon oxide films. First contact holes 38 penetrate the first interlayer film 33 so as to connect to diffusion layers 26 and 28, respectively. A cell contact plug 39 made of a lower conductive plug 39A and an upper conductive plug 39B is formed inside each of the first contact holes 38.

Above the cell contact plug 39 connected above the diffusion layer 26 and in a contact hole that is formed in the second interlayer film 35 is formed a second contact plug 40. A first wiring 42 such as a bit wiring is formed over the second contact plug 40 so as to be covered by the third interlayer film 36. The cell contact plugs 39 that are coupled to and formed over the diffusion layers 28, 28, respectively are connected to connection plugs 41, respectively. The connection plug 41 is formed in a contact hole formed in the second interlayer film 35 and the third interlayer film 36. The connection plugs 41 reach a surface position of the third interlayer film 36. The first wiring 42, such as a bit wiring, may be made of a metal film such as tungsten, but is not limited thereto.

In the memory cell region 12, a second wiring 43 connects the connection plug 41 and a capacitor 64, to be described later, on the third interlayer film 36. A fourth interlayer film 54 made of silicon oxide or the like is formed on the third interlayer film 36 so as to cover the second wiring 43. In the fourth interlayer film 54, a capacitor deep hole cylinder 56 is formed above each of the second wirings 43.

A capacitor lower electrode 58 is provided on the inner bottom surface and inner peripheral surface of the capacitor deep hole cylinder 56. The capacitor lower electrode 58 is cup-shaped. The capacitor lower electrode 58 may be made of titanium nitride, but is not limited thereto. An upper electrode 62 made of a capacitor insulating film 60 and a metal film made of titanium nitride or the like is formed on the surface of the capacitor lower electrode 58, thereby forming the capacitor 64 that serves as the capacitive storage element that stores data. The upper electrode 62 may be made of zirconium oxide ($ZrO_2$) or aluminum oxide ($Al_2O_3$), but is not limited thereto.

The capacitor lower electrode 58 is coupled to the connection plug 41 via the second wiring 43 that is provided therebelow, and also is electrically connected to a diffusion layer 28 of the cell transistor 24, via the cell contact plug 39.

A fifth interlayer film 65 is provided above the capacitor 64. An upper wiring 66 is formed above the fifth interlayer film 65. Although it is not shown in FIG. 14A, the upper wirings 66 are connected to the upper electrodes 62 of the capacitors 64 in the memory cell region 12.

The structure of the peripheral circuit region 14 is described below.

The isolation film 32 formed in the semiconductor substrate 20 partitions transistor formation region and other regions in the peripheral circuit region 14 of the semiconductor substrate 20, and provides insulation and separation for the transistor formation region.

Diffusion layers 26A and 28A doped with an n-type impurity element are disposed on both end sides of the active region K14 partitioned by the isolation film 32. The diffusion layers 26A and 28A serve as the source region and drain region, respectively. A gate insulating film 30A is formed above the semiconductor substrate 20 in a region between the diffusion layers 26A and 28A. A gate conductive film 32A and a gate protective film 34A are formed over the gate insulating film 30A, these constituting a peripheral gate electrode 31A having a laminated structure. A transistor 24A of the peripheral circuit region 14 includes the diffusion layers 26A and 28A, the gate insulating film 30A, and the gate conductive film 32A, but is not limited thereto.

In the transistor 24A of the peripheral circuit region 14, the gate insulating film 30A is formed by a material that is equivalent to the gate insulating film 30 formed in the memory cell region 12. The gate conductive film 32A is formed of a material that is equivalent to the gate conductive film 32 formed in the memory cell region 12. The gate protective film 34A is constituted of a material that is equivalent to the gate protective film 34 formed in the memory cell region 12.

A side wall insulating film 34b is formed as an insulating film made of silicon nitride film or the like on the side wall sides of the gate electrode 32A and the gate protective film 34A of the peripheral circuit region 14. The side wall insulating film 34b is made of a material equivalent to the side wall insulating film 34a in the memory cell region 12.

The first interlayer film 33, the second interlayer film 35, and the third interlayer film 36 are formed in the peripheral circuit region 14 above the semiconductor substrate 20 and the gate protective film 34A. The first interlayer film 33, the second interlayer film 35, and the third interlayer film 36 are films that are equivalent to those formed in the memory cell region 12. First contact holes 68 are provided in the first interlayer film 33 so as to reach the diffusion layers 26A and 28A of the peripheral circuit region 14. A conductive plug 70 is provided within each of the first contact holes 68. The material of these conductive plugs 70 is a material that is equivalent to the upper conductive plugs 39B provided in the memory cell region 12 noted above.

In the peripheral circuit region 14, above the conductive plug 70 coupled to and formed over the diffusion layer 26A, and above the conductive plug 70 coupled to and formed over the diffusion layers 28A, 28A and in a contact hole part formed in the second interlayer film 35, second contact plugs 40A are formed. First wirings 42A are formed over the second contact plugs 40A so as to be covered by the third interlayer film 36. The material of the second contact plug 40A is a material that is equivalent to the second contact plug 40 formed in the memory cell region 12 noted above, and the first wiring 42A is made of a material equivalent to the first wiring 42 formed in the memory cell region 12 as noted above.

An upper wiring contact plug 71 is formed on the inside of a contact hole that is formed so as to penetrate the second interlayer film 35, the fourth interlayer film 54, and the fifth interlayer film 65 above the first wiring 42A.

The conductive plugs 70 coupled to and formed over the diffusion layers 28A, 28A are coupled to the second contact plugs 40A, the first wirings 42A, and the connection plugs 71, respectively. The second contact plugs 40A, the first wirings 42A, and the connection plugs 71 are formed in a contact hole formed in the second interlayer film 35 and the third interlayer film 36. The connection plugs 71 reach a surface position of the fifth interlayer film 65. The conductive plug 70 is coupled to the upper wiring 72 formed over the fifth interlayer film 65.

A method for forming the semiconductor device 10 according to the present embodiment will be described, with references made to FIG. 1A to FIG. 14B.

Figure 1B:
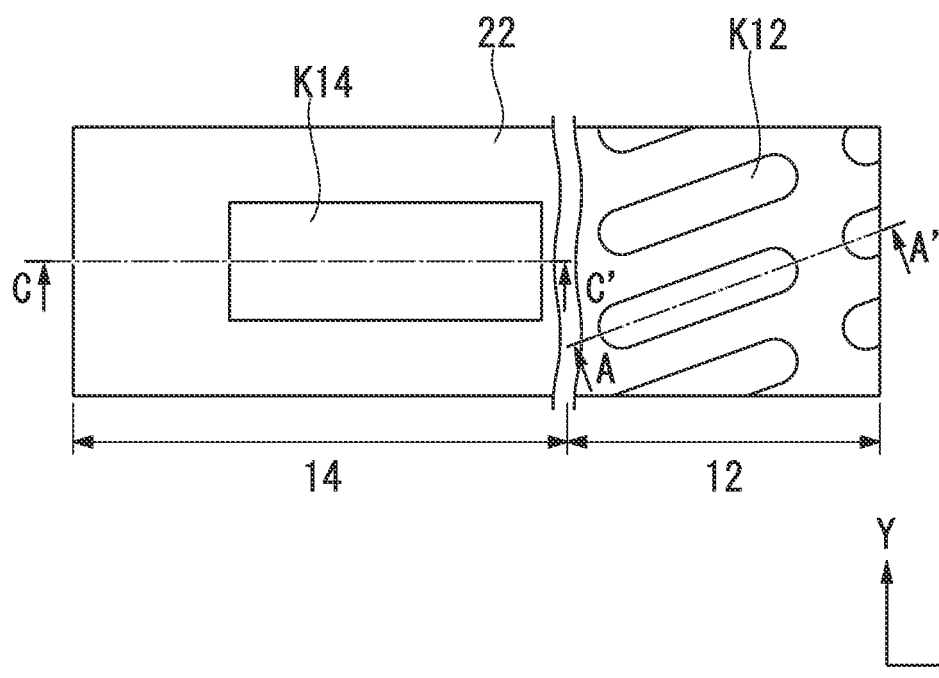
FIG. 1B is a fragmentary plan view illustrating the semiconductor device in a step involved in a method of forming the semiconductor device in accordance with one embodiment of the present invention.

FIG. 1A is a fragmentary cross sectional elevation view, taken along the A-A' line and C-C' line of FIG. 1B, illustrating a semiconductor device in a step involved in a method of forming the semiconductor device in accordance with one embodiment of the present invention. FIG. 1B is a fragmentary plan view illustrating the semiconductor device in a step involved in a method of forming the semiconductor device in accordance with one embodiment of the present invention. The left-side part of FIG. 1A is a partial cross sectional elevation view of the peripheral circuit region 14 along the line C-C' in FIG. 1B. The right-side part of FIG. 1A is a cross sectional elevation view of the memory cell region 12 along the line A-A' in FIG. 1B.

Of the drawings referenced below, the left-side parts of FIGS. 1A, 2A, 3A, 4A, 5A, 6, 7A, 8A, 9A, 10, 11A, 12A, 13A, and 14A are cross sectional elevation views of the peripheral circuit region 14 along the line C-C' indicated in the corresponding drawings of FIGS. 1B, 2B, 3B, 4B, 5B, 7B, 8B, 9A, 11B, 12B, 13B, and 14B. The right-side parts of FIGS. 1A, 2A, 3A, 4A, 5A, 6, 7A, 8A, 9A, 10, 11A, 12A, 13A, and 14A are cross sectional elevation views of the memory cell region 12 along the line A-A' indicated in the corresponding drawings of FIGS. 1B, 2B, 3B, 4B, 5B, 7B, 8B, 9A, 11B, 12B, 13B, and 14B. For the sake of simplification of the description of FIGS. 1B, 2B, 3B, 4B, 5B, 7B, 8B, 9A, 11B, 12B, 13B, and 14B, the X direction is defined as the left-right direction, and the Y direction is defined as the up-down direction. In the memory cell region 12, the direction of extension of the gate electrode corresponds to the Y direction, and the direction of extension of the C-C' lines in FIGS. 1B, 2B, 3B, 4B, 5B, 7B, 8B, 9A, 11B, 12B, 13B, and 14B is parallel to the X direction.

As shown in FIG. 1A, the isolation film 32 is formed by burying into a p-type semiconductor substrate 20, and an isolation region is formed. An active region is partitioned by the isolation film 32 and formed in the semiconductor substrate 20.

A silicon oxide ($SiO_2$) film can generally be used as the isolation film, but is not limited thereto. In the present embodiment the individual active regions K12 disposed in the memory cell region 12 are elongated circles that extend in a first direction, which intersects with the X direction at a prescribed angle. The individual active regions K12 are multiply disposed in a parallel arrangement with a prescribed pitch in the X and Y directions. The active region K14 disposed in the peripheral circuit region 14 is formed as a rectangle when seen in plan view. The shapes and arrangement of the active regions K12 and K14 shown in FIG. 1B are exemplary, and may be changed as desired.

Figure 2A:
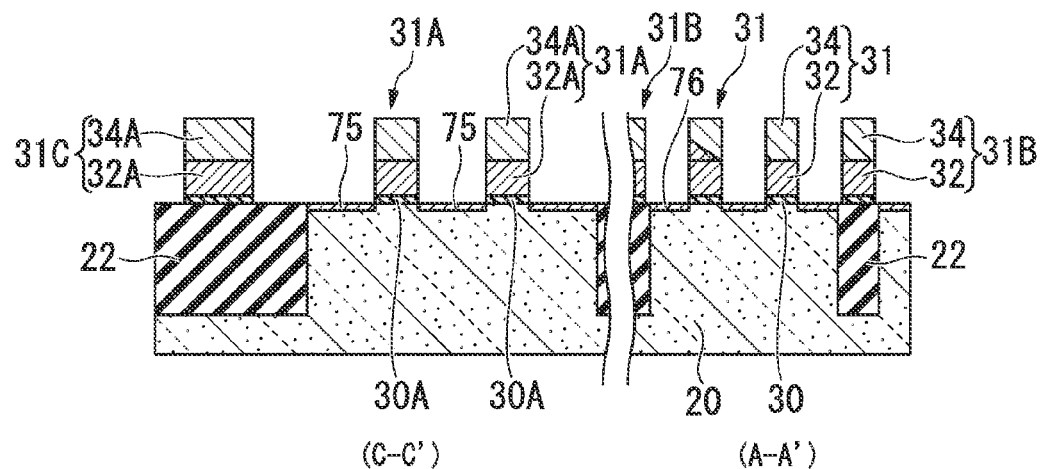
FIG. 2A is a fragmentary cross sectional elevation view, taken along the A-A' line and C-C' line of FIG. 2B, illustrating the semiconductor device in a step, subsequent to the step of FIG. 1A, involved in the method of forming the semiconductor device, in which a peripheral gate electrode and a cell gate electrode are formed in the peripheral circuit region and the memory cell region on the semiconductor substrate, in accordance with one embodiment of the present invention.
Figure 2B:
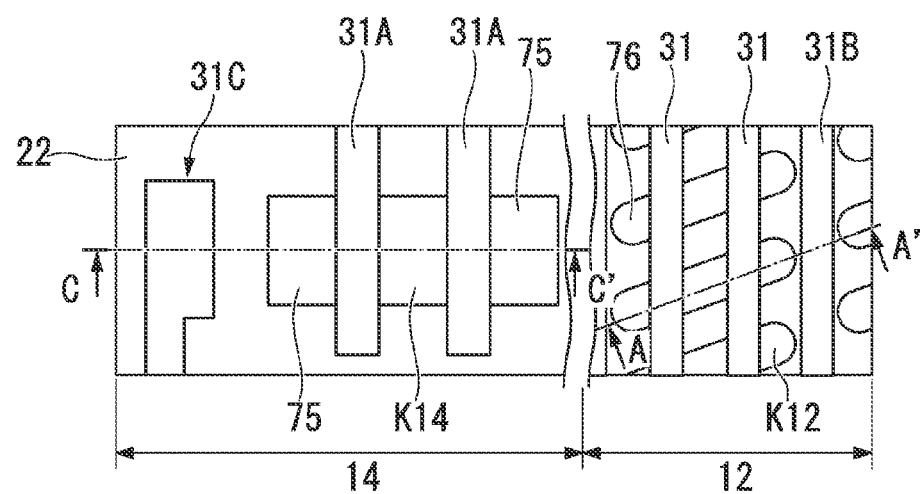
FIG. 2B is a fragmentary plan view illustrating the semiconductor device in a step, subsequent to the step of FIG. 1B, involved in the method of forming the semiconductor device in accordance with one embodiment of the present invention.

As shown in FIG. 2A and FIG. 2B, gate oxide films 30 and 30A made of silicon oxide films are formed by thermal oxidation on the active regions K12 and K14. The material and method of forming the gate oxide films 30 and 30A are not restricted in this manner. However, a high dielectric film (high-K film) such as silicon oxynitride (SiON) or a nitrided hafnium aluminate (HfAlON) may be used for the formation the gate oxide films 30 and 30A by a deposition method.

A gate conductive film is formed by lamination onto the gate insulation films 30 and 30A. As the material for the gate conductive film, it is possible to use film laminate made by sequential deposition of a polycrystalline silicon film that includes phosphorus, a titanium nitride film (WN), and a tungsten film (W). A gate protective film is formed over the gate conductive film. The material of the gate protective film may be silicon nitride ($Si_3N_4$).

By a photolithography process and a dry etching process, a photoresist mask is formed and, using the photoresist mask, the gate protective film and gate conductive film are successively etched. Thereby, in the memory cell region 12, a cell gate electrode 31 made of the gate protective film 34 and the gate conductive film 32 is formed. Also, in the peripheral circuit region 14, a peripheral gate electrode 31A made of the gate protective film 34A and the gate conductive film 32A is formed.

That is, as shown in FIG. 2B, in the peripheral circuit region 14, the peripheral gate electrode 31A is formed so as to run laterally across the active region K14 in the Y direction. In the present embodiment, the two peripheral gate electrodes 31A are formed in an arrangement in the X direction in the peripheral circuit region 14. A gate electrode 31C disposed over the element separation film 22 in the peripheral circuit region 14 is used as a wiring layer (peripheral gate wiring).

In the present embodiment, the cell gate electrode 31 is formed in the memory cell region 12 that passes laterally across the active region K12 in the Y direction. Two cell gate electrodes 31 are arranged in the X direction in parallel within each of the active regions K12. The cell gate electrodes 31 function as the word lines of the DRAM elements. In active regions that are adjacent in the X direction (on the isolation film 32), a cell dummy electrode 31B is formed. A cell dummy electrode 31B has the same structure as the cell gate electrode 31, and facilitates microstructuring by continuous pattern disposition of the gate electrode 31.

An n-type impurity element is introduced into the active region K14 that is not covered by the peripheral gate electrode 31A in the peripheral circuit region 14, so as to form a peripheral LDD diffusion layer 75. The introduction of the n-type impurity element is done by ion implantation, and is, for example, phosphorus as the impurity element, implanted with an energy of 10 keV and a dose of $2\times10^{13}$ atoms/cm$^2$.

An n-type impurity element is introduced into the active region that is not covered by the cell gate electrode 31 in the memory cell region 12, so as to form a cell diffusion layer 76. The introduction of the n-type impurity element is performed by ion implantation, and is, for example, phosphorus as the n-type impurity element, implanted with an energy of 10 keV and a dose of $1.5\times10^{13}$ atoms/cm$^2$. A peripheral LDD diffusion layer 75 and the cell diffusion layer 76 may be formed simultaneously using the same ion implantation conditions.

The side surfaces and upper surfaces of the cell gate electrode 31, the peripheral gate electrode 31A, the cell dummy electrode 31B, and the gate electrode 31C are covered to form gate side wall films. The material may be, but is not limited to, a silicon nitride film. The gate side wall film is etched back so as to leave the side walls of the gate electrodes 31, 31A, 31B, and 31C, thereby forming the gate side wall insulating films 34a as shown in FIGS. 3A and 3B.

An n-type impurity element is introduced into the active region K14 that is not covered by the peripheral gate electrode 31A and the gate side wall insulating film 34a in the peripheral circuit region 14, so as to form a peripheral SD (source/drain) diffusion layer 77. The introduction of the n-type impurity element is done by ion implantation, for example, an impurity element of arsenic implanted with an energy of 50 keV and a dose of $2\times10^{15}$ atoms/cm$^2$.

Figure 3A:
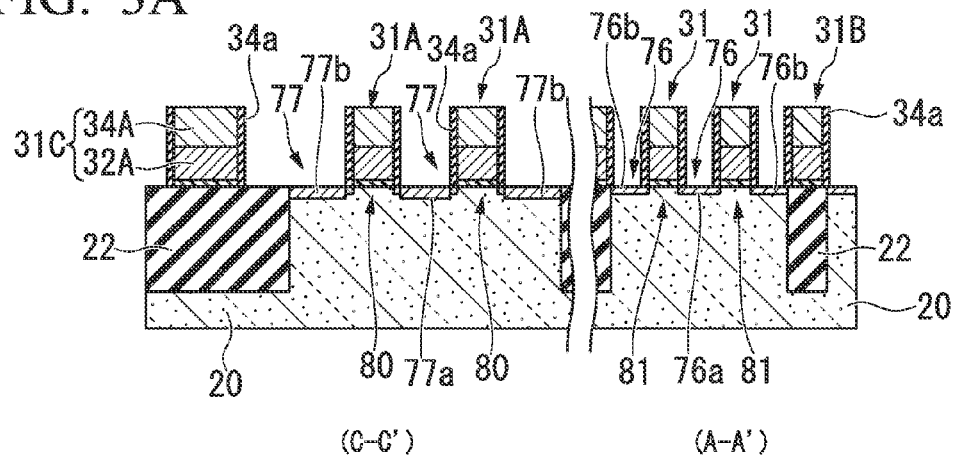
FIG. 3A is a fragmentary cross sectional elevation view, taken along the A-A' line and C-C' line of FIG. 3B, illustrating the semiconductor device in a step, subsequent to the step of FIG. 2A, involved in the method of forming the semiconductor device, in which a gate side wall insulating film is formed on each of the cell gate electrodes in the memory cell region on the semiconductor substrate, in accordance with one embodiment of the present invention.
Figure 3B:
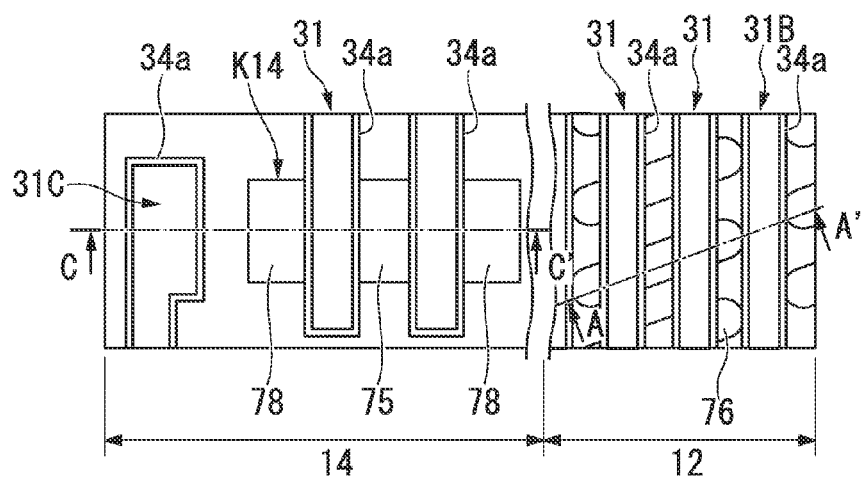
FIG. 3B is a fragmentary plan view illustrating the semiconductor device in a step, subsequent to the step of FIG. 2B, involved in the method of forming the semiconductor device in accordance with one embodiment of the present invention.

A MOS transistor (peripheral transistor) 80 with the peripheral gate electrode 31A as a gate, and the peripheral SD diffusion layers 77 and the peripheral LDD (lightly doped drain: low-concentration impurity element) diffusion layers 75 as the source and drain is formed in the active region K14 of the peripheral circuit region 14 as shown in FIG. 3A. Two peripheral gate electrodes 31A extending in the Y direction are formed in the peripheral circuit region 14. A diffusion layer formed between the two peripheral gate electrodes 31A is indicated as a peripheral source SD (source-drain) diffusion layer 77a, and diffusion layers on the left and right sides of the two peripheral gate electrodes 31A are indicated as peripheral drain SD diffusion layers 77b, as a convenience. Two peripheral transistors 80 that are share the peripheral source SD diffusion layer 77a are formed in the active region K14.

In the active region K12 of the memory cell region 12, a MOS transistor (cell transistor) 81 that includes the cell gate electrode 31 as a gate and the cell diffusion layers 76 as source and drain regions is formed. Two cell gate electrodes 31 extending in the Y direction are formed in each of the active regions K12. A diffusion layer between the two cell gate electrodes 31 is indicated as a cell source diffusion layer 76a, and diffusion layers on the left and right sides of the two cell gate electrodes 31 are indicated as cell drain diffusion layers 76b, as a convenience. Two cell transistors 81, which share the cell source diffusion layer 76a, are formed in the active region K12.

Figure 4A:
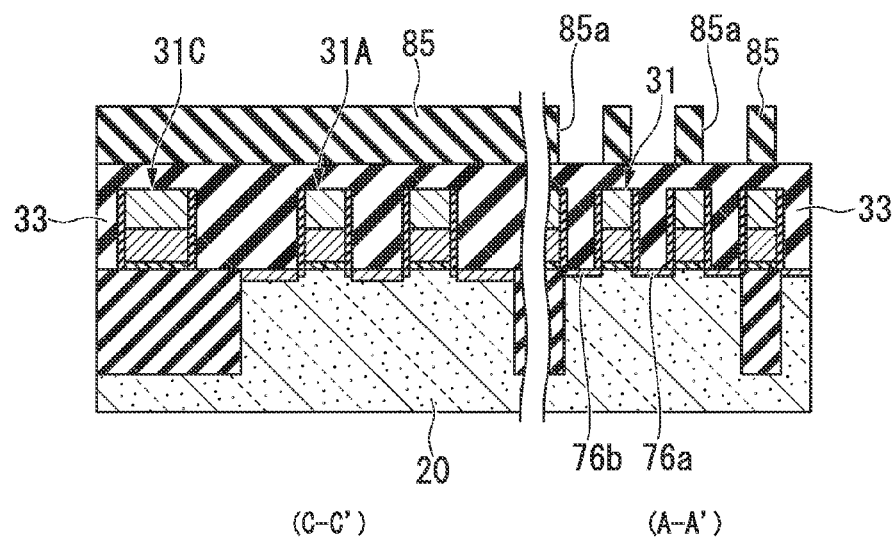
FIG. 4A is a fragmentary cross sectional elevation view, taken along the A-A' line and C-C' line of FIG. 4B, illustrating the semiconductor device in a step, subsequent to the step of FIG. 3A, involved in the method of forming the semiconductor device, in which a first interlayer insulating film is formed over the cell gate electrode and the peripheral gate electrode in the peripheral circuit region and the memory cell region on the semiconductor substrate and a cell contact mask aperture is formed in the memory cell region, in accordance with one embodiment of the present invention.

The first interlayer film 33 is formed over the peripheral circuit region 14 and the memory cell region 12, as shown in FIG. 4A. The material of the first interlayer film 33 may be a silicon oxide film.

By a photolithography process, a photoresist mask having an aperture therein is formed in order to form a cell contact plug in the memory cell region 12. This mask will be called a cell contact plug mask 85. The aperture will be called a cell contact mask aperture 85a.

The cell contact mask aperture 85a has a hole pattern. The cell contact mask aperture 85a is provided on the cell source diffusion layer 76a positioned at the vicinity of the center of each active region K12 and on the drain cell diffusion layers 76b positioned at the edge portions of each active region K12. The peripheral circuit region 14 is in the condition of being covered by the cell contact mask 85.

Figure 5A:
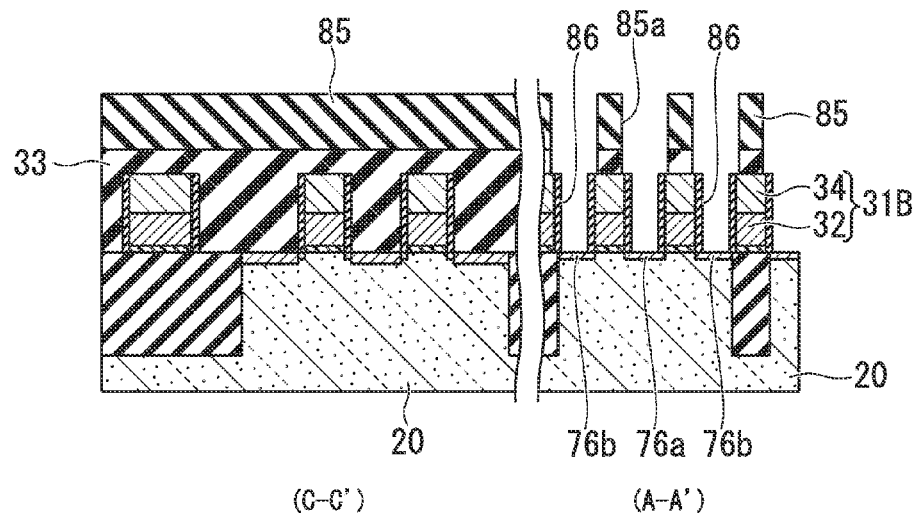
FIG. 5A is a fragmentary cross sectional elevation view, taken along the A-A' line and C-C' line of FIG. 5B, illustrating the semiconductor device in a step, subsequent to the step of FIG. 4A, involved in the method of forming the semiconductor device, in which a cell contact hole is formed in the first interlayer insulating film in the memory cell region on the semiconductor substrate, in accordance with one embodiment of the present invention.
Figure 5B:
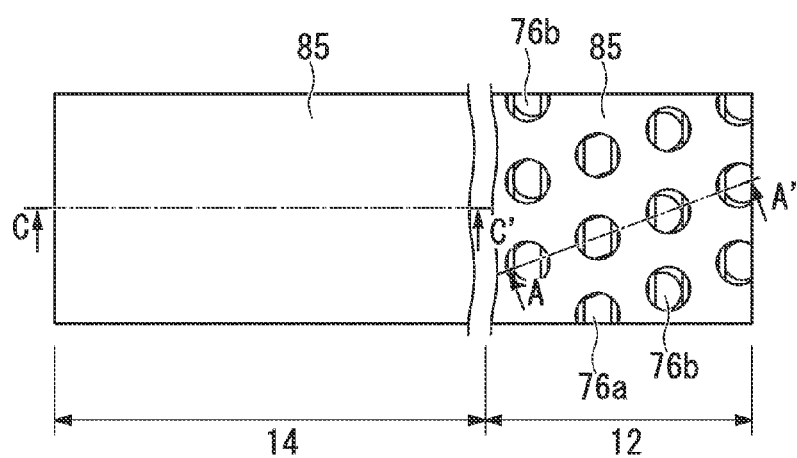
FIG. 5B is a fragmentary plan view illustrating the semiconductor device in a step, subsequent to the step of FIG. 4B, involved in the method of forming the semiconductor device in accordance with one embodiment of the present invention.

Using the cell contact mask 85 as a mask, the first interlayer film 33 positioned below the cell contact mask aperture 85a as shown in FIG. 5A is etched, thereby forming contact apertures that reach the cell diffusion layers 76. The contact apertures that penetrate the first interlayer film 33 will be called cell contact holes 86. The etching process is performed with conditions under which the etching of the silicon oxide film is slow, thereby enabling the self-aligned formation of the cell contact hole 86 with respect to the cell gate electrode 31.

Figure 6:
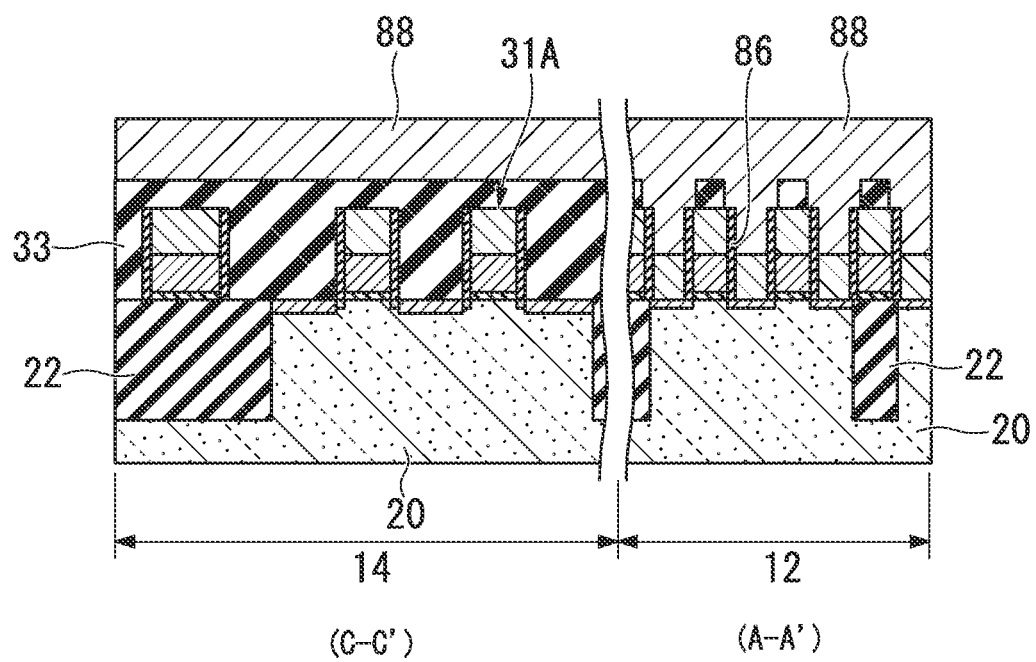
FIG. 6 is a fragmentary cross sectional elevation view illustrating the semiconductor device in a step, subsequent to the step of FIG. 5A, involved in the method of forming the semiconductor device, in which a first contact conductive film is formed in the peripheral circuit region and the memory cell region on the semiconductor substrate to bury the cell contact hole in the memory cell region, in accordance with one embodiment of the present invention.

The cell contact mask 85 is removed. A first contact conductive film 88 is formed so as to bury the cell contact hole 86, as shown in FIG. 6. The material forming the first contact conductive film 88 may be a polycrystalline silicon film that includes phosphorus. The contact first conductive film 88 may be formed by CVD.

Figure 7A:
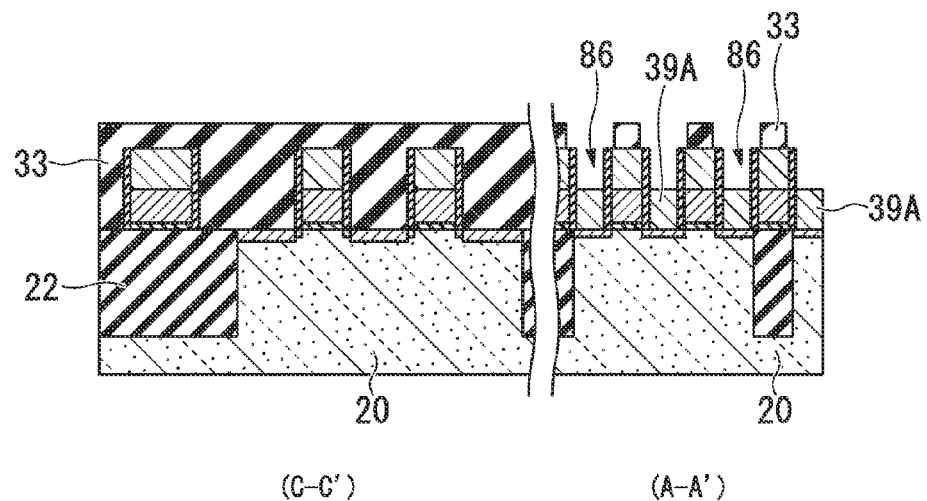
FIG. 7A is a fragmentary cross sectional elevation view, taken along the A-A' line and C-C' line of FIG. 7B, illustrating the semiconductor device in a step, subsequent to the step of FIG. 6, involved in the method of forming the semiconductor device, in which a lower conductive plug for a cell contact is formed in the memory cell region on the semiconductor substrate, in accordance with one embodiment of the present invention.

The first contact conductive film 88 in the memory cell region 12 is etched back as shown in FIG. 7A. The first contact conductive film 88 is partially left within the cell contact hole 86, and the lower conductive plug 39A is formed. The etch back process is performed so that the position of the upper surface of the lower conductive plug 39A is lower than the height of the cell contact hole 86. In the present embodiment, the position of the upper surface of the lower conductive plug 39A is set to approximately the same position as the upper surface of the gate conductive film 32. The lower conductive plug 39A can be called the cell plug lower region. Also, by this processing, the first contact conductive film 88 is removed in the peripheral circuit region 14, with the first interlayer film 33 remaining.

Figure 8A:
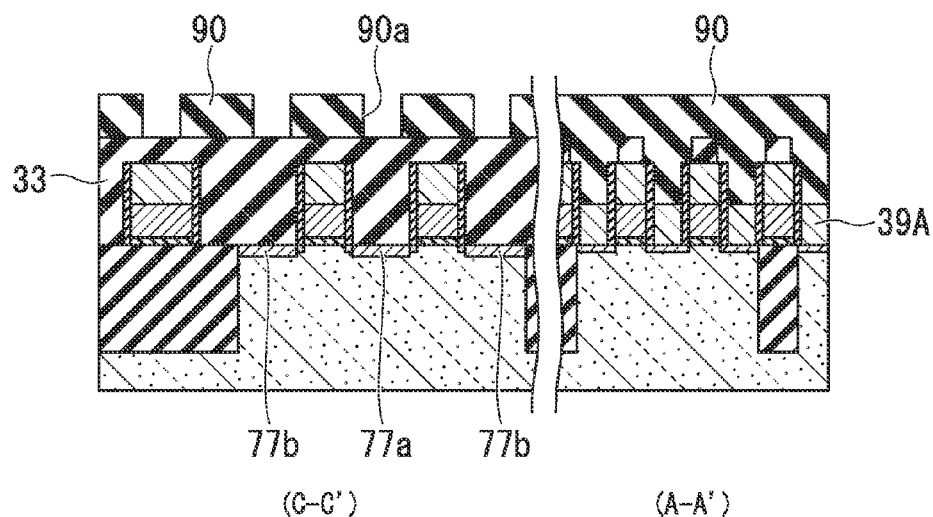
FIG. 8A is a fragmentary cross sectional elevation view, taken along the A-A' line and C-C' line of FIG. 8B, illustrating the semiconductor device in a step, subsequent to the step of FIG. 7A, involved in the method of forming the semiconductor device, in which a contact mask is formed in the peripheral circuit region and the memory cell region on the semiconductor substrate and a contact mask aperture is formed in the peripheral circuit region, in accordance with one embodiment of the present invention.

A peripheral contact mask 90 is formed so as to cover the peripheral circuit region 14 and the memory cell region 12, as shown in FIG. 8A. A photolithography process is performed to form a peripheral contact mask aperture 90a in the peripheral contact mask 90 in the peripheral circuit region 14. The formation positions in the peripheral contact mask apertures 90a are positions that are corresponding to the peripheral source SD diffusion layer 77a and the peripheral drain SD diffusion layers 77b in the peripheral circuit region 14.

Figure 9A:
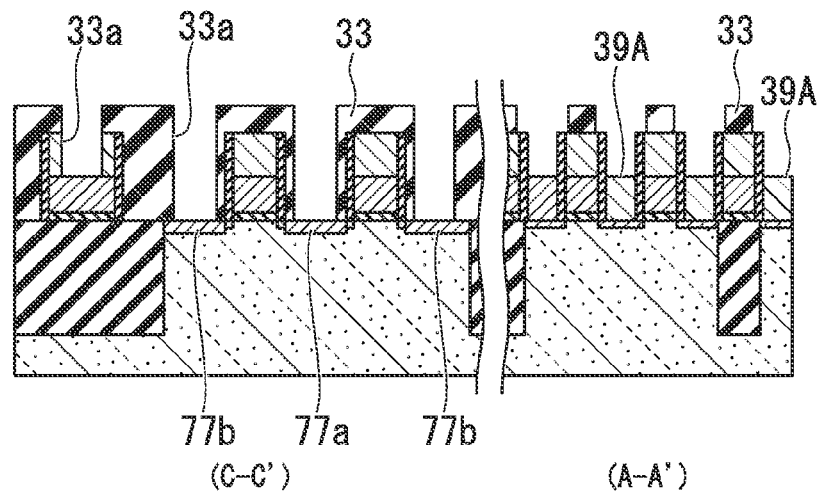
FIG. 9A is a fragmentary cross sectional elevation view, taken along the A-A' line and C-C' line of FIG. 9B, illustrating the semiconductor device in a step, subsequent to the step of FIG. 8A, involved in the method of forming the semiconductor device, in which a contact aperture is formed in the peripheral circuit region on the semiconductor substrate and a contact mask is removed in the memory cell region, in accordance with one embodiment of the present invention.

Using the peripheral contact mask 90 as a mask, the first interlayer film 33 positioned below the peripheral contact mask aperture 90a is etched, so as to form peripheral contact holes 33a that reach the a peripheral source SD diffusion layer 77a, the peripheral drain SD diffusion layer 77b, and the peripheral gate wiring (gate electrode 31C), as shown in FIG. 9A. After formation of the peripheral contact holes 33a, the peripheral contact mask 90 is removed.

Figure 10:
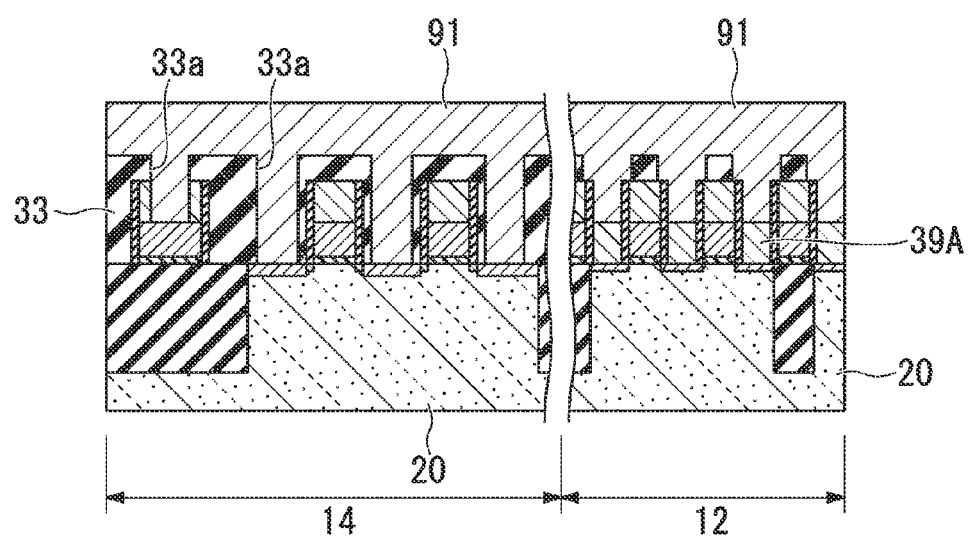
FIG. 10 is a fragmentary cross sectional elevation view illustrating the semiconductor device in a step, subsequent to the step of FIG. 9A, involved in the method of forming the semiconductor device, in which a second contact conductive film is formed in the peripheral circuit region and the memory cell region on the semiconductor substrate, in accordance with one embodiment of the present invention.

A second contact conductive film 91 is formed so as to bury the peripheral contact holes 33a in the peripheral circuit region 14, and within the cell contact hole 86 on the lower conductive plug 39A in the memory cell region 12, as shown in FIG. 10. The second contact conductive film 91 is a metal film, having a laminated structure formed by sequential deposition of a titanium (Ti) film as a contact layer, a titanium nitride (TiN) film as a barrier layer, and a tungsten (W) film as the core layer. The materials of this film laminate, however, are not restricted in this manner, and it is possible to use cobalt (Co) as the contact layer, tungsten nitride (WN) or tantalum nitride (TaN) as the barrier layer, and ruthenium (Ru) or platinum (Pt) as the core layer.

Figure 11A:
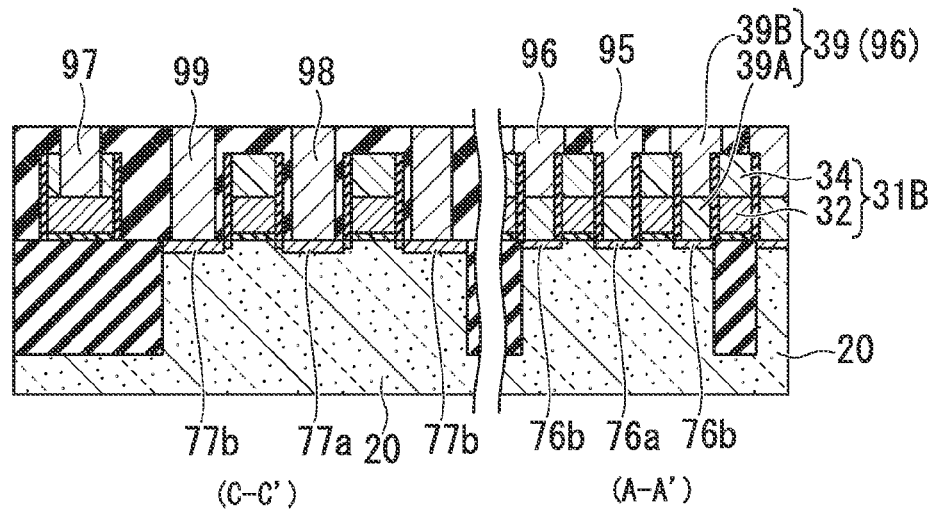
FIG. 11A is a fragmentary cross sectional elevation view, taken along the A-A' line and C-C' line of FIG. 11B, illustrating the semiconductor device in a step, subsequent to the step of FIG. 10, involved in the method of forming the semiconductor device, in which a contact mask is formed in the peripheral circuit region and the memory cell region on the semiconductor substrate and a contact mask aperture is formed in the peripheral circuit region, in accordance with one embodiment of the present invention.
Figure 11B:
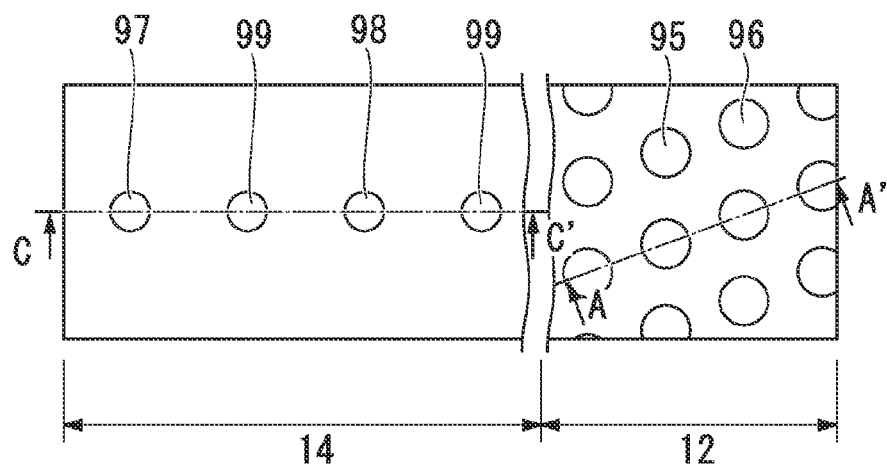
FIG. 11B is a fragmentary plan view illustrating the semiconductor device in a step, subsequent to the step of FIG. 10, involved in the method of forming the semiconductor device in accordance with one embodiment of the present invention.

CMP is performed to polish away the second contact conductive film 91 above the first interlayer film 33, as shown in FIG. 11A, so as to bury the second contact conductive film 91 in the insides of the peripheral contact hole 33a and of the cell contact hole 86.

At the cell contact hole 86, the second contact conductive film 91 made of metal is deposited onto the lower conductive plug 39A to form an upper conductive plug 39B, thereby forming the cell contact plug 39. The upper layer part of the cell contact plug 39 that is made of the second contact conductive film 91 can be called a cell plug upper region (the upper conductive plug 39B). In the present embodiment, one cell contact plug 39 includes a laminate of the cell plug upper region (upper conductive plug 39B) made of a metal, and of the cell plug lower region (the lower conductive plug 39A) made of a polycrystalline silicon. The cell contact plug 39 connected to the cell source diffusion layer 76a positioned in the vicinity of the center of each active region K12 can be called a source cell plug 95. The cell contact plug 39 connected to the cell drain diffusion layer 76b positioned at the edge part of the active region can be called a cell drain plug 96.

The contact plugs made of the second contact conductive film 91 are formed at the peripheral contact holes 33a of the peripheral circuit region 14. The contact plugs can be called peripheral contact plugs. The peripheral contact plug connected to the peripheral gate wiring can be called a peripheral gate plug 97. The peripheral contact plug connected to the peripheral source SD diffusion layer 77a positioned in the vicinity of the center of the active region can be called a peripheral source plug 98. The peripheral contact plug connected to the peripheral drain SD diffusion layer 77b positioned at the edge of the active region can be called a drain peripheral plug 99.

The peripheral contact plugs (the gate peripheral plug 97, the source peripheral plug 98, and the drain peripheral plug 99) made of the second contact conducting film 91 has a low contact resistance because the titanium film contact layer forms a metal silicide layer (in the present embodiment, titanium silicide film) with the silicon semiconductor substrate material. Also, by the core part being constituted by the metal film, which is a low-resistance material, the core itself has a reduced resistance. In this case, the contact plug that is made of only a metal material such as the peripheral contact plug, can be called a metal plug. The metal plug has the feature of being easy to form a low contact resistance. However, stress occurs at the boundary with the semiconductor substrate when the metal silicide layer is formed, thereby causing crystal faults in the semiconductor substrate and a tendency for variations and an increase in junction leakage.

On the other hand, a polysilicon plug that is formed by filling polycrystalline silicon into a contact hole instead of metal reduces the stress caused at the contact boundary and suppresses the variations and an increase in junction leakage. However, the resistance value of the polycrystalline silicon film itself is high. There is an increase in contact resistance in comparison with a metal plug.

In order to hold data by using the existence or non-existence of an electrical charge, such as is done in a memory cell of a DRAM element, there is the need to have a small junction leakage at the p/n junction between the contact plug connected to a storage node and the semiconductor substrate. With the shrinking of memory cells, the diameter of the contact plugs is shrinking and there is a tendency for the contact resistance to increase. However, in order to satisfy the device specifications for write time and read time, it is necessary to hold the resistance of the contact plugs disposed in the memory cell region to below a prescribed resistance value. For this reason, it is necessary to reduce the contact resistance.

In the present embodiment, the cell contact plug 39 has a two-layer structure, formed by the cell plug lower region (the lower conductive plug 39A) formed of polycrystalline silicon in contact with the semiconductor substrate 20, and the cell plug upper region (the upper conductive plug 39B) formed by filling the metal film above the cell plug lower region. By using polycrystalline silicon, which has the effect of reducing the junction leakage, in only the part making contact with the semiconductor substrate 20, and by depositing the metal film above the polycrystalline silicon, it is possible to reduce the overall resistance of the cell contact plug 39. Because a metal silicide film is formed also at the contact boundary between the cell plug lower region (the lower conducting plug 39A) and the cell plug upper region (the upper conductive plug 39B), it is possible to achieve the effect of reducing the resistance value.

Also, the metal silicide films are formed between the semiconductor substrate 20 and the contact layer of the second contact conductive film (metal film) 91 and between the cell plug lower region 39A and the contact layer of the second contact conductive film (metal film) 91. The metal silicide film is formed naturally by the heat applied at the time of deposition when the contact layer of the second contact conductive film (metal film) 91 is deposited by CVD. The contact layer may be formed by sputtering, RTA (rapid thermal annealing) using a lamp annealing apparatus, or the like, and then thermal treatment (annealing) may be performed at approximately 600° C. to 650° C. so as to form the metal silicide layer.

In the peripheral circuit region 14, an increase in the junction leakage current because of siliciding of the contact plugs is not a problem, and in order to improve the drive capacity of the MOS transistors disposed in the peripheral circuit region 14, low-resistance contact plugs are used. For this reason, it is preferable to use single-layer metal plugs.

In the present embodiment, the polycrystalline silicon film is formed to form the lower part (cell plug lower region) of the cell contact plug 39. Then, the upper part (cell plug upper region, which is the upper conductive plug 39B) of the cell contact plug 39 and the peripheral contact plugs (the gate peripheral plug 97, the source peripheral plug 98, and the drain peripheral plug 99) are formed in the same process, using the metal film. By doing this, it is possible to suppress an increase in the number of manufacturing steps, and to form the cell contact plug 39 made of the laminate of the polycrystalline silicon film and the metal film in the memory cell region 12, and to form the peripheral contact plugs (the gate peripheral plug 97, the source peripheral plug 98, and the drain peripheral plug 99) made of the metal films in the peripheral circuit region 14.

Figure 12A:
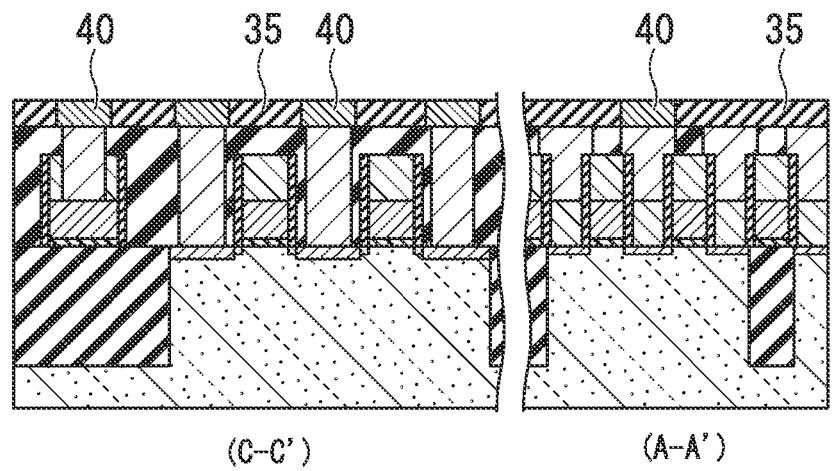
FIG. 12A is a fragmentary cross sectional elevation view, taken along the A-A' line and C-C' line of FIG. 12B, illustrating the semiconductor device in a step, subsequent to the step of FIG. 11A, involved in the method of forming the semiconductor device, in which a second interlayer insulating film and a second contact plug are formed in the peripheral circuit region and the memory cell region on the semiconductor substrate, in accordance with one embodiment of the present invention.

As shown in FIG. 12A, the second interlayer film 35 is formed using a silicon oxide film or the like. The second contact plugs 40 that penetrate the second interlayer film 35 are formed. The second contact plugs 40 are each connected to the cell source plug 95 in the memory cell region 12 and the peripheral contact plugs (the gate peripheral plug 97, the source peripheral plug 98, and the drain peripheral plug 99) in the peripheral circuit region 14. An example of the material of the second contact plugs 40 is a barrier layer of titanium nitride or the like, over which a tungsten film is deposited, but is not limited thereto.

Figure 13A:
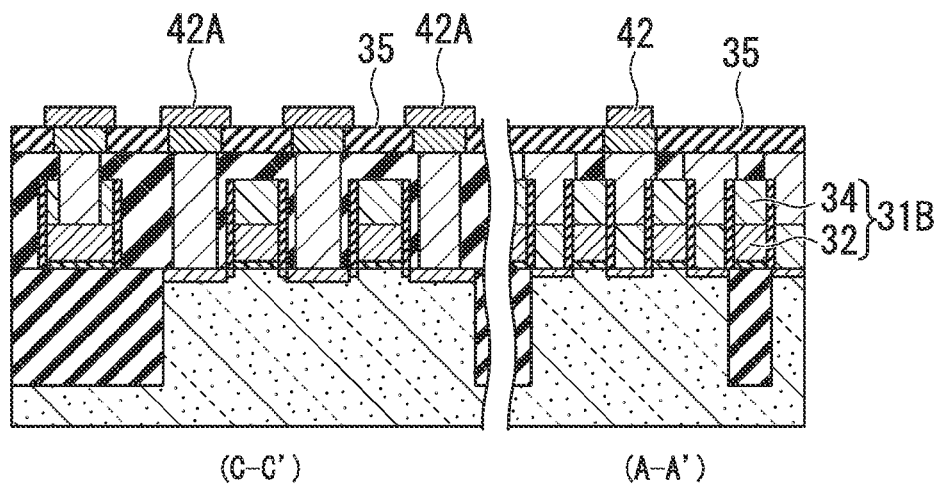
FIG. 13A is a fragmentary cross sectional elevation view, taken along the A-A' line and C-C' line of FIG. 13B, illustrating the semiconductor device in a step, subsequent to the step of FIG. 12A, involved in the method of forming the semiconductor device, in which a wiring is formed over the second interlayer insulating film in the peripheral circuit region and the memory cell region on the semiconductor substrate, in accordance with one embodiment of the present invention.

The first wirings 42 and 42A connected to the second contact plugs 40 are formed by a metal film such as tungsten, as shown in FIG. 13A.

The first wirings 42 connected to the second contact plugs 40 in the memory cell region 12 are patterned so as to extend in winding manner in the X direction, and have the function of bit lines in the DRAM elements. The first wiring 42A disposed in the peripheral circuit region 14 functions as a local wiring layer.

The third interlayer film 36 that covers the first wirings 42 and 42A illustrated in FIG. 13A is formed by a silicon oxide film or the like as shown in FIG. 14A.

In the memory cell region 12, the third contact plug 41 is formed that penetrates the third interlayer film 35 and the second interlayer film 36 and that is connected to the drain cell plug 96. An example of the material of the third contact plug 41 is a barrier layer of titanium nitride or the like, over which a tungsten film is deposited, but is not limited thereto.

In the memory cell region 12, the second wirings 43 that are connected to the third contact plugs 41 may be formed of a tungsten film, but is not limited thereto. The second wiring 43 functions as a pad layer for connecting the third contact plug 41 and the capacitor 64.

A fourth interlayer film 54 that covers the second wiring 43 is formed of a silicon oxide film or the like. In the memory cell region 12, a capacitor hole is formed. The capacitor hole penetrates the fourth interlayer film 54. The capacitor hole reaches the second wiring 43.

The capacitor lower electrode 58 is formed of a titanium nitride film or the like. The capacitor lower electrode 58 covers the inside of the capacitor hole. The capacitor lower electrode 58 is connected to the second wiring 43 at the bottom part.

The capacitor insulating film 60 is formed. Examples of the material of the capacitor insulating film 60 include high dielectric films such as zirconium oxide ($ZrO_2$) and aluminum oxide ($Al_2O_3$), but are not limited thereto.

The capacitor upper electrode 62 is formed of a titanium nitride film or the like, but the material is not limited thereto. The capacitor upper electrode 62 is patterned so as to cover over the capacitor 64 of the memory cell region 12.

The fifth interlayer film 65 is formed of a silicon oxide film or the like, but the material is not limited thereto.

In the peripheral circuit region 14, an upper wiring contact hole 54a is formed so as to penetrate the fifth interlayer film 65 and the fourth interlayer film 54. The upper wiring contact hole 54a is formed over the first wiring 42A.

The upper wiring contact plug 71 is formed by burying a conductive film such as tungsten into the upper wiring contract hole 54a. The upper wiring contact plug 71 need not be formed precisely over the peripheral contact plug 70, and may be formed using the first wiring 42A, at a position that is removed from the peripheral contact plug 70.

The upper wiring 66 that is connected to the upper wiring contact plug 71 is formed, using a metal film of aluminum (Al), copper (Cu) or the like, but the material is not limited thereto.

The above processes complete the semiconductor device 10 of the present embodiment having the structure shown in FIG. 14A. After the above, an upper wiring layer or a surface protective layer or the like may be formed as necessary.

In the above-described first embodiment, in the formation of the cell contact hole 86 in the memory cell region 12, the cell contact plugs 39 are formed using a hole pattern having an aperture at positions corresponding to each of the cell contact plugs 39.

However, it is difficult to achieve contrast when exposing for formation of the hole pattern by photolithography processes. The shrinking of semiconductor devices makes the formation of the hole pattern by the photolithography processes increasingly difficult. Compared to a hole pattern, a band-shaped line and space pattern provides greater contrast in the photolithography processes, thereby enabling a greater exposure image latitude.

Given this, the second embodiment described below is a method for forming a cell contact plug using the self-alignment method, with a line and space pattern used as the cell contact mask in the memory cell region 12.

Second Embodiment

FIGS. 15A, 15B, 16A, 16B, 17A, 17B, 18A, 18B, 19A, 19B, 20A, 20B, 21A, 21B, 22A, 22B, 23A, 23B, 24A, and 24B are fragmentary cross sectional elevation views illustrating a semiconductor device in steps involved in a method of forming the semiconductor device in accordance with another embodiment of the present invention. FIGS. 15C, 16C, 18C, 19C, 20C, 22C, 23C, and 24C are fragmentary plan views illustrating the semiconductor device in steps involved in the method of forming the semiconductor device in accordance with another embodiment of the present invention. According to the present embodiment, a semiconductor (storage) device 100 as a DRAM element having the cross-sectional structure shown in FIG. 25 can be formed by embodying the method for forming described below, based on FIG. 15A to FIG. 24C.

Because the semiconductor (storage) device 100 which is formed in the present embodiment includes the same structure as the semiconductor device 10 in the above-noted first embodiment, the method of forming the semiconductor device 100 is described below, with the detailed description regarding the structure in FIG. 25 partly omitted.

Figure 15A:
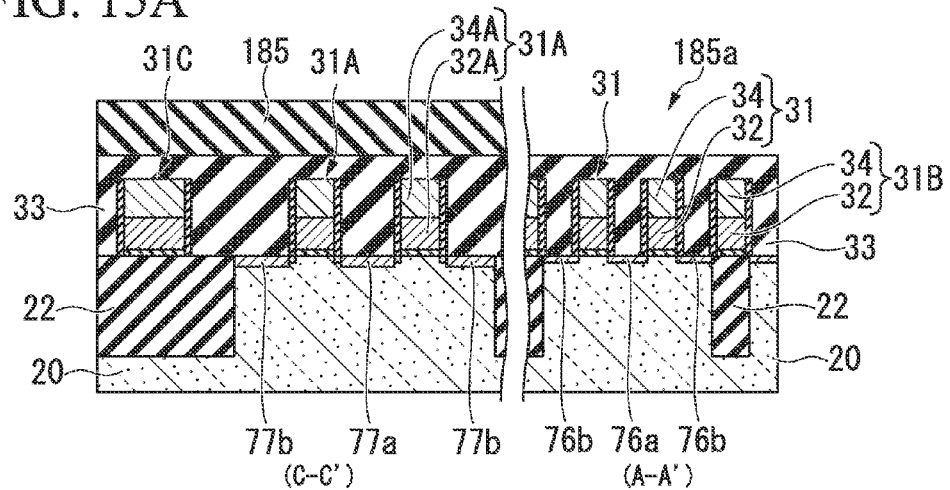
FIG. 15A is a fragmentary cross sectional elevation view, taken along the A-A' line and C-C' line of FIG. 15C, illustrating a semiconductor device in a step involved in a method of forming the semiconductor device, in which after forming each gate electrodes in a peripheral circuit region and a memory cell region on a semiconductor substrate, a first interlayer insulating film covering the gate electrodes is formed, a cell contact mask is formed in the peripheral circuit region, and the cell contact mask aperture is formed in the memory cell region, in accordance with another embodiment of the present invention.
Figure 15B:
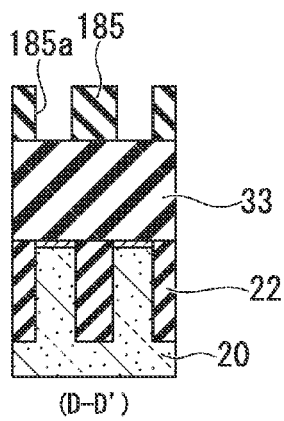
FIG. 15B is a fragmentary cross sectional elevation view, taken along the D-D' line of FIG. 15C, illustrating the semiconductor device in a step involved in the method of forming the semiconductor device in accordance with another embodiment of the present invention.
Figure 15C:
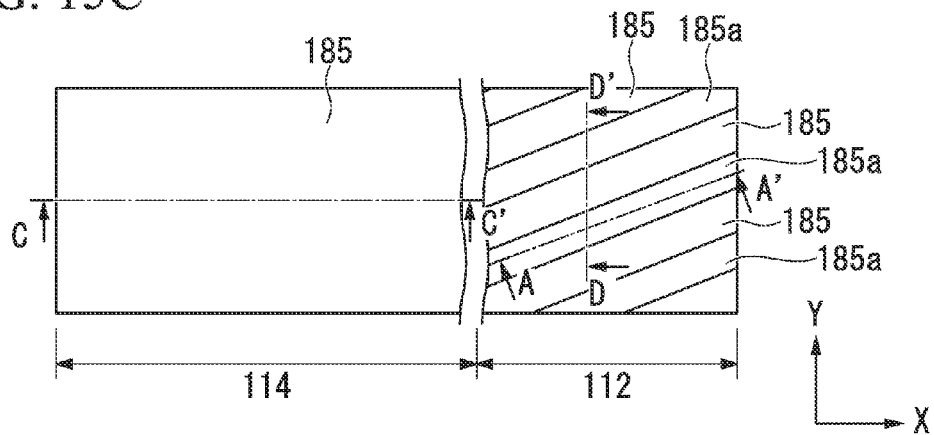
FIG. 15C is a fragmentary plan view illustrating the semiconductor device in a step involved in the method of forming the semiconductor device in accordance with another embodiment of the present invention.

FIG. 15A shows a fragmentary cross sectional view, taken along the A-A' line and C-C' line of FIG. 15C, illustrating a peripheral circuit region 114, and a memory cell region 112 of the semiconductor device 100. FIG. 15B shows another fragmentary cross sectional view, taken along the D-D' line of FIG. 15C, illustrating the semiconductor device 100. FIG. 15C shows a fragmentary plan view of the semiconductor device 100. The left-side part of FIG. 15A is a fragmentary cross sectional view of the peripheral circuit region 114 along the line C-C' in FIG. 15C. The right-side part of FIG. 15A is a fragmentary cross sectional view of the memory cell region 112 along the line A-A' in FIG. 15C.

Of the drawings referenced below, the left-side parts of FIGS. 15A, 16A, 17A, 18A, 19A, 20A, 21A, 22A, 23A, and 24A are fragmentary cross-sectional views of the peripheral circuit region 114 along the line C-C' indicated in the corresponding drawings of FIGS. 15C, 16C, 18C, 19C, 20C, 22C, 23C, and 24C. The right-side part of FIGS. 15A, 16A, 17A, 18A, 19A, 20A, 21A, 22A, 23A, and 24A are fragmentary cross-sectional views of the memory cell region 112 along the line A-A' indicated in the corresponding drawings of FIGS. 15C, 16C, 18C, 19C, 20C, 22C, 23C, and 24C. FIGS. 15B, 16B, 17B, 18B, 19B, 20B, 21B, 22B, 23B, and 24B are cross-sectional views of the memory cell region 112 along the line D-D' indicated in the corresponding drawings of FIGS. 15C, 16C, 18C, 19C, 20C, 22C, 23C, and 24C. In order to simplify the description of FIGS. 15C, 16C, 18C, 19C, 20C, 22C, 23C, and 24C, the X direction is defined as the left-right direction, and the Y direction is defined as the up-down direction. In the memory cell region 112, the direction of extension of the gate electrode corresponds to the Y direction, and the direction of extension of the lines C-C' of FIGS. 15C, 16C, 18C, 19C, 20C, 22C, 23C, and 24C is parallel to the X direction.

According to the method of forming the semiconductor device 100 of the second embodiment, as shown in FIGS. 15A through 15C, the process steps up until the formation of the first interlayer film 33 are the same as the method of the above-noted first embodiment.

A cell contact mask 185 is formed on the first interlayer film 33A. The cell contact mask 185 has a cell contact mask aperture 185a, as shown in the memory cell region 112 of FIG. 15C, is made to be band-shaped (rectangularly shaped) extending in the same direction as the direction in which an active region of the memory cell region 112 extends. One contact mask aperture 185a is formed to be included within a plurality of source cell diffusion layers 76a and a plurality of drain cell diffusion layers 76b existing in the extending direction.

The band-shaped cell contact mask aperture 185a is formed so as to be arranged with the same pitch as that of the active region of the memory cell region 112 in the Y direction, thereby disposing it in a line and space pattern. By forming the cell contact mask aperture 185a with the band shape, a margin of the exposure when exposing a photoresist film is improved. That is, the band-shaped line and space pattern provides greater contrast in the photolithography process, thereby enabling a greater margin for exposure resolution than in the case of the hole pattern. Even if the semiconductor device is shrunk, it is possible to further enhance the exposure accuracy than that of a hole pattern of the above-noted first embodiment, thereby enabling accurate exposure.

Figure 16A:
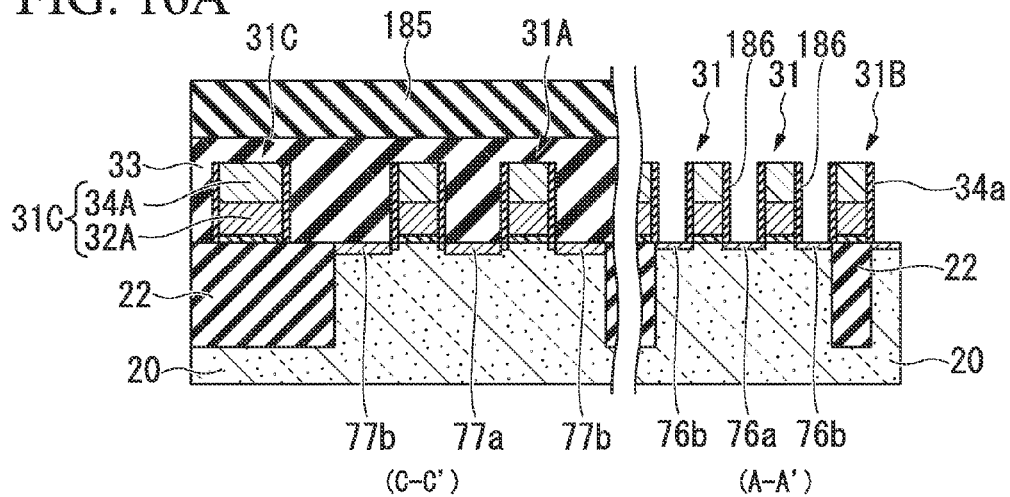
FIG. 16A is a fragmentary cross sectional elevation view, taken along the A-A' line and C-C' line of FIG. 16C, illustrating the semiconductor device in a step, subsequent to the step of FIG. 15A, involved in the method of forming the semiconductor device, in which a cell contact hole is formed in a cell contact region on the semiconductor substrate, in accordance with another embodiment of the present invention.
Figure 16B:
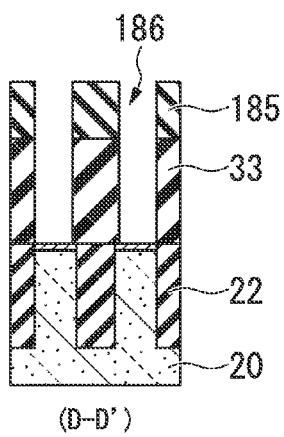
FIG. 16B is a fragmentary cross sectional elevation view, taken along the D-D' line of FIG. 16C, illustrating the semiconductor device in a step, subsequent to the step of FIG. 15B, involved in the method of forming the semiconductor device in accordance with another embodiment of the present invention.
Figure 16C:
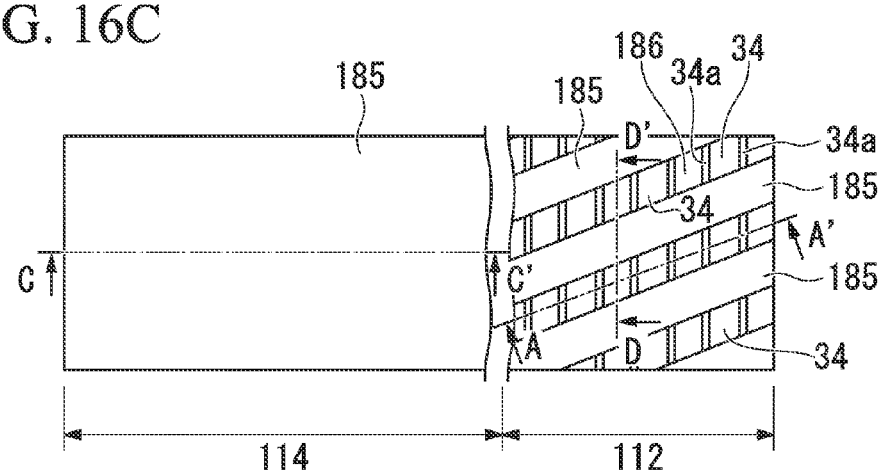
FIG. 16C is a fragmentary plan view illustrating the semiconductor device in a step, subsequent to the step of FIG. 15C, involved in the method of forming the semiconductor device in accordance with another embodiment of the present invention.
Figure 17A:
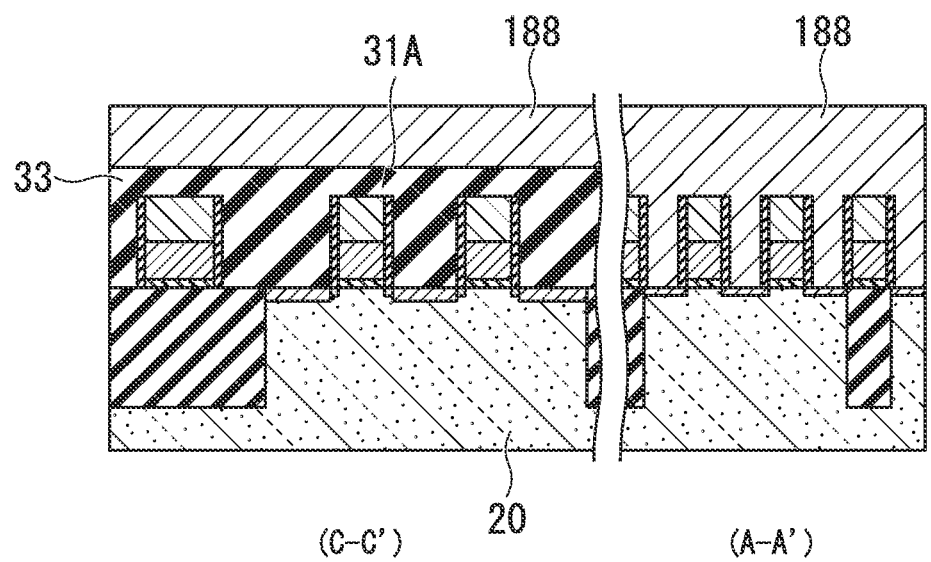
FIG. 17A is a fragmentary cross sectional elevation view illustrating the semiconductor device in a step, subsequent to the step of FIG. 16A, involved in the method of forming the semiconductor device, in which a first contact conductive film is formed in the peripheral circuit region and the cell contact region on the semiconductor substrate, in accordance with another embodiment of the present invention.
Figure 17B:
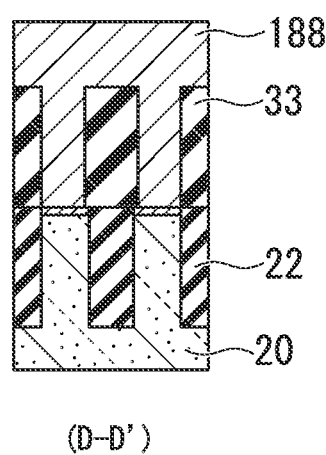
FIG. 17B is a fragmentary cross sectional elevation view illustrating the semiconductor device in a step, subsequent to the step of FIG. 16B, involved in the method of forming the semiconductor device in accordance with another embodiment of the present invention.

Similar to the process step as shown in FIG. 5A of the first embodiment, using the cell contact mask 185, the first interlayer film 33 is etched so as to form the cell contact hole 186 as shown in FIGS. 16A and 16C. The etching process is performed using conditions with a low etching speed with respect to a silicon nitride film, and it is possible to selectively remove the first interlayer film 33 positioned below the cell contact mask aperture 186, between the cell gate electrodes 31, 31. When doing this, the cell contact mask aperture 185a which is obtained by an exposure using a band-shaped line and space pattern that is capable of higher-accuracy exposure than that when using the hole pattern as described before is used. Also, the region defined by the side wall insulating films 34a, 34a which are formed at the both sides of the cell gate electrode 31 as shown in FIG. 16A is removed selectively.

Therefore, the cell contact hole 186 is formed using the self-alignment method, thereby also enabling a secure and accurate formation of the cell contact hole 186 in a shrunken semiconductor device 100. Then, the cell contact mask 185 is removed.

Similar to the process step as shown in FIG. 6 of the first embodiment, a first contact conductive film 188 is formed as shown in FIG. 17.

Figure 7B:
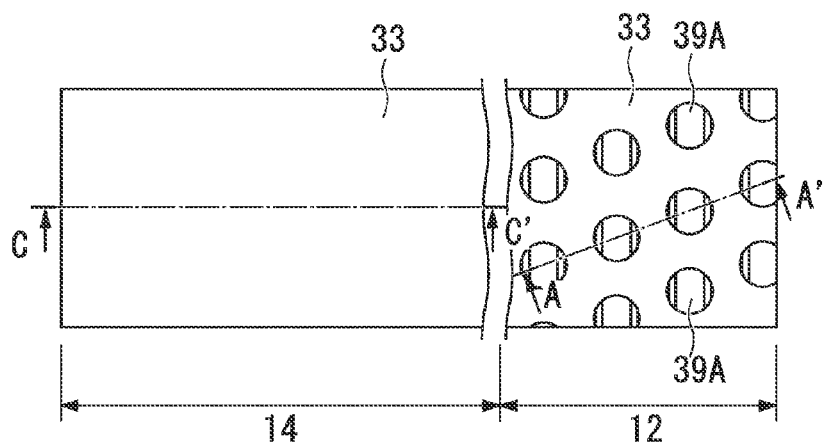
FIG. 7B is a fragmentary plan view illustrating the semiconductor device in a step, subsequent to the step of FIG. 6, involved in the method of forming the semiconductor device in accordance with one embodiment of the present invention.
Figure 18A:
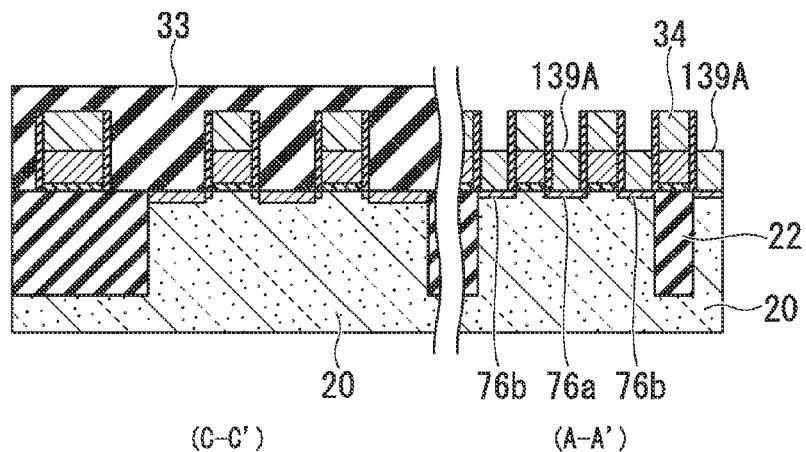
FIG. 18A is a fragmentary cross sectional elevation view, taken along the A-A' line and C-C' line of FIG. 18C, illustrating the semiconductor device in a step, subsequent to the step of FIG. 17A, involved in the method of forming the semiconductor device, in which a lower conductive plug is formed in the cell contact region on the semiconductor substrate, in accordance with another embodiment of the present invention.
Figure 18B:
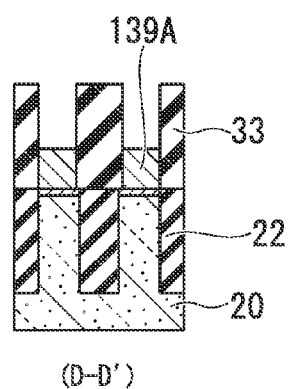
FIG. 18B is a fragmentary cross sectional elevation view, taken along the D-D' line of FIG. 18C, illustrating the semiconductor device in a step, subsequent to the step of FIG. 17B, involved in the method of forming the semiconductor device in accordance with another embodiment of the present invention.
Figure 18C:
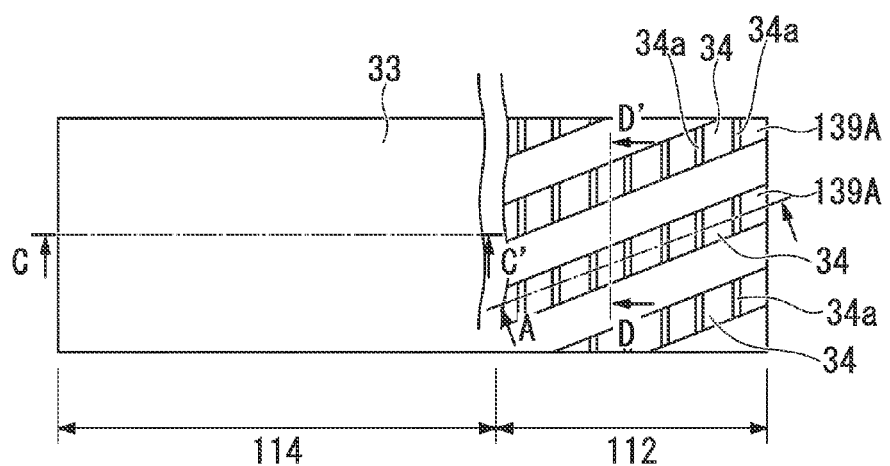
FIG. 18C is a fragmentary plan view illustrating the semiconductor device in a step, subsequent to the step of FIG. 18A, involved in the method of forming the semiconductor device in accordance with another embodiment of the present invention.
Figure 19A:
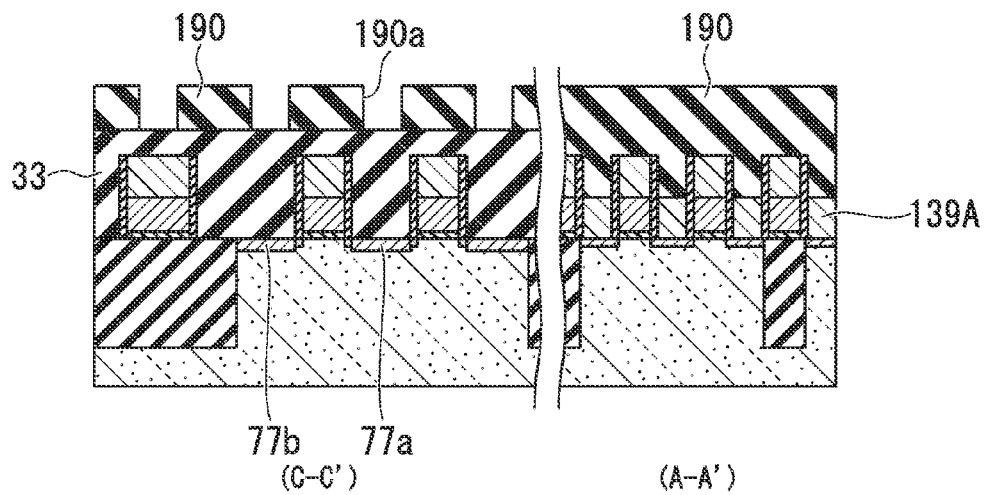
FIG. 19A is a fragmentary cross sectional elevation view, taken along the A-A' line and C-C' line of FIG. 19C, illustrating the semiconductor device in a step, subsequent to the step of FIG. 18A, involved in the method of forming the semiconductor device, in which a contact mask aperture is formed in the peripheral circuit region on the semiconductor substrate and a contact mask is formed in the memory cell region, in accordance with another embodiment of the present invention.
Figure 19B:
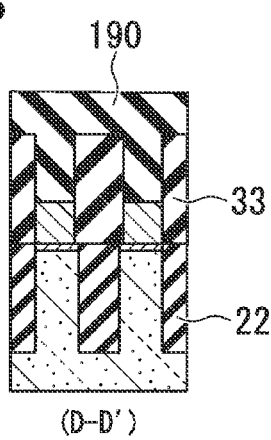
FIG. 19B is a fragmentary cross sectional elevation view, taken along the D-D' line of FIG. 19C, illustrating the semiconductor device in a step, subsequent to the step of FIG. 18B, involved in the method of forming the semiconductor device in accordance with another embodiment of the present invention.
Figure 19C:
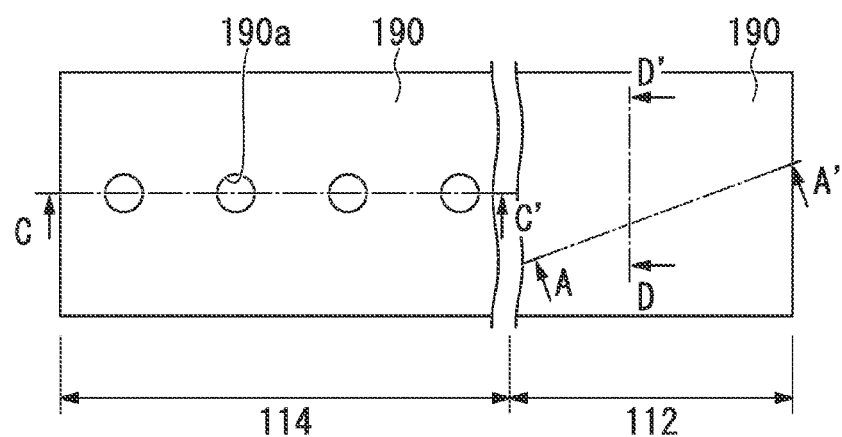
FIG. 19C is a fragmentary plan view illustrating the semiconductor device in a step, subsequent to the step of FIG. 18C, involved in the method of forming the semiconductor device in accordance with another embodiment of the present invention.

Similar to the process step as shown in FIGS. 7A through 7C of the first embodiment, the first contact conductive film 188 is etched back and is partly removed within the cell contact hole 186, so that the height of the upper surface is at a lower position than that of the upper surface of the gate protective film 34 which constitutes the gate electrode 31. The first contact conductive film 188 remains buried within the region which is sandwiched by the gate side wall insulating films 34a of the cell gate electrode 31 in the X direction and sandwiched by the side walls of the first interlayer film 33 defined by the aperture width of the cell contact hole 186 in the Y direction as shown in FIGS. 18A through 18C. By doing this, a cell plug lower region (a lower conductive plug 139A) is formed. The bottom surface of the cell plug lower region (the lower conductive plug 139A) is connected to the cell source diffusion layer 76a or the cell drain diffusion layer 76b. According to the second embodiment, the height of the cell plug lower region (the lower conductive plug 139A) is formed so as to be positioned about the upper surface of the gate conductive film 32.

Figure 8B:
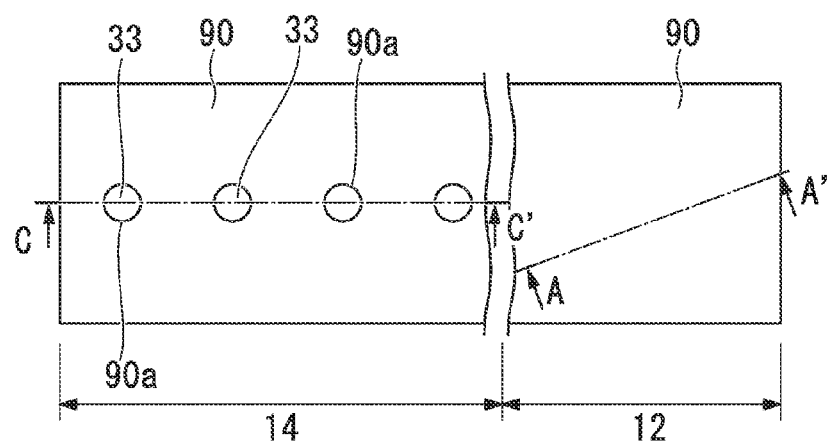
FIG. 8B is a fragmentary plan view illustrating the semiconductor device in a step, subsequent to the step of FIG. 7B, involved in the method of forming the semiconductor device in accordance with one embodiment of the present invention.

Similar to the process step as shown in FIGS. 8A and 8B of the first embodiment, a photoresist mask having apertures corresponding to a part for forming a peripheral contact is formed in a peripheral circuit region 114 as shown in FIG. 19. This photoresist mask will be called a peripheral contact mask 190. The aperture part thereof will be called a peripheral contact mask aperture 190a. The peripheral contact mask aperture 190a is formed above the peripheral SD diffusion layer and the peripheral gate wiring. The memory cell region 112 is covered by the peripheral contact mask 190.

Figure 9B:
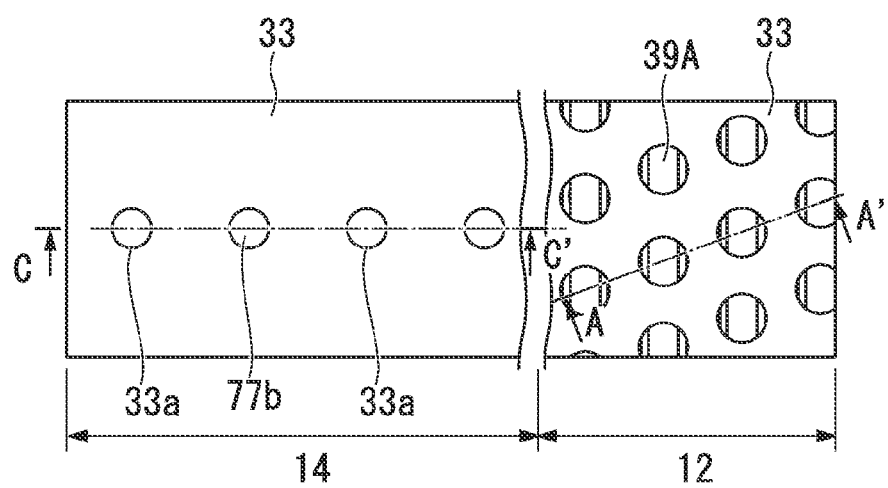
FIG. 9B is a fragmentary plan view illustrating the semiconductor device in a step, subsequent to the step of FIG. 8B, involved in the method of forming the semiconductor device in accordance with one embodiment of the present invention.

Similar to the process step as shown in FIGS. 9A and 9B of the first embodiment, the peripheral contact mask 190 is used as a mask, and the first interlayer film 33 which is shown from the peripheral contact mask aperture 190a is etched so as to form the peripheral contact hole 33a. The peripheral contact holes 33a reach the peripheral SD diffusion layer and the peripheral gate wiring. Then, the peripheral contact mask 190 is removed as shown in FIG. 20.

Figure 21A:
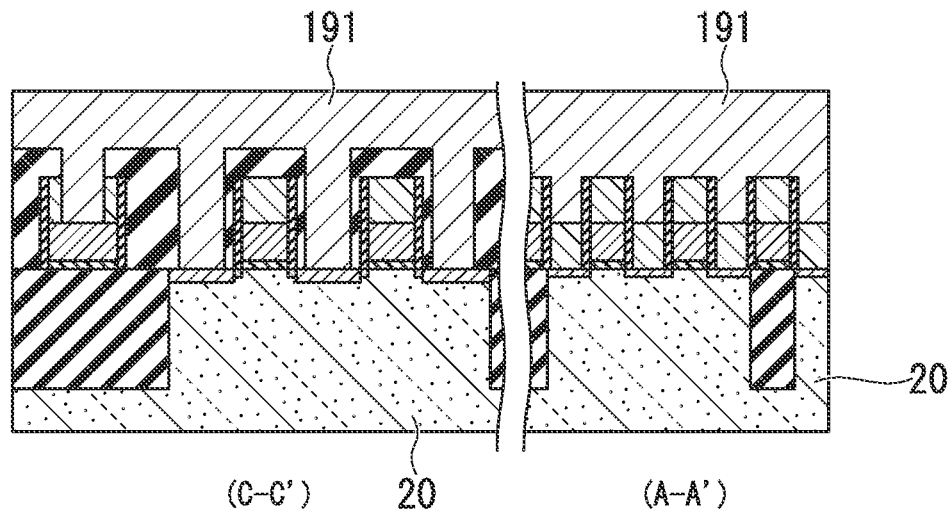
FIG. 21A is a fragmentary cross sectional elevation view illustrating the semiconductor device in a step, subsequent to the step of FIG. 19A, involved in the method of forming the semiconductor device, in which a second contact conductive film is formed in the peripheral circuit region and the memory cell region on the semiconductor substrate, in accordance with another embodiment of the present invention.
Figure 21B:
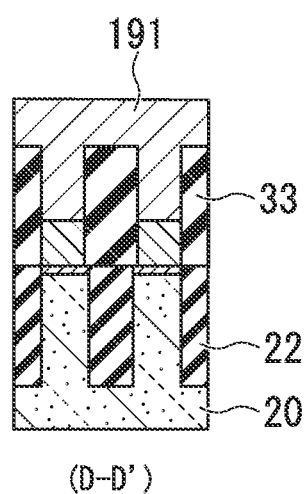
FIG. 21B is a fragmentary cross sectional elevation view illustrating the semiconductor device in a step, subsequent to the step of FIG. 20B, involved in the method of forming the semiconductor device in accordance with another embodiment of the present invention.

Using the same process step as shown in FIG. 10 of the first embodiment, a cell contact hole 186 above the peripheral contact hole 33a and the cell plug lower region (lower conductive plug 139A) are buried so as to form a second contact conductive film 191, as shown in FIGS. 21A and 21B. The second contact conductive film 191 is formed by sequentially depositing a titanium film, a titanium nitride film, and a tungsten film.

Figure 22A:
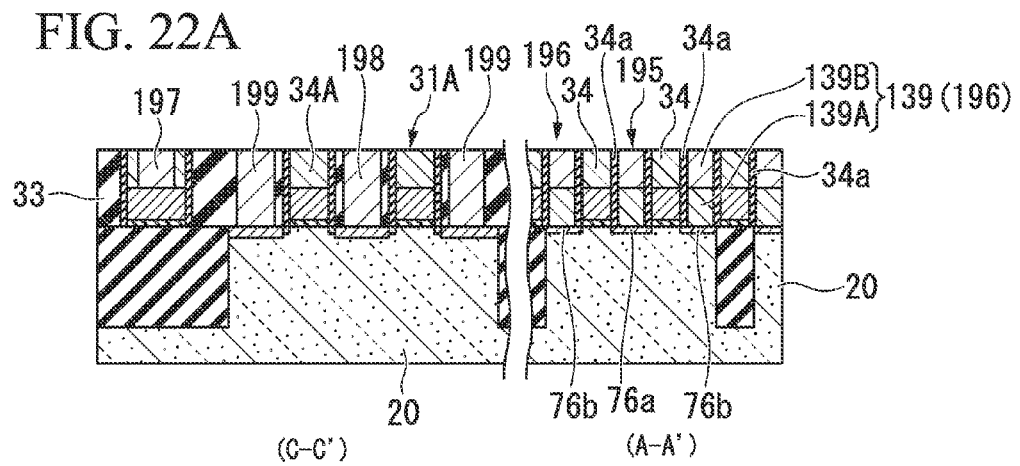
FIG. 22A is a fragmentary cross sectional elevation view, taken along the A-A' line and C-C' line of FIG. 22C, illustrating the semiconductor device in a step, subsequent to the step of FIG. 21A, involved in the method of forming the semiconductor device, in which a peripheral plug is formed in the peripheral circuit region on the semiconductor substrate and an upper conductive plug is formed in the memory cell region, in accordance with another embodiment of the present invention.
Figure 22B:
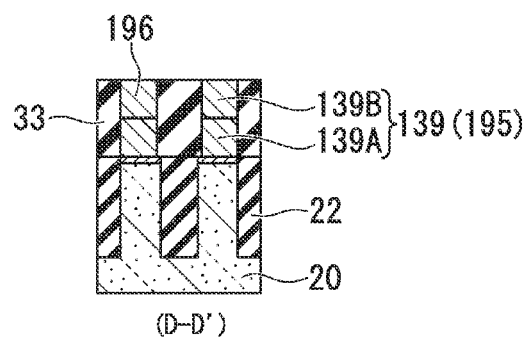
FIG. 22B is a fragmentary cross sectional elevation view, taken along the D-D' line of FIG. 22C, illustrating the semiconductor device in a step, subsequent to the step of FIG. 21B, involved in the method of forming the semiconductor device in accordance with another embodiment of the present invention.

By CMP, the second contact conductive film 191 and the first interlayer film 33 are polished and the CMP is stopped when the upper surface of the gate protective film 34 is shown as shown in FIG. 22A. By doing this, the upper surface of the gate protective film 34, the upper surface of the contact second conductive film 191, and the upper surface of the first interlayer film 33 are planarized with substantially the same height.

In the memory cell region 112, the second contact conductive film 191 is buried in the region which is sandwiched by the gate side wall insulating films 34a that constitute the side walls of the cell gate electrodes in the X direction, and is sandwiched by the side walls of the first interlayer film 33 in the Y direction, thereby forming a cell plug upper region (upper conductive plug 139B). The cell plug upper region is formed so as to be stacked over the cell plug lower region (the lower conductive plug 139A). A cell contact plug 139 of the present embodiment is configured as a laminated structure by a two-layer of the cell plug lower region (the lower conductive plug 139A) made of polycrystalline silicon and the cell plug upper region (the upper conductive plug 139B) made of the metal film.

By this process step, the cell contact hole is separated into each region of each cell diffusion layer (the cell source or drain diffusion layer). The cell contact plugs 139 which are defined by the gate electrodes over each cell diffusion layer, are disposed.

The cell contact plug 139 connected to the cell source diffusion layer 76*a* in the vicinity of the center part of the active region is also called a cell source plug 195. The cell contact plugs 139 connected to the cell drain diffusion layers 76*b* at the left and right parts of the active region are also called cell drain plugs 196. When seen from the upper surface of the semiconductor substrate 20, these cell plug upper regions (the upper conductive plugs 139B) have shape of a parallelogram (refer to FIG. 22C).

Peripheral contact plugs made of the second contact conductive film 191 are formed at the peripheral contact holes 33*a*. The peripheral contact plug connected to the peripheral gate wiring will be called a gate peripheral contact plug 197. The peripheral contact plug connected to the source peripheral SD diffusion layer 77*a* will be called a source peripheral plug 198. The peripheral contact plug connected to the drain peripheral SD diffusion layer 77*b* will be called a drain peripheral plug 199.

Figure 12B:
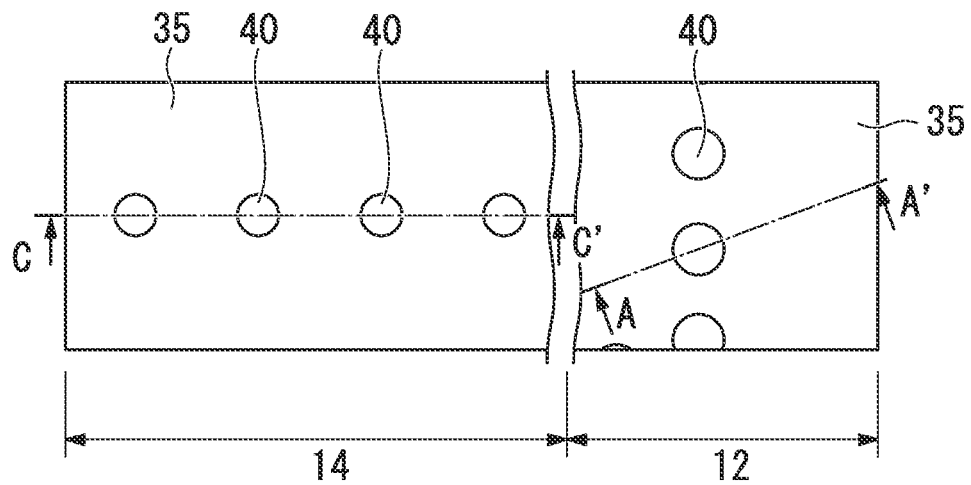
FIG. 12B is a fragmentary plan view illustrating the semiconductor device in a step, subsequent to the step of FIG. 11B, involved in the method of forming the semiconductor device in accordance with one embodiment of the present invention.
Figure 23A:
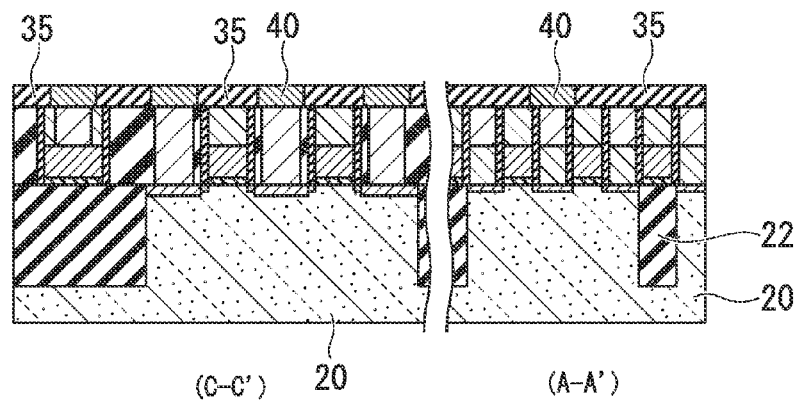
FIG. 23A is a fragmentary cross sectional elevation view, taken along the A-A' line and C-C' line of FIG. 23C, illustrating the semiconductor device in a step, subsequent to the step of FIG. 22A, involved in the method of forming the semiconductor device, in which a second interlayer insulating film and a second contact plug are formed in the peripheral circuit region and the memory cell region on the semiconductor substrate, in accordance with another embodiment of the present invention.
Figure 23B:
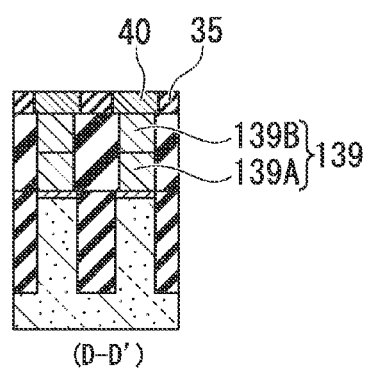
FIG. 23B is a fragmentary cross sectional elevation view, taken along the D-D' line of FIG. 23C, illustrating the semiconductor device in a step, subsequent to the step of FIG. 22B, involved in the method of forming the semiconductor device in accordance with another embodiment of the present invention.
Figure 23C:
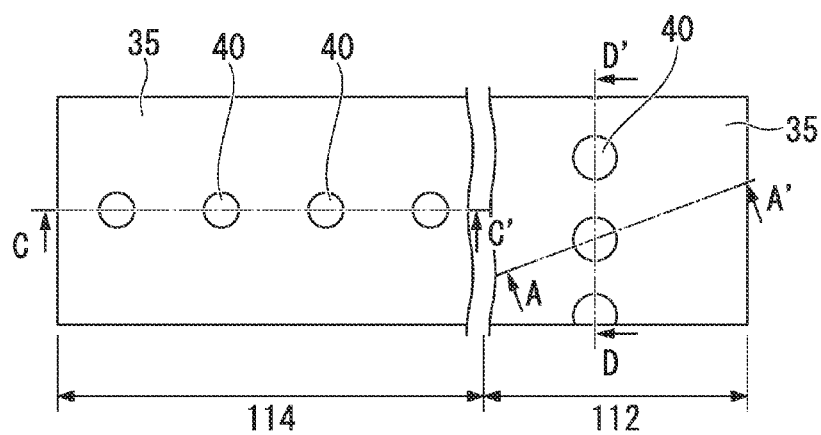
FIG. 23C is a fragmentary plan view illustrating the semiconductor device in a step, subsequent to the step of FIG. 22C, involved in the method of forming the semiconductor device in accordance with another embodiment of the present invention.

Similar to the process step as shown in FIGS. 12A and 12B of the first embodiment, the second interlayer film 35 is formed as shown in FIGS. 23A through 23C. Using the same process step as shown in FIGS. 12A and 12B of the first embodiment, the second contact plug 40 is formed. In the memory cell region 112, a contact hole is formed under the condition with a low etching speed with respect to a silicon nitride film when the second contact plug 40 is formed. By doing this, using the gate protective film 34 and the gate side wall insulating film 34*a* as stopper films for the etching process, it is possible to accurately form the contact hole.

Figure 13B:
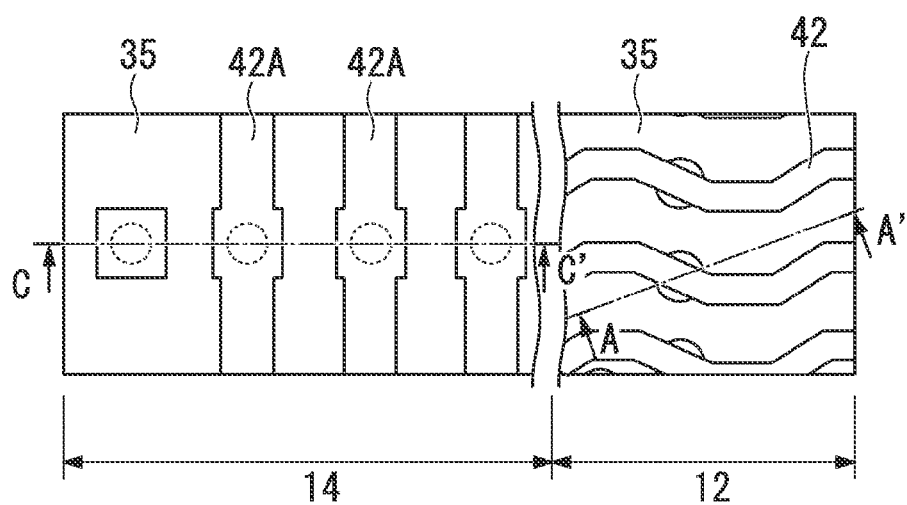
FIG. 13B is a fragmentary plan view illustrating the semiconductor device in a step, subsequent to the step of FIG. 12B, involved in the method of forming the semiconductor device in accordance with one embodiment of the present invention.
Figure 24A:
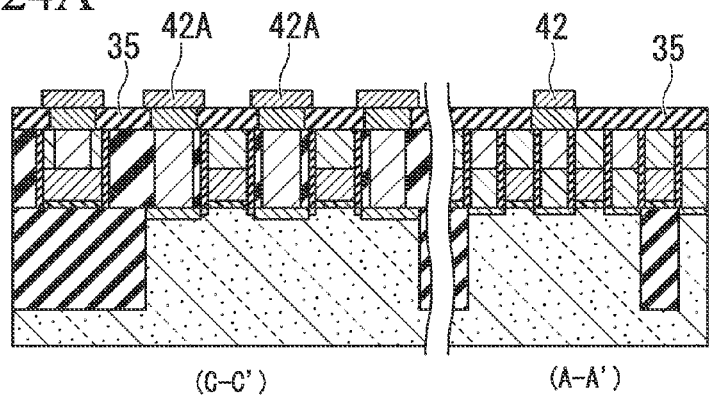
FIG. 24A is a fragmentary cross sectional elevation view, taken along the A-A' line and C-C' line of FIG. 24C, illustrating the semiconductor device in a step, subsequent to the step of FIG. 23A, involved in the method of forming the semiconductor device, in which wirings are formed in the peripheral circuit region and the memory cell region on the semiconductor substrate, in accordance with another embodiment of the present invention.
Figure 24B:
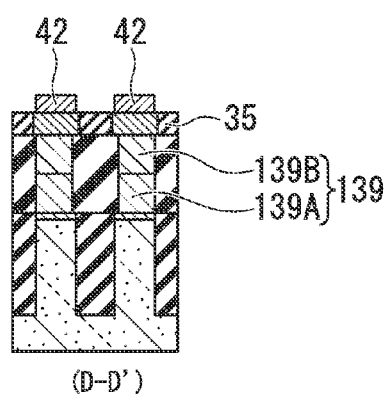
FIG. 24B is a fragmentary cross sectional elevation view, taken along the D-D' line of FIG. 24C, illustrating the semiconductor device in a step, subsequent to the step of FIG. 23B, involved in the method of forming the semiconductor device in accordance with another embodiment of the present invention.
Figure 24C:
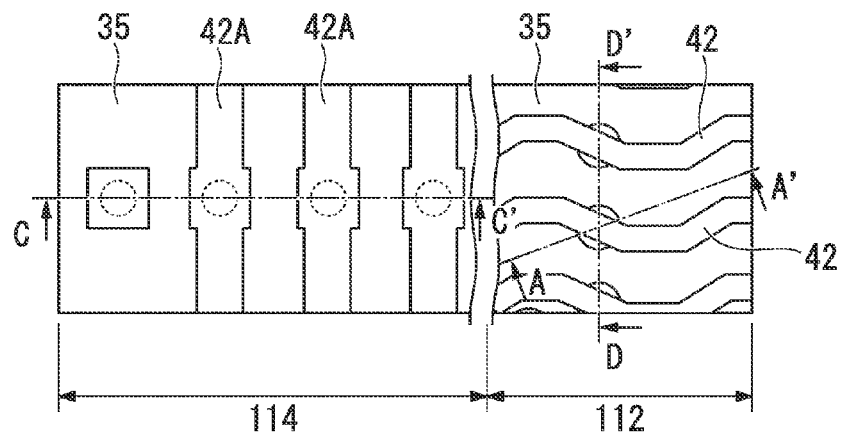
FIG. 24C is a fragmentary plan view illustrating the semiconductor device in a step, subsequent to the step of FIG. 23C, involved in the method of forming the semiconductor device in accordance with another embodiment of the present invention.

Similar to the process step as shown in FIGS. 13A and 13B of the first embodiment, the first wirings 42 and 42A are formed as shown in FIGS. 24A and 24C. Similar to the process step as shown in FIGS. 14A and 14B of the first embodiment, the third interlayer film 36 is formed.

Figure 25:
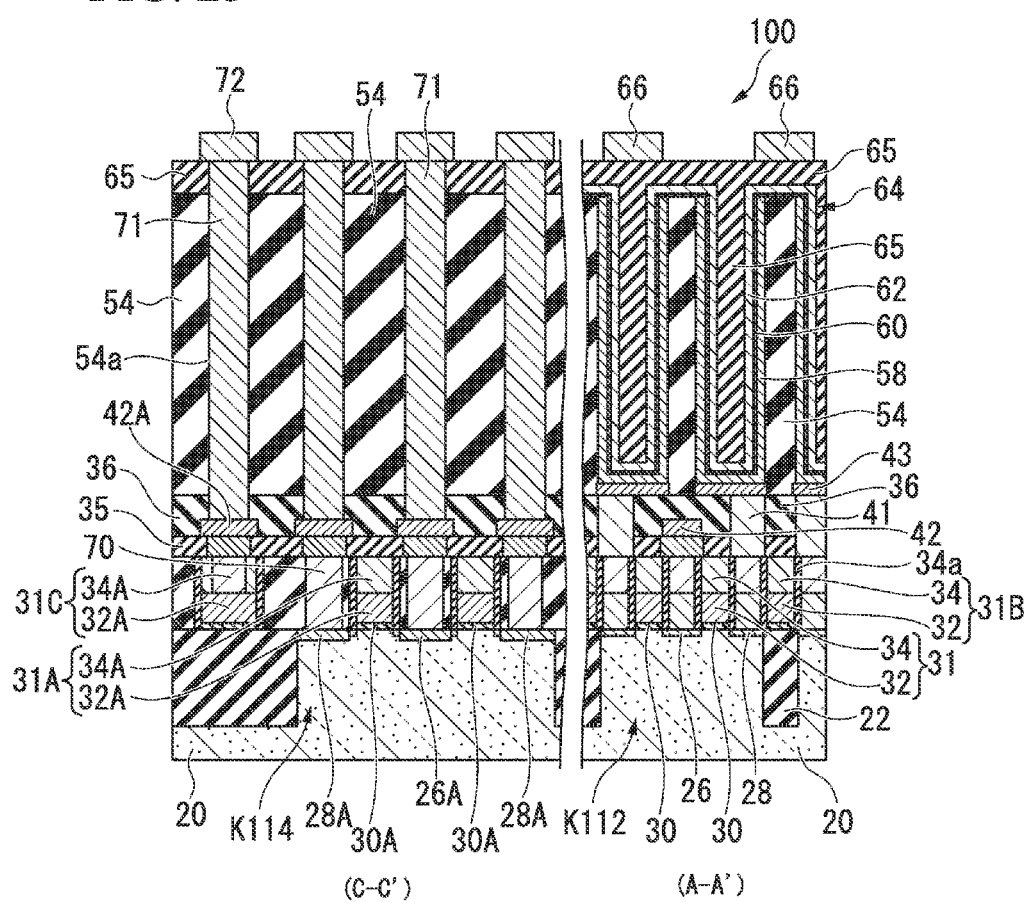
FIG. 25 is a fragmentary cross sectional elevation view illustrating the semiconductor device in a step, subsequent to the step of FIG. 24A, involved in the method of forming the semiconductor device, in which a contact plug and a wiring are formed in the peripheral circuit region and a capacitor is formed in the memory cell region on the semiconductor substrate, in accordance with another embodiment of the present invention.

The third contact plug 41 connected to and formed over the cell drain plug 196 is formed as shown in FIG. 25. A contact hole is formed under the condition with a low etching speed with respect to a silicon nitride film when the third contact plug 41 is formed. By doing this, using the gate protective film 34 and the gate side wall insulating film 34*a* as stopper films for the etching process, it is possible to accurately form the contact hole.

After the above, the same process steps as the process steps described based on FIGS. 14A and 14B in the first embodiment are performed, thereby completing the semiconductor device 100 of the second embodiment.

According to the second embodiment, the cell contact plug 139 to be disposed in the memory cell region 112 is formed by the self-alignment manner, using a mask having a band-shaped (line-shape) aperture. By doing this, it is possible to form accurately and easily the cell contact plug 139. The cell contact plug 139 may accommodate microstructuring.

Even in a case in which, the self-alignment manner using a mask having such a band-shaped aperture is employed to form the cell contact plug 139, while suppressing an increase of the manufacturing process steps, enables the formation of the cell contact plug 139. The cell contact plug 139 may have a low resistance value.

Third Embodiment

FIGS. 26A, 27A, 28A, 28B, 29A, 29B, 30A, 30B, 31A, 31B, 32A, 32B, 33A, 33B, 34A, 34B, 35A, 35B, 36A, 36B, 37A, 37B, 38A, 38B, and 39A are fragmentary cross sectional elevation views illustrating a semiconductor device in steps involved in a method of forming the semiconductor device in accordance with still another embodiment of the present invention. FIGS. 26B, 27B, 28C, 29C, 30C, 31C, 32C, 33C, 34C, 35C, 36C, 37C, 38C, and 39B are fragmentary plan views illustrating the semiconductor device in steps involved in the method of forming the semiconductor device in accordance with still another embodiment of the present invention. A semiconductor (storage) device 200 as a DRAM element having the cross sectional structure shown in FIG. 39A can be formed by embodying the method for forming described below, based on FIG. 26A to FIG. 39B.

Because the semiconductor (storage) device 200 that is formed in the present embodiment includes the same structure as the semiconductor device 10 in the above-noted first embodiment or the semiconductor device 100 in the second embodiment, the descriptions of common parts in the structure in FIG. 39 will be omitted. The elements different from the semiconductor devices 10 and 100 and the manufacturing method therefor will be mainly described below.

Figure 26A:
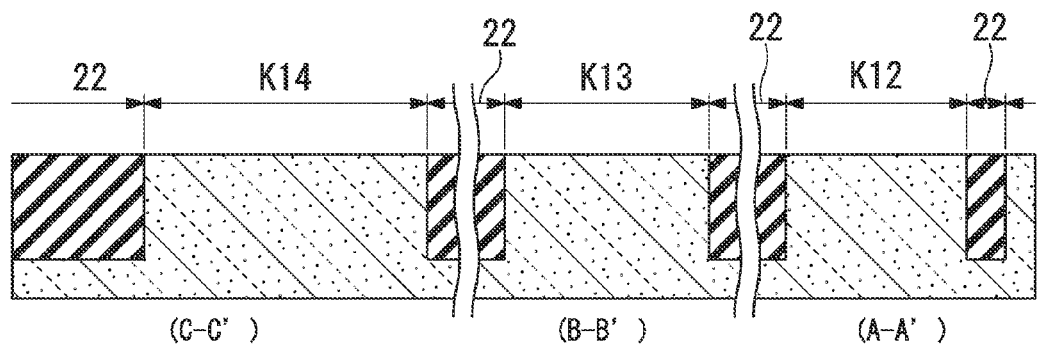
FIG. 26A is a fragmentary cross sectional elevation view, taken along the A-A' line, B-B' line, and C-C' line of FIG. 26B, illustrating a semiconductor device in a step involved in a method of forming a semiconductor device, in which an isolation region and an active region are formed in a peripheral circuit region, a cell peripheral circuit region, and a memory cell region on a semiconductor substrate, in accordance with still another embodiment of the present invention.
Figure 26B:
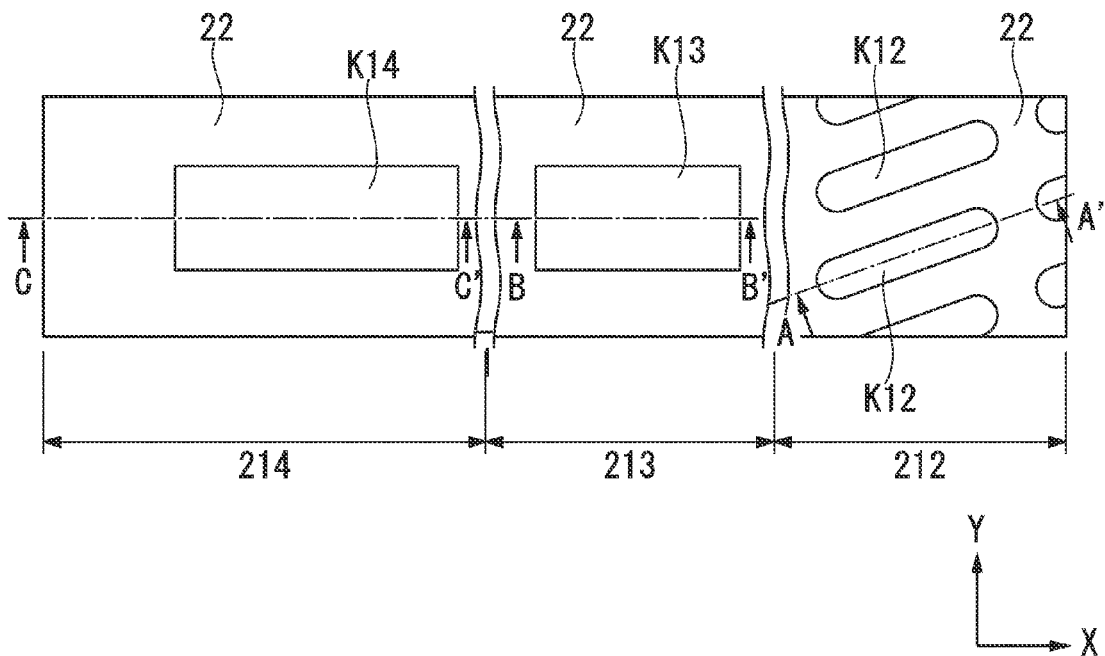
FIG. 26B is a fragmentary plan view illustrating the semiconductor device in a step involved in the method of forming the semiconductor device in accordance with still another embodiment of the present invention.

FIG. 26A is a fragmentary cross sectional elevation view, taken along the A-A' line, B-B' line, and C-C' line of FIG. 26B, illustrating the semiconductor device 200 in a step involved in the method of forming the semiconductor device 200, in which an isolation region and an active region are formed in a peripheral circuit region 214, a cell peripheral circuit region 213, and a memory cell region 212 on the semiconductor substrate 20, in accordance with still another embodiment of the present invention. FIG. 26B is a fragmentary plan view illustrating the semiconductor device 200 in a step involved in the method of forming the semiconductor device 200 in accordance with still another embodiment of the present invention. The left-side part of FIG. 26A is a fragmentary cross sectional view of the peripheral circuit region 214 along the line C-C' in FIG. 26B. The central part of FIG. 26A is a fragmentary cross sectional view of the cell peripheral circuit region 213 along the line B-B' in FIG. 26B. The right-side part of FIG. 26A is a fragmentary cross-sectional view of the memory cell region 212 along the line A-A' in FIG. 26C.

Of the drawings referenced below, the left-side part of FIGS. 26A, 27A, 28A, 29A, 30A, 31A, 32A, 33A, 34A, 35A, 36A, 37A, 38A, and 39A are cross-sectional views of the peripheral circuit region 214 along the line C-C' indicated in the corresponding drawings of FIGS. 26B, 27B, 28C, 29C, 30C, 31C, 32C, 33C, 34C, 35C, 36C, 37C, 38C, and 39B. the central part of FIGS. 26A, 27A, 28A, 29A, 30A, 31A, 32A, 33A, 34A, 35A, 36A, 37A, 38A, and 39A are cross-sectional views of the memory cell peripheral circuit region along the line B-B' indicated in the corresponding drawings of FIGS. 26B, 27B, 28C, 29C, 30C, 31C, 32C, 33C, 34C, 35C, 36C, 37C, 38C, and 39B. The right-side part of FIGS. 26A, 27A, 28A, 29A, 30A, 31A, 32A, 33A, 34A, 35A, 36A, 37A, 38A, and 39A are cross-sectional views of the memory cell region along the line A-A' indicated in the corresponding drawings of FIGS. 26B, 27B, 28C, 29C, 30C, 31C, 32C, 33C, 34C, 35C, 36C, 37C, 38C, and 39B. In order to simplify the description of FIGS. 26B, 27B, 28C, 29C, 30C, 31C, 32C, 33C, 34C, 35C, 36C, 37C, 38C, and 39B, the X direction defined as the left-right direction, and the Y direction is defined as the up-down direction. In the memory cell region 212, the direction of extension of the gate electrode corresponds to the Y direction, and the direction of extension of the line C-C' and line B-B' in FIGS. 26B, 27B, 28C, 29C, 31C, 32C, 33C, 34C, 35C, 36C, 37C, 38C, and 39B is parallel to the X direction.

The cell peripheral circuit region 213 is a part of the peripheral circuit region 214. The cell peripheral circuit region 213 particularly is disposed at the side directly adjacent the cell region 212 in the peripheral circuit region 214. In the cell peripheral circuit region 213, a circuit element, such as a sense amplifier circuit connected to a bit line which leads out from a memory cell to be formed in the memory cell region 212 or a decoder circuit connected to a word line, is disposed. The circuit elements, which need to be disposed with high density to match the memory cell arrangement, are formed by applying finer design rules than the circuit elements of the other in the peripheral circuit region 214.

According to the third embodiment, in the same manner as in the above-noted first and second embodiments, the memory cell region 212 and the peripheral circuit region 214 are defined as shown in FIG. 26B, in addition to the definition of active regions K12 and K14 therein, and an isolation film 22 is formed with respect to the cell peripheral circuit region 213 so as to define an active region K13.

Figure 27A:
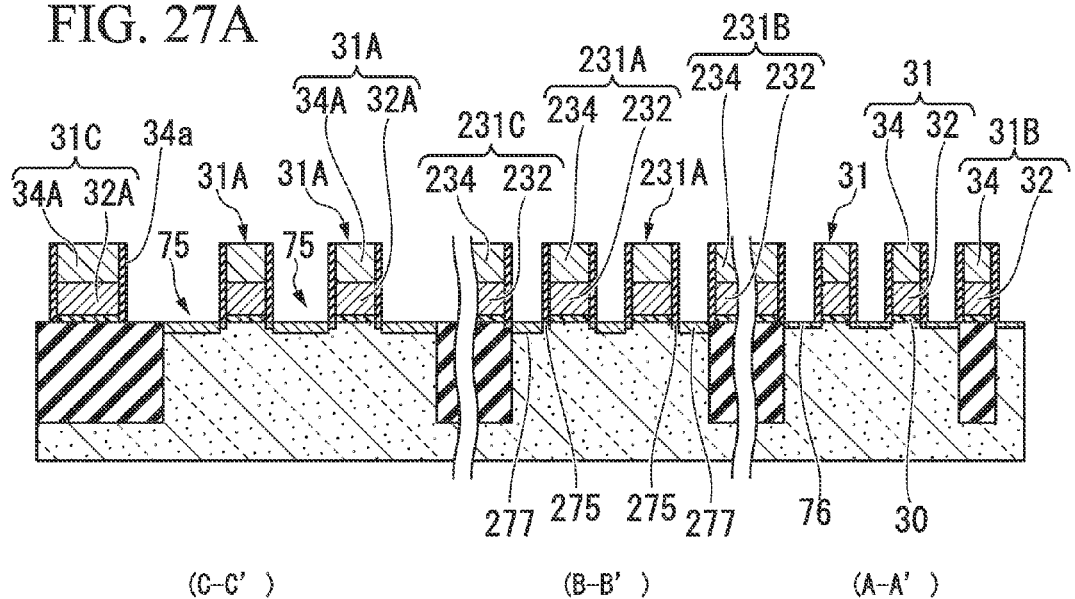
FIG. 27A is a fragmentary cross sectional elevation view, taken along the A-A' line, B-B' line, and C-C' line of FIG. 27B, illustrating the semiconductor device in a step, subsequent to the step of FIG. 26A, involved in the method of forming the semiconductor device, in which a peripheral gate electrode, a cell peripheral gate electrode, and a cell gate electrode are formed in the peripheral circuit region, the cell peripheral region, and the memory cell region on the semiconductor substrate, and side walls are formed on each electrodes, in accordance with still another embodiment of the present invention.

A process step similar to the process step as shown in FIGS. 2A and 2B of the first embodiment is performed so that the gate electrodes 31, 31A, 31B, and 31C are formed in the peripheral circuit region 214, the cell peripheral circuit region 213 and the memory cell region 212. Also, in the present embodiment, as shown in FIG. 27A, the process step used when these gate electrodes 31, 31A, 31B, and 31C are formed in the cell peripheral circuit region 213 is utilized so that cell peripheral gate electrodes 231A, 2312B and 231C are formed. The cell peripheral gate electrodes 231A, 2312B and 231C are made from a gate protective film 234 which is the upper layer and a gate conductive film 232 which is the bottom layer.

Figure 27B:
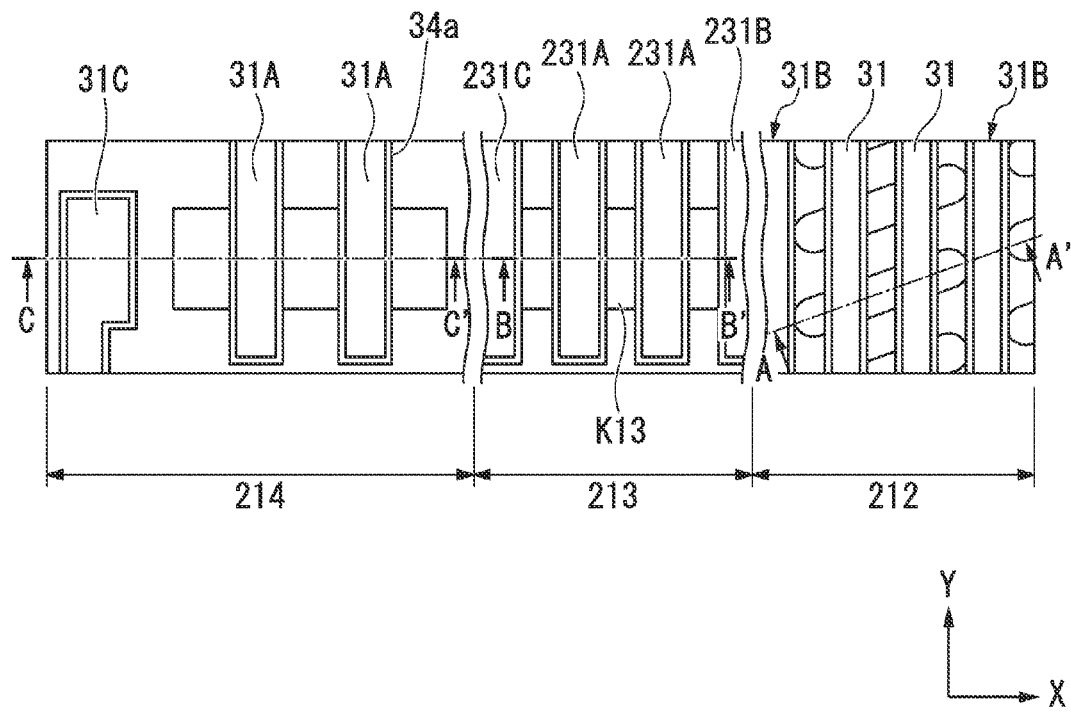
FIG. 27B is a fragmentary plan view illustrating the semiconductor device in a step, subsequent to the step of FIG. 26B, involved in the method of forming the semiconductor device in accordance with still another embodiment of the present invention.

The cell peripheral gate electrodes 231A are formed in the active region K13 between the isolation films 22 in the cell peripheral circuit region 213. The cell peripheral gate electrodes 231A are electrodes formed in the region where the MOS transistors are formed. The cell peripheral gate electrodes 231A extend in the Y direction as shown in FIG. 27B in the present embodiment. The cell peripheral gate electrodes 231A are formed so as to traverse the active region K13 in the Y direction. Two cell peripheral gate electrodes 231A are disposed in a parallel manner in the X direction within the active region K13.

The cell peripheral gate electrode 231B is formed above the right side of the isolation film 22 in the cell peripheral circuit region 213 of FIG. 27A. The cell peripheral gate electrode 231B serves as a cell peripheral wiring. The cell peripheral gate electrode 231C is formed on the left side of the isolation film 22 in the cell peripheral circuit region 213 of FIG. 27A. The cell peripheral gate electrode 231C serves as a cell peripheral gate wiring. The cell peripheral gate electrodes 231B and 231C extend in the Y direction along the isolation film 32 in the present embodiment.

Similar to the process step shown in FIGS. 2A and 2B in the above-noted first embodiment, as shown in FIG. 27A, a peripheral LDD diffusion layer 75 is formed in the peripheral circuit region 214. A cell diffusion layer 76 is formed in the memory cell region 212. A cell peripheral LDD diffusion layer 275 is formed in the cell peripheral circuit region 213. The peripheral LDD diffusion layer 75 and the cell peripheral LDD diffusion layer 275 may be formed under the same ion implantation conditions.

Similar to the process step shown in FIGS. 3A and 3B in the above-noted first embodiment, as shown in FIG. 27A, the gate side wall insulating film 34a is formed. A peripheral SD diffusion layer 77 is formed in the peripheral circuit region 214. A cell peripheral SD diffusion layer 277 is formed in the cell peripheral circuit region 213. The peripheral SD diffusion layer 77 and the cell peripheral SD diffusion layer 277 may be formed under the same ion implantation conditions.

Figure 4B:
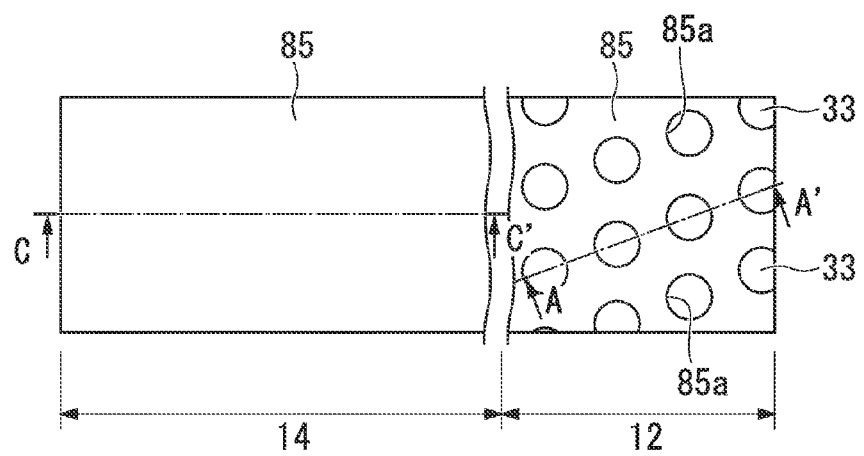
FIG. 4B is a fragmentary plan view illustrating the semiconductor device in a step, subsequent to the step of FIG. 3B, involved in the method of forming the semiconductor device in accordance with one embodiment of the present invention.
Figure 28A:
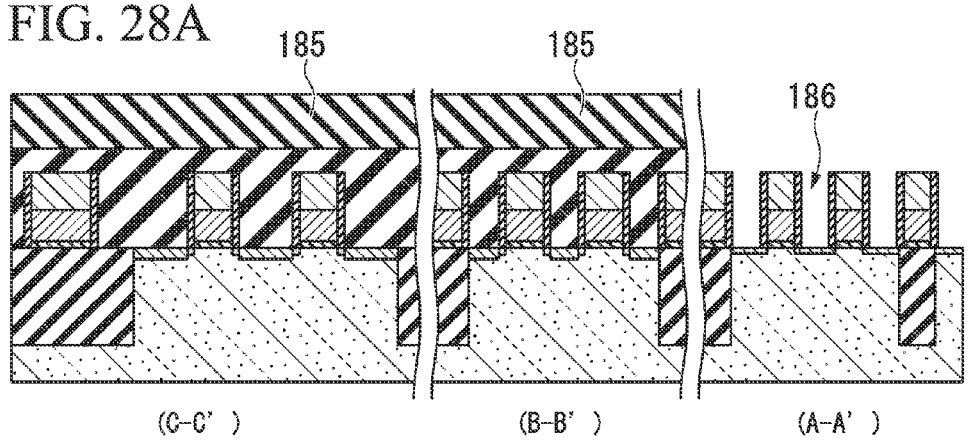
FIG. 28A is a fragmentary cross sectional elevation view, taken along the A-A' line, B-B' line, and C-C' line of FIG. 28C, illustrating the semiconductor device in a step, subsequent to the step of FIG. 27A, involved in the method of forming the semiconductor device, in which a first interlayer insulating film is formed over the peripheral gate electrode, the cell peripheral gate electrode, and the cell gate electrode in the peripheral circuit region, the cell peripheral circuit region, and the memory cell region on the semiconductor substrate and a cell contact hole is formed in the memory cell region, in accordance with still another embodiment of the present invention.
Figure 28B:
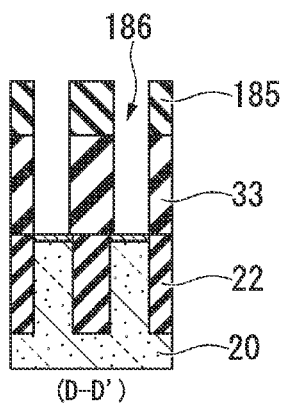
FIG. 28B is a fragmentary cross sectional elevation view, taken along the D-D' line of FIG. 28C, illustrating the semiconductor device in a step, subsequent to the step of FIG. 27A, involved in the method of forming the semiconductor device in accordance with still another embodiment of the present invention.
Figure 28C:
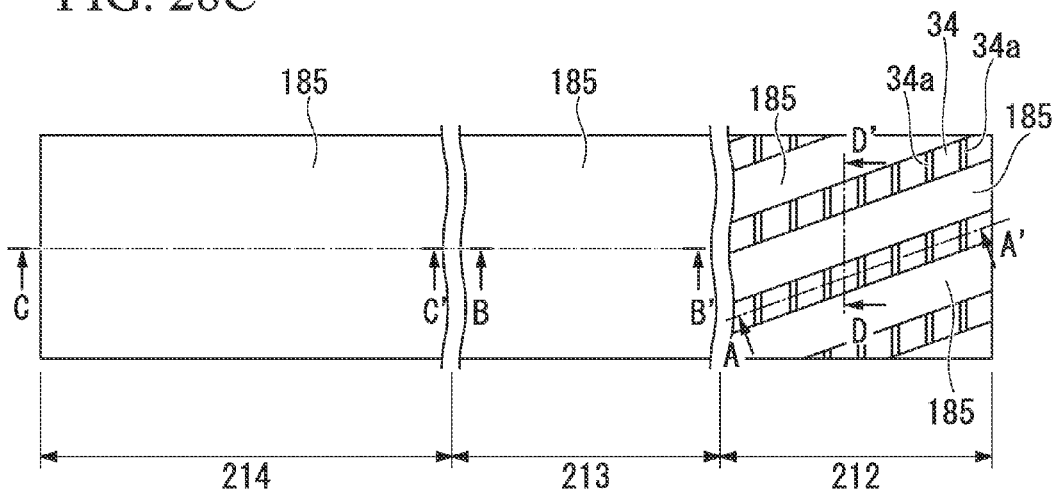
FIG. 28C is a fragmentary plan view illustrating the semiconductor device in a step, subsequent to the step of FIG. 27B, involved in the method of forming the semiconductor device in accordance with still another embodiment of the present invention.

Similar to the process step shown in FIGS. 4A and 4B in the previous first embodiment, a first interlayer film 33 is formed as shown in FIG. 28A. Similar to the process step as described based on FIG. 15A to FIG. 16C in the above-described second embodiment, the cell contact mask 185 having a band-shaped pattern is formed. The cell contact hole 186 is formed in the memory cell region 212 using the cell contact mask 185 as a mask.

Figure 29A:
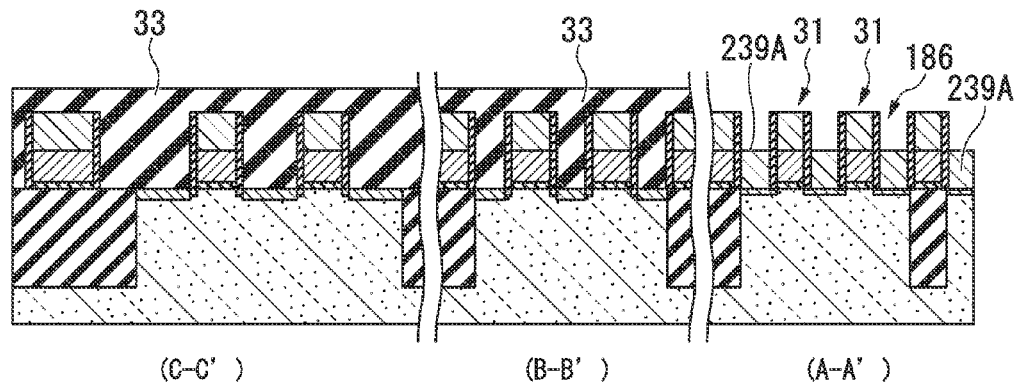
FIG. 29A is a fragmentary cross sectional elevation view, taken along the A-A' line, B-B' line, and C-C' line of FIG. 29C, illustrating the semiconductor device in a step, subsequent to the step of FIG. 28A, involved in the method of forming the semiconductor device, in which a lower conductive plug for a cell contact is formed in the memory cell region on the semiconductor substrate, in accordance with still another embodiment of the present invention.
Figure 29B:
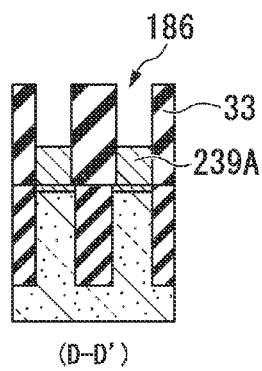
FIG. 29B is a fragmentary cross sectional elevation view, taken along the D-D' line of FIG. 29C, illustrating the semiconductor device in a step, subsequent to the step of FIG. 28B, involved in the method of forming the semiconductor device in accordance with still another embodiment of the present invention.
Figure 29C:
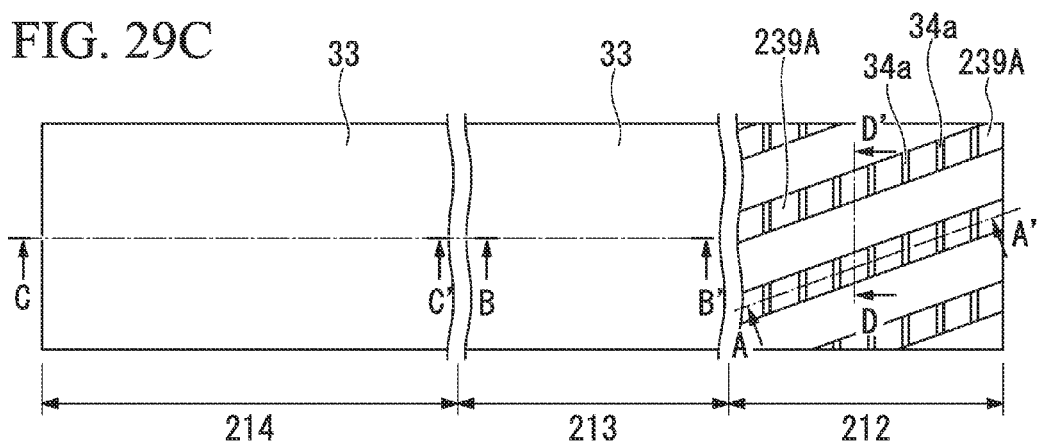
FIG. 29C is a fragmentary plan view illustrating the semiconductor device in a step, subsequent to the step of FIG. 28C, involved in the method of forming the semiconductor device in accordance with still another embodiment of the present invention.

A dry etching process is performed and the cell contact mask 185 is removed. Then, similar to the process step as described based on FIG. 18A to FIG. 19C in the above-described second embodiment, after forming the contact first conductive film, the contact first conductive film is etched back, and a cell plug lower part region (lower part conductive plug 239A) is formed in the cell contact hole 186 as shown in FIGS. 29A and 29B.

Figure 30A:
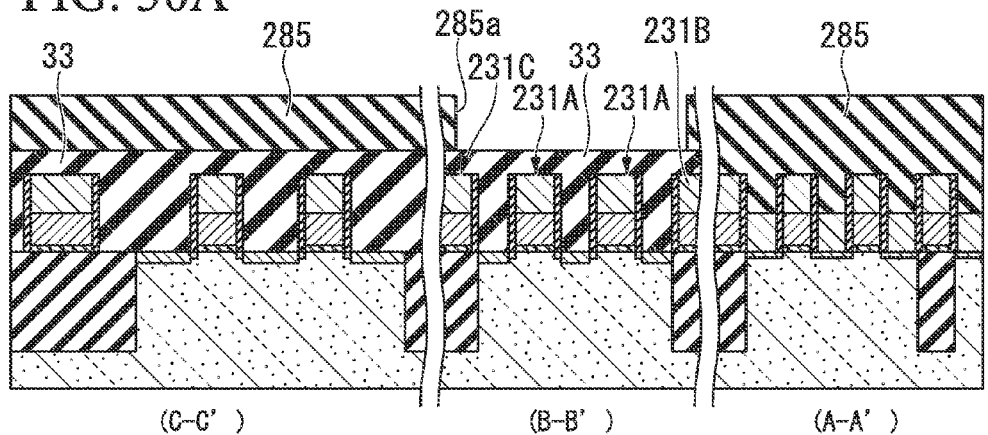
FIG. 30A is a fragmentary cross sectional elevation view, taken along the A-A' line, B-B' line, and C-C' line of FIG. 30C, illustrating the semiconductor device in a step, subsequent to the step of FIG. 29A, involved in the method of forming the semiconductor device, in which a contact mask is formed in the peripheral circuit region, the cell peripheral circuit region, and the memory cell region on the semiconductor substrate and a contact mask aperture is formed in the cell peripheral circuit region, in accordance with still another embodiment of the present invention.
Figure 30B:
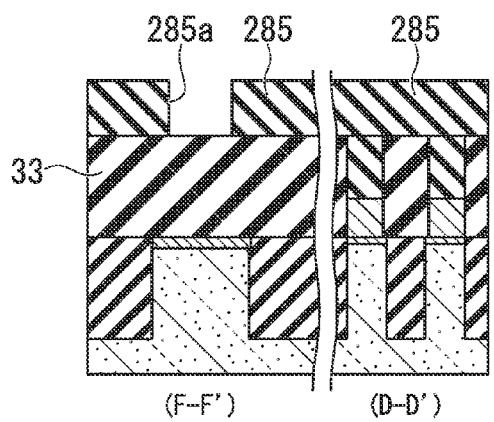
FIG. 30B is a fragmentary cross sectional elevation view, taken along the D-D' line of FIG. 30C, illustrating the semiconductor device in a step, subsequent to the step of FIG. 29B, involved in the method of forming the semiconductor device in accordance with still another embodiment of the present invention.
Figure 30C:
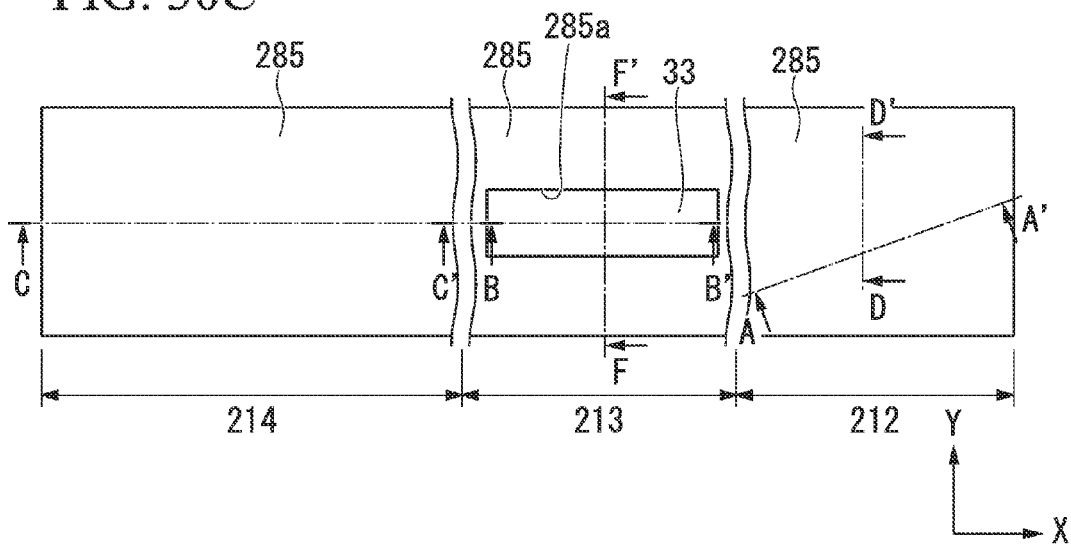
FIG. 30C is a fragmentary plan view illustrating the semiconductor device in a step, subsequent to the step of FIG. 29C, involved in the method of forming the semiconductor device in accordance with still another embodiment of the present invention.

Using photolithography process, a photoresist mask having an aperture is formed to form a cell peripheral contact plug in the cell peripheral circuit region 213, as shown in FIG. 30A. The photoresist mask will be called a cell peripheral contact mask 285, and the aperture part will be called a cell peripheral contact mask aperture 285a. The cell peripheral contact mask aperture 285a has a rectangular aperture (refer to FIG. 30C) which traverses the active region K13 of the cell peripheral circuit region 213 in the X direction. The cell peripheral contact mask aperture 285a having a rectangular aperture is formed so as to include three regions of the cell peripheral SD diffusion layers 277. Three regions are defined by being sandwiched between the cell peripheral gate electrodes 231A and 231B, between the cell peripheral gate electrodes 231A and 231A, and between the cell peripheral gate electrodes 231B and 231C. The cell peripheral contact mask aperture 285a is disposed so as to substantially overlap the edge part of the active region K13 in the Y direction. The cell peripheral gate electrodes 231C, 231A, 231A and 231B are disposed with a high density to the limit of processing in the X direction. For this reason, if a mask having a hole pattern is used for the cell peripheral contact mask aperture 285a and the mask is formed using photolithography process, a connection between adjacent cell peripheral contact plugs tends to occur.

According to the present third embodiment, after the cell peripheral contact mask aperture 285a is formed as one pattern in which each contact hole is connected to another, and a second contact conductive film which will be described later is formed. Then the second contact conductive film is separated into each contact plug. By doing this, a short between contact plugs formed later can be avoided.

Figure 31A:
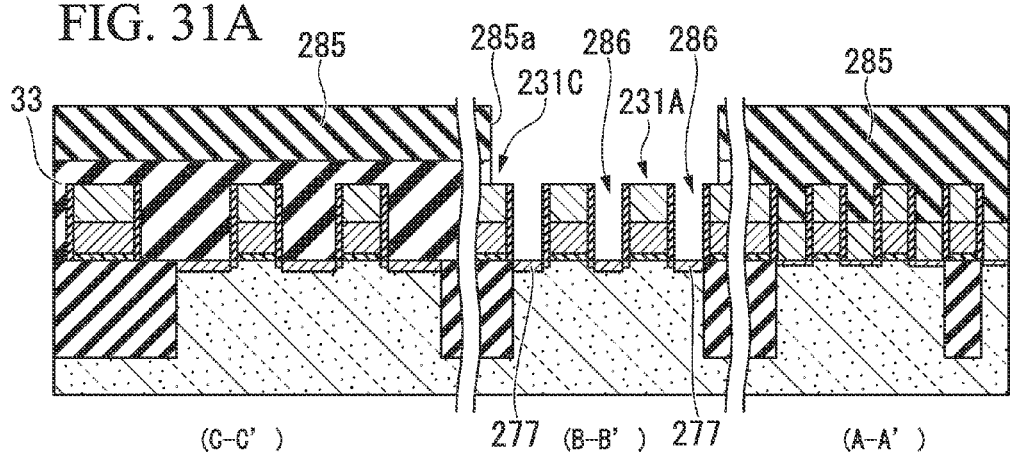
FIG. 31A is a fragmentary cross sectional elevation view, taken along the A-A' line, B-B' line, and C-C' line of FIG. 31C, illustrating the semiconductor device in a step, subsequent to the step of FIG. 30A, involved in the method of forming the semiconductor device, in which a cell peripheral contact hole is formed in the cell peripheral circuit region, in accordance with still another embodiment of the present invention.
Figure 31B:
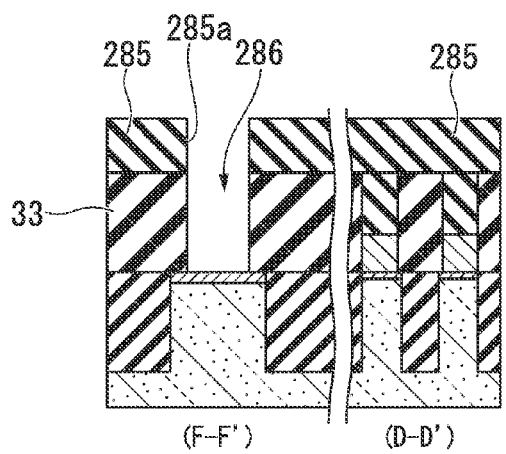
FIG. 31B is a fragmentary cross sectional elevation view, taken along the D-D' line of FIG. 31C, illustrating the semiconductor device in a step, subsequent to the step of FIG. 30B, involved in the method of forming the semiconductor device in accordance with still another embodiment of the present invention.
Figure 31C:
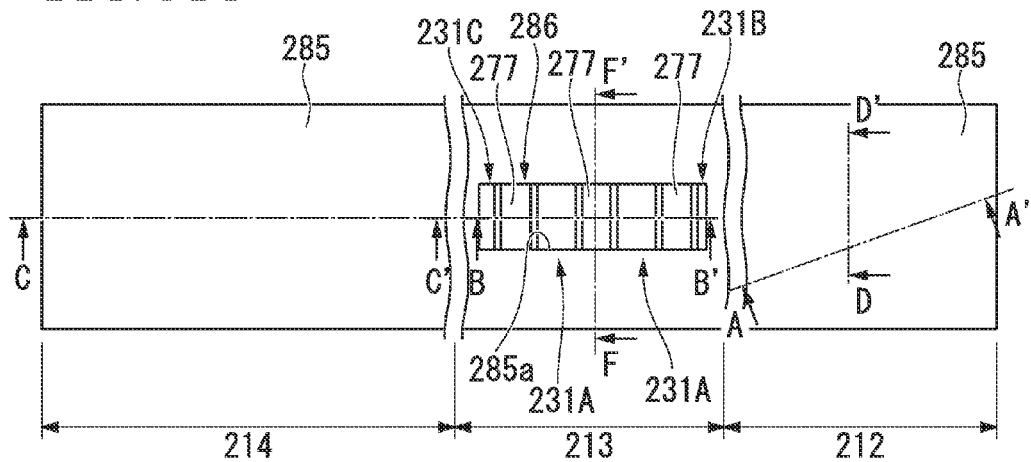
FIG. 31C is a fragmentary plan view illustrating the semiconductor device in a step, subsequent to the step of FIG. 30C, involved in the method of forming the semiconductor device in accordance with still another embodiment of the present invention.

Similar to the method in the process step described based on FIG. 16A to FIG. 16C in the above-described second embodiment, the first interlayer film 33 is etched using the cell peripheral contact mask 285 as a mask, so as to form a cell peripheral contact hole 286 as shown in FIGS. 31A and 31B. The cell peripheral contact mask aperture 285a is a rectangular pattern extending in the X direction. Three cell peripheral SD diffusion layers 277 are shown through the cell peripheral contact mask aperture 285*a*.

Figure 32A:
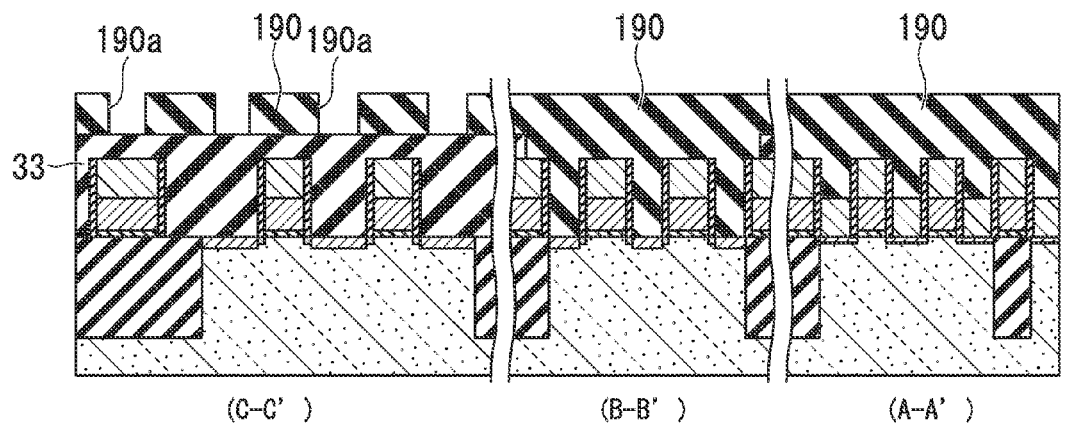
FIG. 32A is a fragmentary cross sectional elevation view, taken along the A-A' line, B-B' line, and C-C' line of FIG. 32C, illustrating the semiconductor device in a step, subsequent to the step of FIG. 31A, involved in the method of forming the semiconductor device, in which a contact mask is formed in the peripheral circuit region, the cell peripheral circuit region, and the memory cell region on the semiconductor substrate and a contact mask aperture is formed in the peripheral circuit region, in accordance with still another embodiment of the present invention.
Figure 32B:
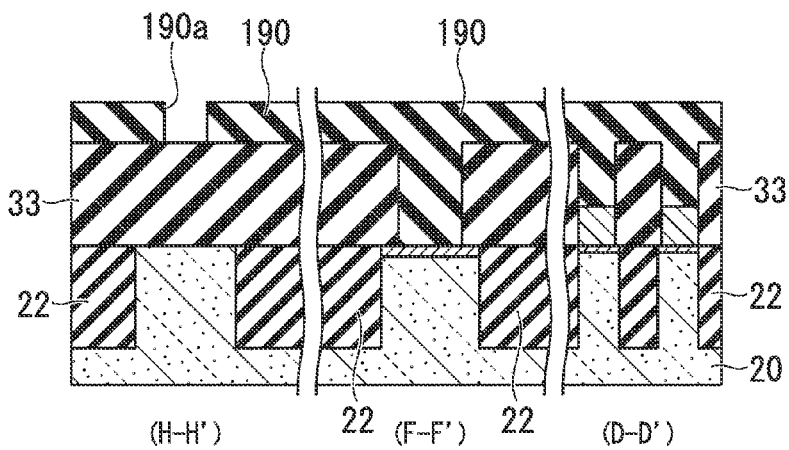
FIG. 32B is a fragmentary cross sectional elevation view, taken along the D-D' line of FIG. 32C, illustrating the semiconductor device in a step, subsequent to the step of FIG. 31B, involved in the method of forming the semiconductor device in accordance with still another embodiment of the present invention.
Figure 32C:
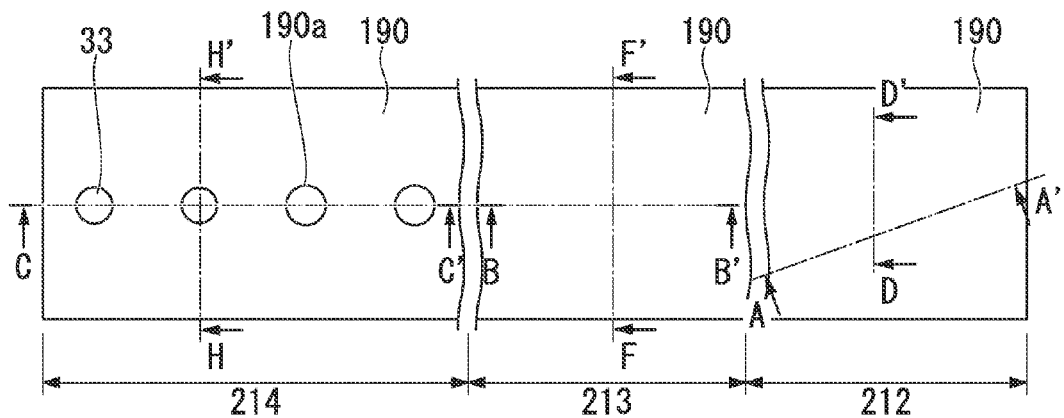
FIG. 32C is a fragmentary plan view illustrating the semiconductor device in a step, subsequent to the step of FIG. 31C, involved in the method of forming the semiconductor device in accordance with still another embodiment of the present invention.

The cell peripheral contact mask 285 is removed. Additionally, similar to the process step described based on FIGS. 19A to 19C in the second embodiment, a peripheral contact mask 190 having a peripheral contact mask aperture 190*a* in the peripheral circuit region 214 is formed as shown in FIGS. 32A to 32C. The cell peripheral circuit region 213 and the memory cell region 212 are covered by the peripheral contact mask 190.

Figure 20A:
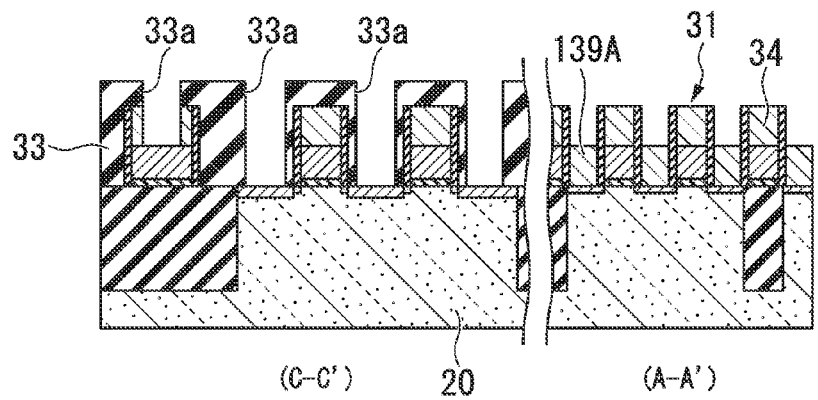
FIG. 20A is a fragmentary cross sectional elevation view, taken along the A-A' line and C-C' line of FIG. 20C, illustrating the semiconductor device in a step, subsequent to the step of FIG. 19A, involved in the method of forming the semiconductor device, in which a contact aperture is formed in the peripheral circuit region on the semiconductor substrate and the contact mask in the memory cell region is removed, in accordance with another embodiment of the present invention.
Figure 20B:
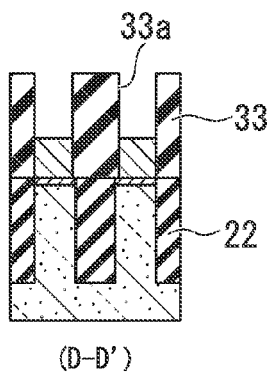
FIG. 20B is a fragmentary cross sectional elevation view, taken along the D-D' line of FIG. 20C, illustrating the semiconductor device in a step, subsequent to the step of FIG. 19B, involved in the method of forming the semiconductor device in accordance with another embodiment of the present invention.
Figure 20C:
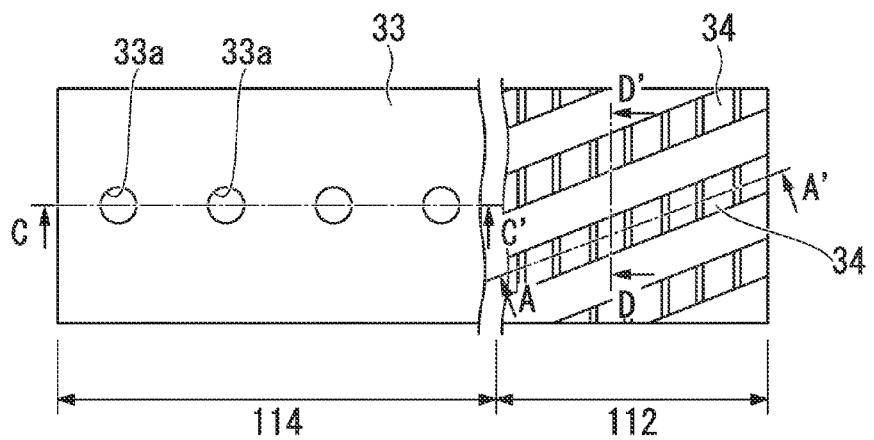
FIG. 20C is a fragmentary plan view illustrating the semiconductor device in a step, subsequent to the step of FIG. 19C, involved in the method of forming the semiconductor device in accordance with another embodiment of the present invention.
Figure 33A:
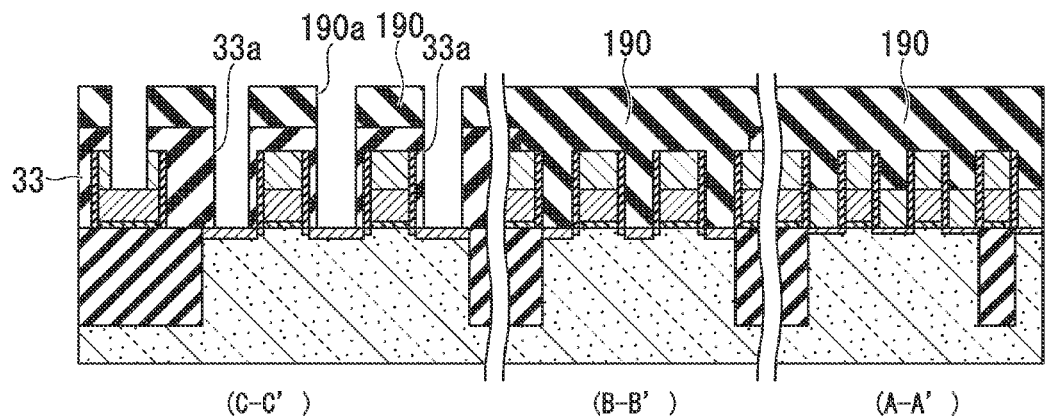
FIG. 33A is a fragmentary cross sectional elevation view, taken along the A-A' line, B-B' line, and C-C' line of FIG. 33C, illustrating the semiconductor device in a step, subsequent to the step of FIG. 32A, involved in the method of forming the semiconductor device, in which a diffusion layer peripheral contact hole is formed in the peripheral circuit region on the semiconductor substrate, in accordance with still another embodiment of the present invention.
Figure 33B:
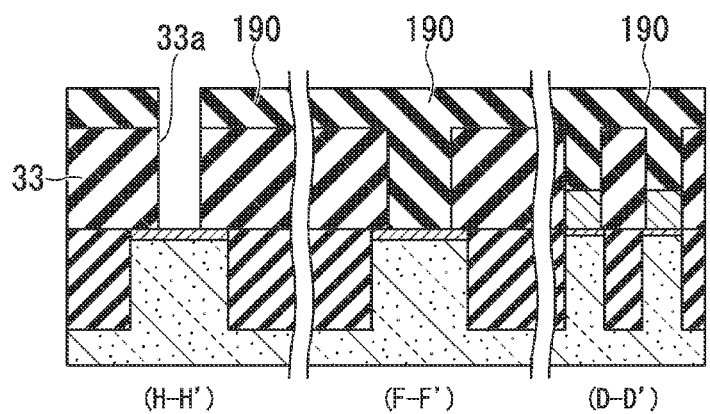
FIG. 33B is a fragmentary cross sectional elevation view, taken along the D-D' line of FIG. 33C, illustrating the semiconductor device in a step, subsequent to the step of FIG. 32B, involved in the method of forming the semiconductor device in accordance with still another embodiment of the present invention.
Figure 33C:
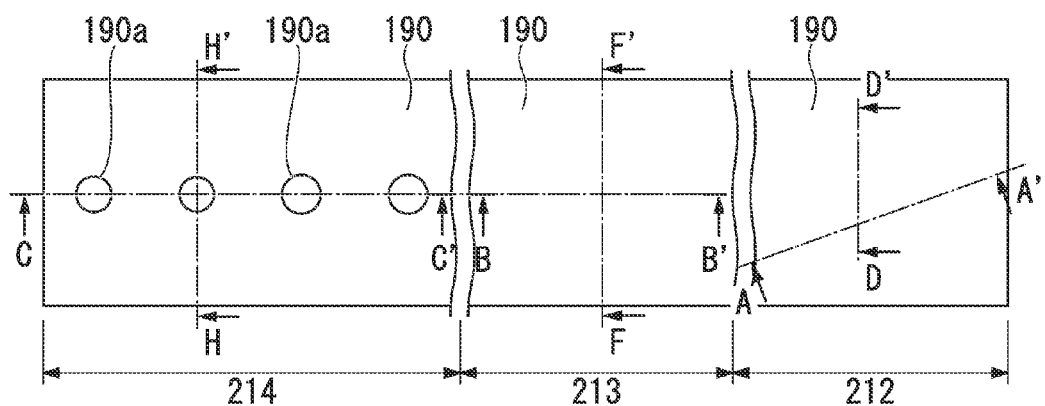
FIG. 33C is a fragmentary plan view illustrating the semiconductor device in a step, subsequent to the step of FIG. 32C, involved in the method of forming the semiconductor device in accordance with still another embodiment of the present invention.

Similar to the process step shown in FIGS. 20A to 20C in the above-described second embodiment, as shown in FIGS. 33A to 33C, the peripheral contact hole 33*a* is formed by a dry etching process.

Figure 34A:
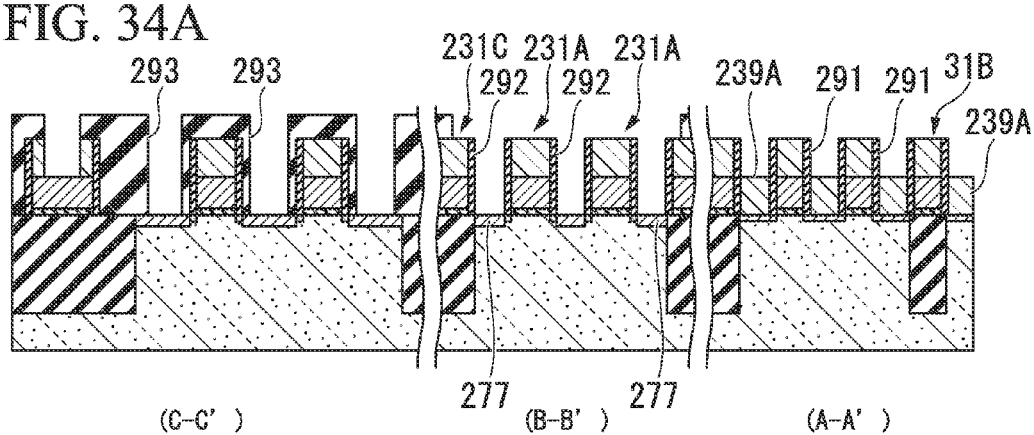
FIG. 34A is a fragmentary cross sectional elevation view, taken along the A-A' line, B-B' line, and C-C' line of FIG. 34C, illustrating the semiconductor device in a step, subsequent to the step of FIG. 33A, involved in the method of forming the semiconductor device, in which a contact aperture is formed in the peripheral circuit region, the cell peripheral circuit region, and the memory cell region on the semiconductor substrate, in accordance with still another embodiment of the present invention.
Figure 34B:
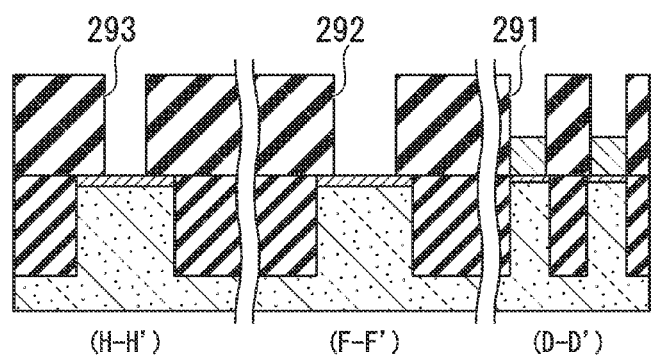
FIG. 34B is a fragmentary cross sectional elevation view, taken along the D-D' line of FIG. 34C, illustrating the semiconductor device in a step, subsequent to the step of FIG. 33B, involved in the method of forming the semiconductor device in accordance with still another embodiment of the present invention.
Figure 34C:
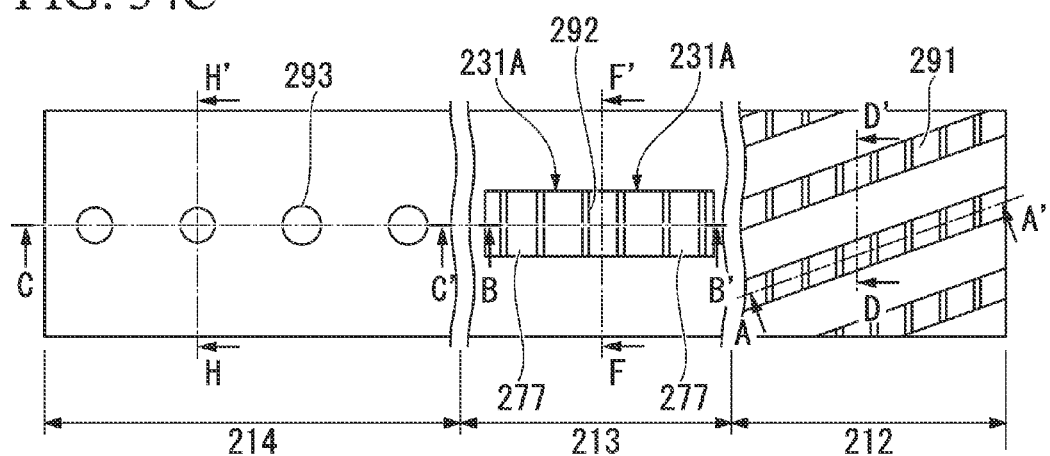
FIG. 34C is a fragmentary plan view illustrating the semiconductor device in a step, subsequent to the step of FIG. 33C, involved in the method of forming the semiconductor device in accordance with still another embodiment of the present invention.

The peripheral contact mask 190 is then removed. As shown in FIGS. 34A to 34C, a band-shaped cell contact hole 291, below which a cell plug lower region (lower conductive plug 239A) is buried, is formed in the memory cell region 212. A cell peripheral contact hole 292, which opens with a rectangular shape, is formed in the cell peripheral circuit region 213. A hole-like peripheral contact hole 293 is formed in the peripheral circuit region 214.

Figure 22C:
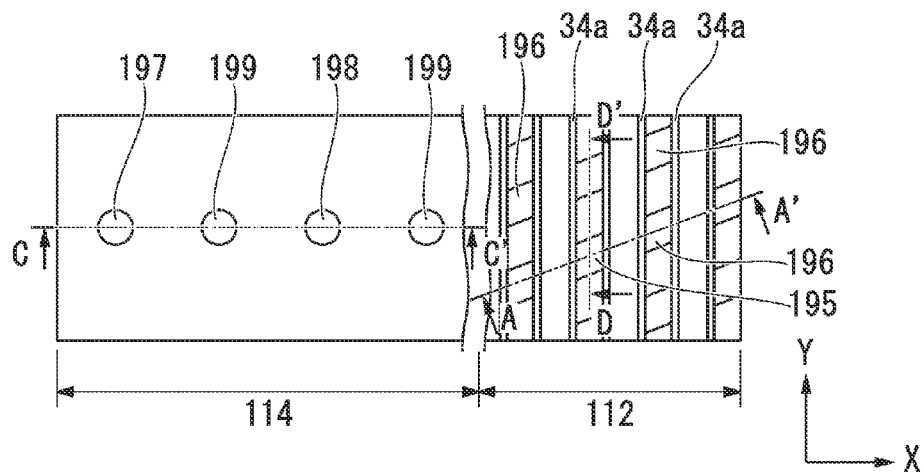
FIG. 22C is a fragmentary plan view illustrating the semiconductor device in a step, subsequent to the step of FIG. 21A, involved in the method of forming the semiconductor device in accordance with another embodiment of the present invention.
Figure 35A:
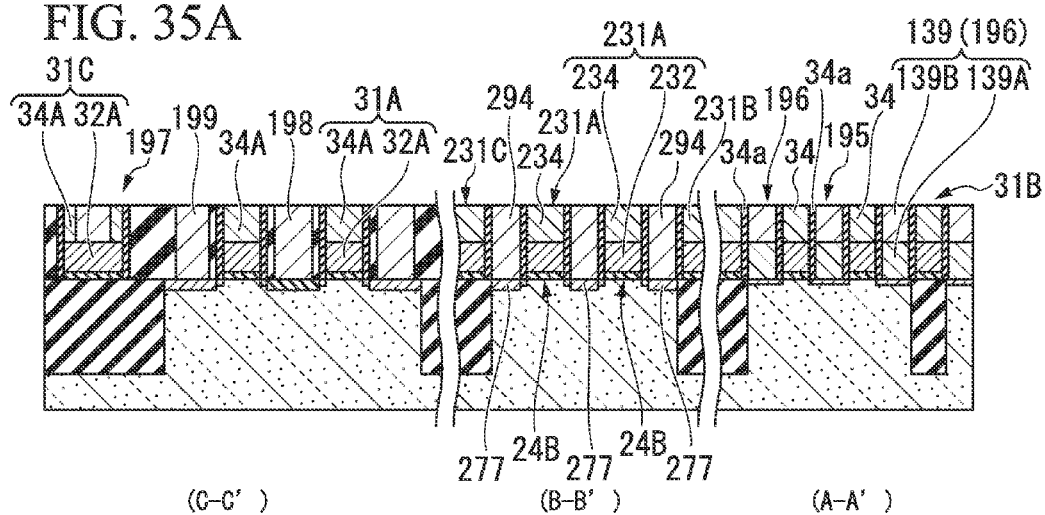
FIG. 35A is a fragmentary cross sectional elevation view, taken along the A-A' line, B-B' line, and C-C' line of FIG. 35C, illustrating the semiconductor device in a step, subsequent to the step of FIG. 34A, involved in the method of forming the semiconductor device, in which plugs are formed in the peripheral circuit region, the cell peripheral circuit region, and the memory cell region on the semiconductor substrate and then planarized, in accordance with still another embodiment of the present invention.
Figure 35B:
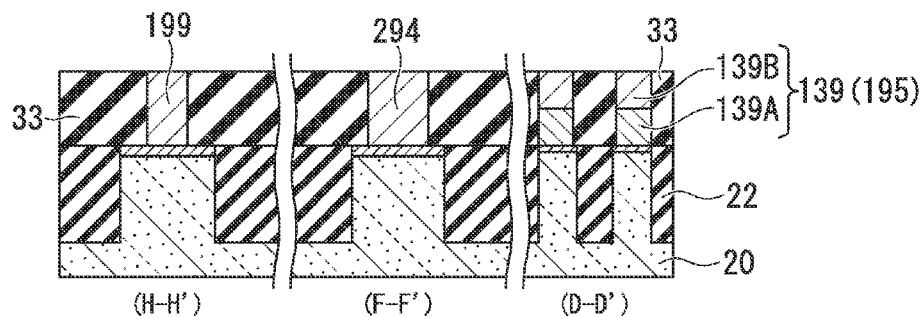
FIG. 35B is a fragmentary cross sectional elevation view, taken along the D-D' line of FIG. 35C, illustrating the semiconductor device in a step, subsequent to the step of FIG. 34B, involved in the method of forming the semiconductor device in accordance with still another embodiment of the present invention.
Figure 35C:
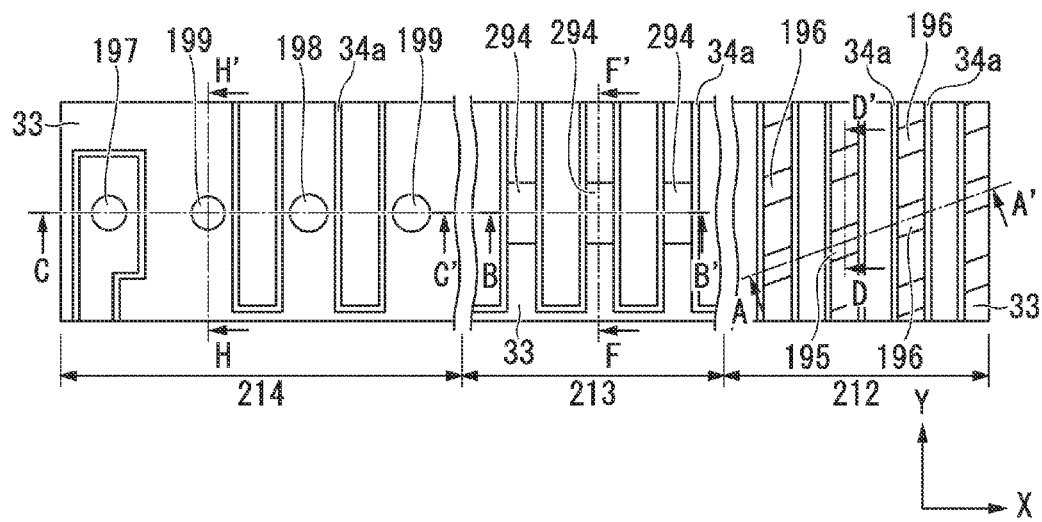
FIG. 35C is a fragmentary plan view illustrating the semiconductor device in a step, subsequent to the step of FIG. 34C, involved in the method of forming the semiconductor device in accordance with still another embodiment of the present invention.

Similar to the process step as described based on FIGS. 21 to 22C in the above-described second embodiment, after depositing the second contact conductive film, the second contact conductive film and a first interlayer film are polished by CMP, the upper surfaces of gate protective films 34, 34A, and 234 are thereby exposed, as shown in FIGS. 35A and 35B. The gate protective films 34, 34A, and 234 are formed in the peripheral circuit region 214, the cell peripheral circuit region 213, and the memory cell region 212 respectively.

In the cell peripheral circuit region 213, the second contact conductive film is buried in three cell peripheral contact holes 292. Three cell peripheral contact holes 292 are positioned between the cell peripheral gate electrodes 231A and 231B, between the cell peripheral gate electrodes 231A and 231A, and between the cell peripheral gate electrodes 231B and 231C respectively. Then, three contact plugs 294 for the cell peripheral circuit region 213 are formed to be arranged in the X direction side by side. Bottoms of the contact plugs 294 in the cell peripheral circuit region 213 are connected to the cell peripheral SD diffusion layers 277, respectively.

In the cell peripheral circuit region 213, the cell peripheral SD diffusion layers 277 sandwich a gate insulating film 30B. A gate electrode 231A having a laminated structure is formed over the gate insulating film 30B, so as to constitute a transistor 24B for the cell peripheral circuit region 213.

In the memory cell region 212, the second contact conductive film is buried within a region that is sandwiched by the side walls 34*a* of the cell gate electrode 31 in the X direction, and that is sandwiched by the side walls of the first interlayer film 33 in the Y direction. The second contact conductive film is formed within the region so as to form a cell plug upper region (a upper conductive plug 139B). The cell plug upper region (the upper conductive plug 139B) is formed so as to be stacked over a cell plug lower region (a lower conductive plug 139A). A cell contact plug 139 is configured by two layers of the cell plug lower region (the lower conductive plug 139A) made of polycrystalline silicon and the cell plug upper region (the upper conductive plug 139B) made of the metal film.

By this process step the cell contact hole 291 is separated into each region above each cell diffusion layer 76 (source/drain cell diffusion layer) so that a source cell plug 195 and drain cell plugs 196 and 196 are disposed. The source cell plug 195 and drain cell plugs 196 and 196 are formed to be separated by the gate electrodes 31 each other on each cell diffusion layer 76.

Figure 36A:
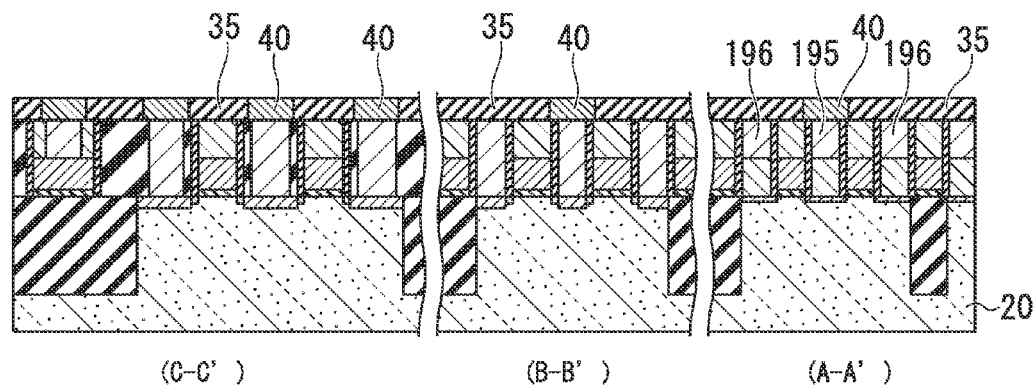
FIG. 36A is a fragmentary cross sectional elevation view, taken along the A-A' line, B-B' line, and C-C' line of FIG. 36C, illustrating the semiconductor device in a step, subsequent to the step of FIG. 35A, involved in the method of forming the semiconductor device, in which a second interlayer insulating film and contact plugs are formed in the peripheral circuit region and the memory cell region on the semiconductor substrate, in accordance with still another embodiment of the present invention.
Figure 36B:
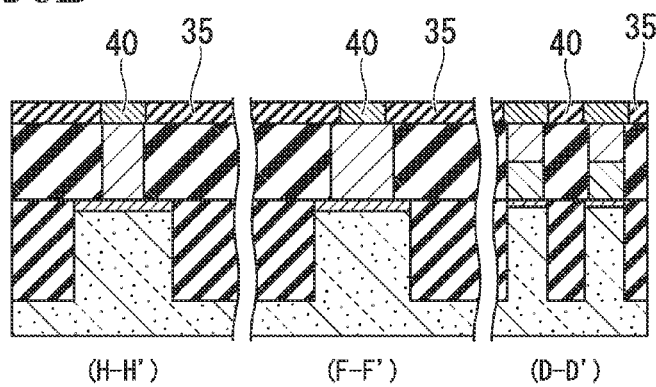
FIG. 36B is a fragmentary cross sectional elevation view, taken along the D-D' line of FIG. 36C, illustrating the semiconductor device in a step, subsequent to the step of FIG. 35B, involved in the method of forming the semiconductor device in accordance with still another embodiment of the present invention.
Figure 36C:
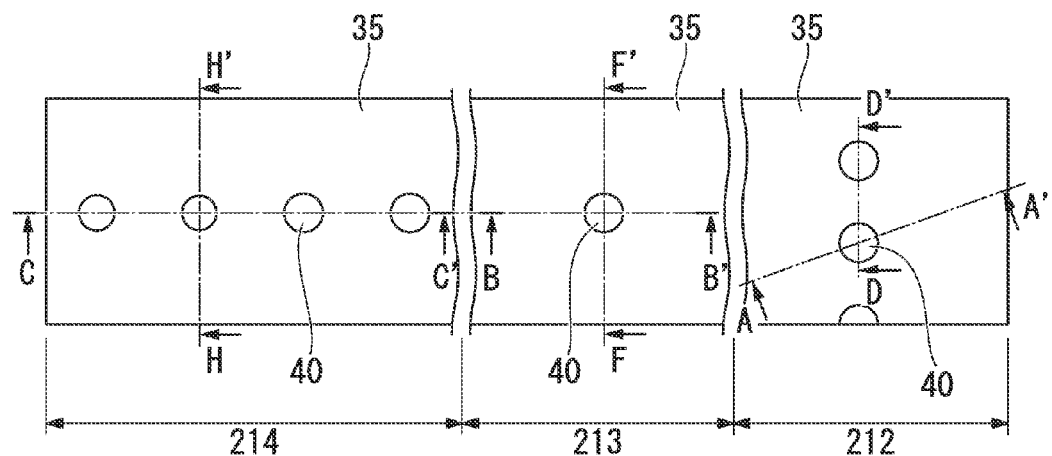
FIG. 36C is a fragmentary plan view illustrating the semiconductor device in a step, subsequent to the step of FIG. 35C, involved in the method of forming the semiconductor device in accordance with still another embodiment of the present invention.

Similar to the process step as described based on FIGS. 23A to 23C in the above-described second embodiment, as shown in FIGS. 36A to 36C, a second interlayer film 35 and a second contact plug 40 are formed.

In the cell peripheral circuit region 213, the second contact plug 40 is disposed so as to connect to the cell peripheral contact plug 294 positioned in the central part of the active region K13 along the Y direction.

Figure 37A:
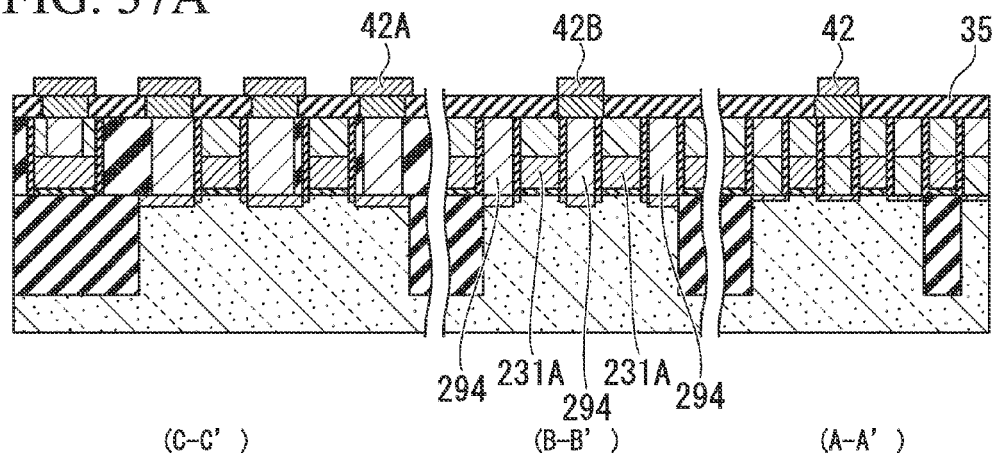
FIG. 37A is a fragmentary cross sectional elevation view, taken along the A-A' line, B-B' line, and C-C' line of FIG. 37C, illustrating the semiconductor device in a step, subsequent to the step of FIG. 36A, involved in the method of forming the semiconductor device, in which wirings are formed over the contact plugs in the peripheral circuit region, the cell peripheral circuit region, and the memory cell region on the semiconductor substrate, in accordance with still another embodiment of the present invention.
Figure 37B:
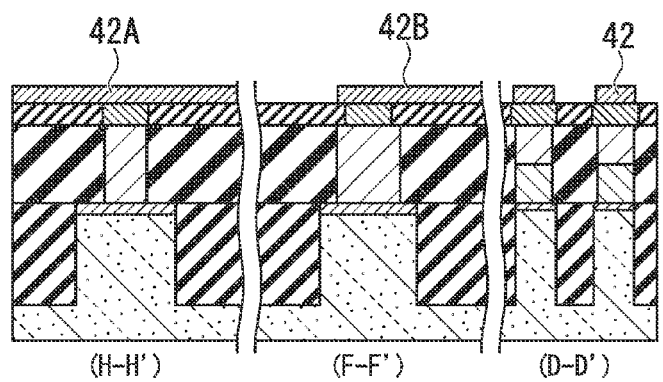
FIG. 37B is a fragmentary cross sectional elevation view, taken along the D-D' line of FIG. 37C, illustrating the semiconductor device in a step, subsequent to the step of FIG. 36B, involved in the method of forming the semiconductor device in accordance with still another embodiment of the present invention.
Figure 37C:
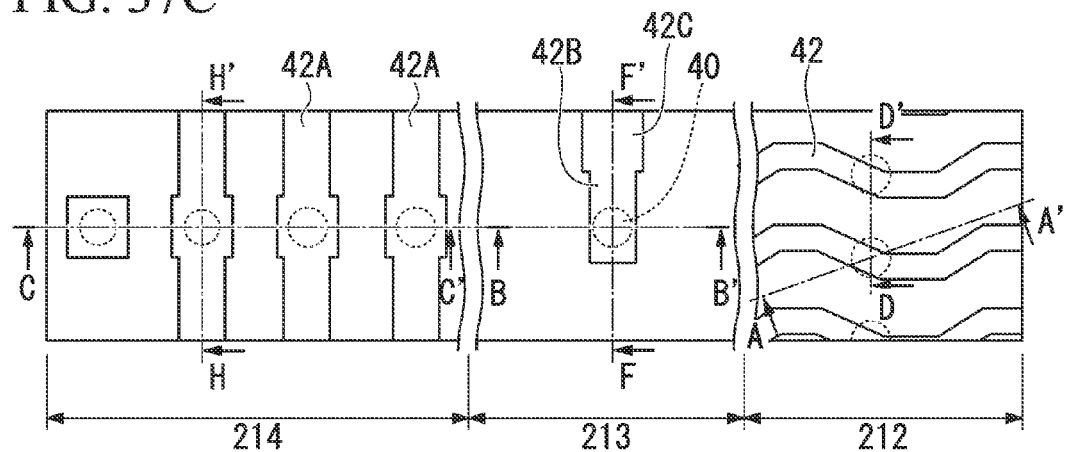
FIG. 37C is a fragmentary plan view illustrating the semiconductor device in a step, subsequent to the step of FIG. 36C, involved in the method of forming the semiconductor device in accordance with still another embodiment of the present invention.

Similar to the process step in the above-described second embodiment, first wirings 42, 42A, and 42B are formed. Also, as shown in FIGS. 37B and 37C, in the cell peripheral circuit region 213, an extended part of the first wiring 42B is a local wiring 42C which extends in the Y direction. The first wiring 42B is connected to the upper part of the second contact plug 40.

Figure 38A:
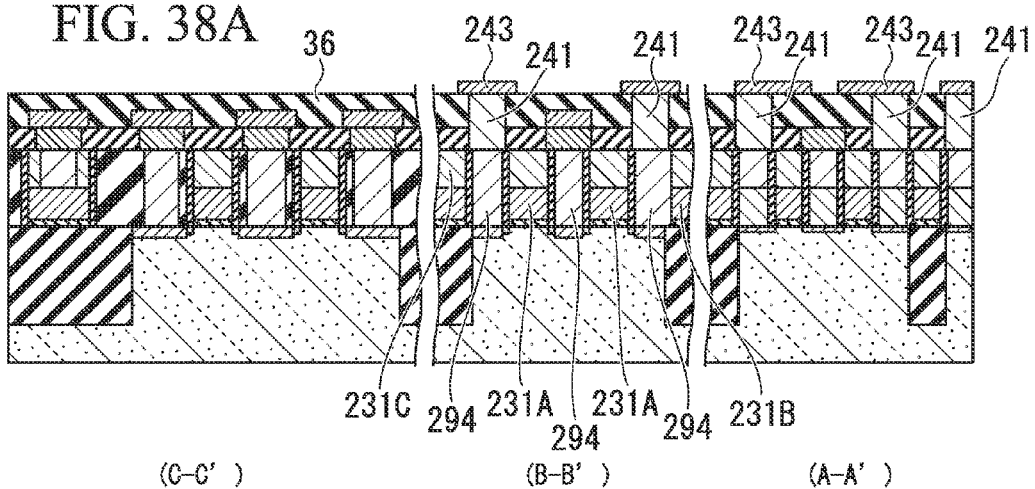
FIG. 38A is a fragmentary cross sectional elevation view, taken along the A-A' line, B-B' line, and C-C' line of FIG. 38C, illustrating the semiconductor device in a step, subsequent to the step of FIG. 37A, involved in the method of forming the semiconductor device, in which a third interlayer insulating film is formed in the peripheral circuit region, the cell peripheral circuit region, and the memory cell region on the semiconductor substrate, in accordance with still another embodiment of the present invention.
Figure 38B:
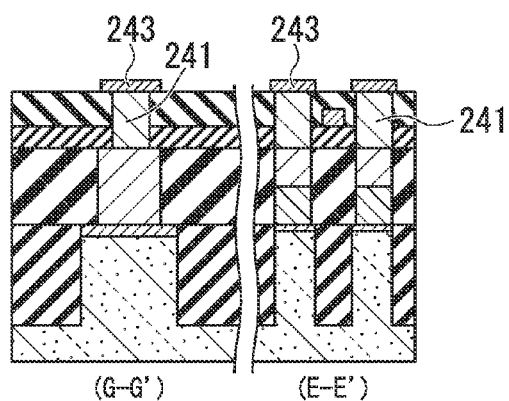
FIG. 38B is a fragmentary cross sectional elevation view, taken along the D-D' line of FIG. 38C, illustrating the semiconductor device in a step, subsequent to the step of FIG. 37B, involved in the method of forming the semiconductor device in accordance with still another embodiment of the present invention.
Figure 38C:
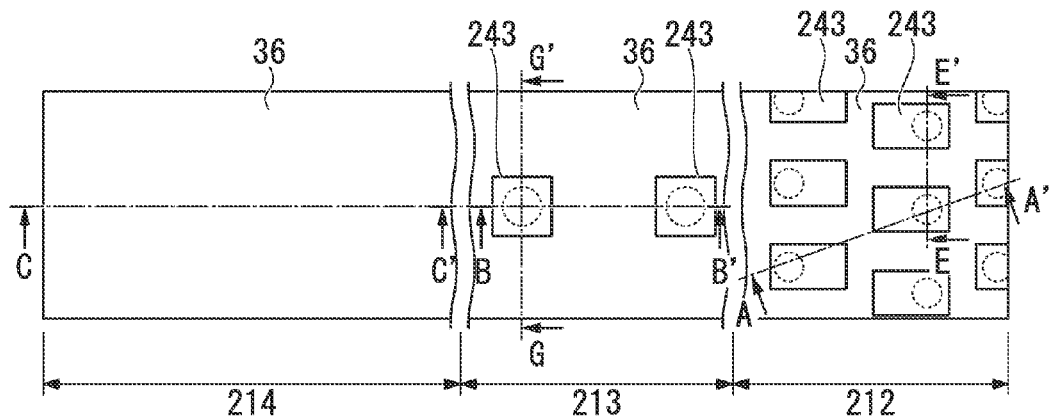
FIG. 38C is a fragmentary plan view illustrating the semiconductor device in a step, subsequent to the step of FIG. 37C, involved in the method of forming the semiconductor device in accordance with still another embodiment of the present invention.

As shown in FIGS. 38A to 38C, a third interlayer film 36 and a third contact plug 241 are formed. In the cell peripheral circuit region 213, third contact plugs 241 are disposed so as to connect to the cell peripheral contact plugs 294 positioned at both sides of the active region K13 along the Y direction.

A second wiring 243 is formed over the third contact plug 241. The capacitor 64 is formed on the second wiring 243 in the similar manner described based on FIGS. 14A and 14B according to the above-described first embodiment.

Figure 39A:
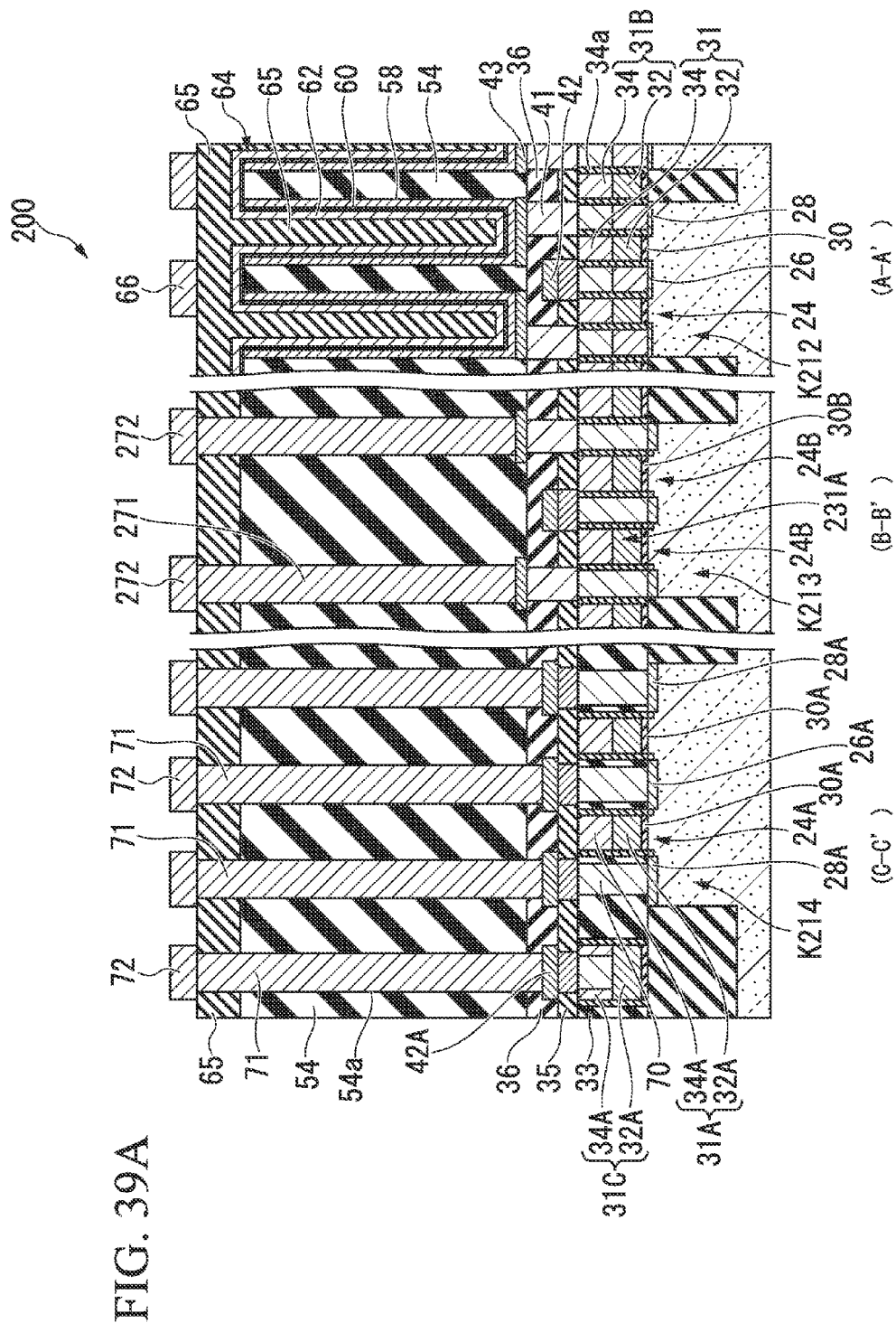
FIG. 39A is a fragmentary cross sectional elevation view, taken along the A-A' line, B-B' line, and C-C' line of FIG. 39B, illustrating the semiconductor device in a step, subsequent to the step of FIG. 38A, involved in the method of forming the semiconductor device, in which contact plugs and wirings are formed in the peripheral circuit region and the cell peripheral circuit region on the semiconductor substrate and a capacitor is formed in the memory cell region, in accordance with still another embodiment of the present invention.
Figure 39B:
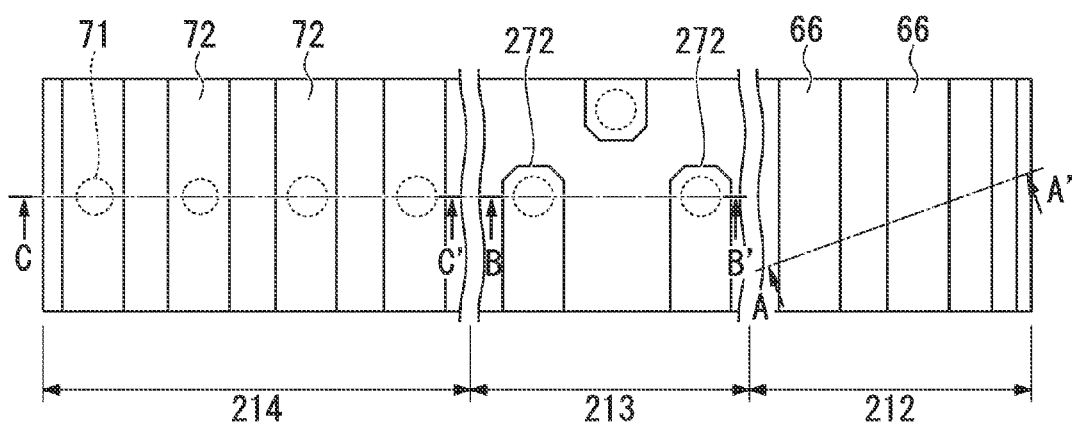
FIG. 39B is a fragmentary plan view illustrating the semiconductor device in a step, subsequent to the step of FIG. 38C, involved in the method of forming the semiconductor device in accordance with still another embodiment of the present invention.

A capacitor lower electrode 58 as shown in FIG. 39A is connected to and formed on the second wiring 243 over the drain cell plug 294. An upper wiring contact plug 71 is connected to and formed on the second wiring 243 over a drain peripheral contact plug 199 of the peripheral circuit region 214.

The gate electrodes 231A, 231B, and 231C are disposed in parallel in the X direction with a high density to the limit of processing based on the design rule. For this reason, each contact plug 294 of the cell peripheral circuit region 213 is also disposed with a high density along the Y direction. Formation of contact plugs in the same layer, which are formed over and correspond to the contact plugs 294 of the cell peripheral circuit region 213, is difficult because the contact plugs 294 of the cell peripheral circuit region 213 are disposed with such a high density. In this case, shorting is likely to occur between adjacent contact plugs due to the deformation or the like of the photolithography film for masking at the time of a patterning process. For this reason, the contact plugs connecting to the contact plugs 294 which are provided in the cell peripheral circuit region 213 are disposed separately as two types, such as the second contact plug 40 and the third contact plugs 241, 241. By doing this, because the contact holes for the second contact plug 40 and for the third contact plugs 241, 241 are formed separately in two steps, the deformation of photolithography film for masking is prevented, so that it is possible to avoid shorting between adjacent contact plugs.

After the formation step shown as in FIG. 38, the same process step as the process step described based on FIG. 14 in the above-described first embodiment, or the same process step as the process step described based on FIG. 25 in the second embodiment are performed. The capacitor 64 and the other are formed in the memory cell region 212. The upper wiring contact plug 71 and the other are formed in the peripheral circuit region 214. An upper wiring contact plug 271 and an upper wiring 272 are further formed in the cell peripheral circuit region 213. Thereby, the semiconductor device 200 of the present embodiment is formed.

Because it is possible to manufacture the upper wiring contact plug 271 and the upper wiring 272 which are formed in the cell peripheral circuit region 213 by the same process step as the upper wiring contact plug 71 and the upper wiring 72 that are formed in the peripheral circuit region 214, a detailed description thereof is omitted herein.

In the present third embodiment, the cell contact plug 139 disposed in the memory cell region 212 is formed by the self-alignment method, using the mask 185 having the band-shaped (line-shape) aperture 186, which is used in the second embodiment. The cell peripheral contact plug 294 disposed in the cell peripheral circuit region 213 is also formed by the self-alignment method, using the mask 285 having the rectangular aperture 285a.

By doing this, it is possible to easily form the cell contact plug 139 and the cell peripheral contact plug 294 that can accommodate microstructuring. In the case in which the cell contact plug 139 and the cell peripheral contact plug 294 in the cell peripheral circuit region 213 are also formed by the self-alignment method using the masks 185 and 285 that have such band-shaped and rectangular contact apertures, while suppressing an increase of the manufacturing process steps, it a contact plug having a low resistance value can be formed.

Fourth Embodiment

In the fourth embodiment, a method for forming a cell plug lower region using a single crystal silicon film which is produced by a selective epitaxial growing method will be described below using FIG. 40 and FIG. 41.

Figure 40:
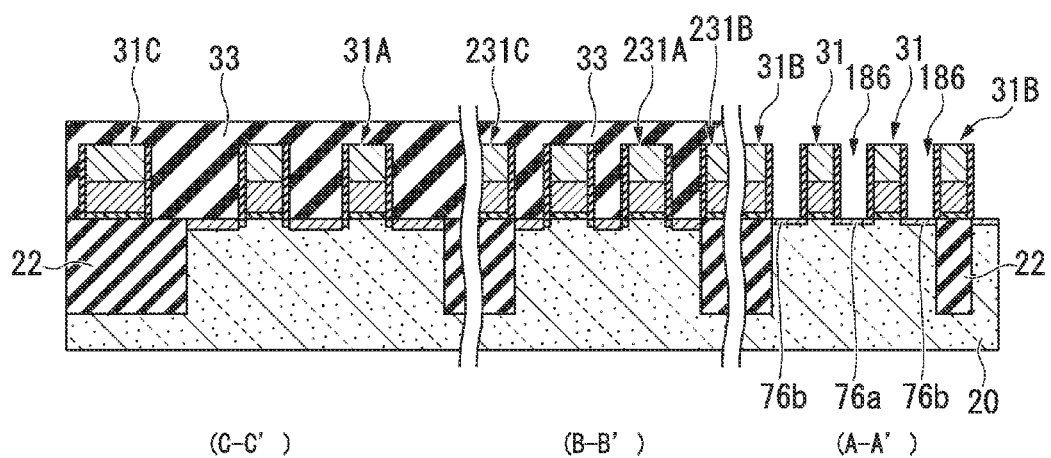
FIG. 40 is a fragmentary cross sectional elevation view illustrating the semiconductor device in a step involved in a method of forming a semiconductor device, in which a first interlayer insulating film is formed in a peripheral circuit region and a cell peripheral circuit region on the semiconductor substrate and a cell contact hole is formed in the memory cell region, in accordance with yet another embodiment of the present invention.
Figure 41:
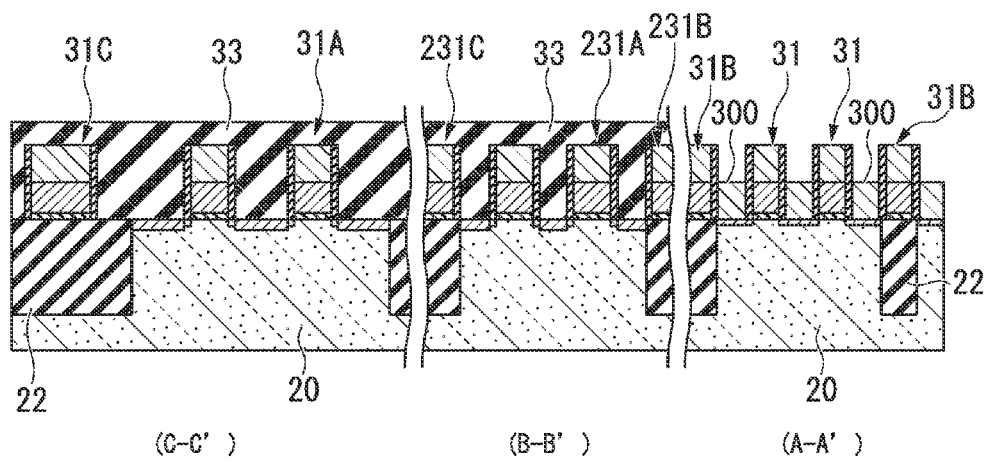
FIG. 41 is a fragmentary cross sectional elevation view illustrating the semiconductor device in a step, subsequent to FIG. 40, involved in the method of forming the semiconductor device, in which a lower conductive plug is formed in the memory cell region, in accordance with yet another embodiment of the present invention.

FIG. 40 is a fragmentary cross sectional elevation view illustrating the semiconductor device in a step involved in a method of forming a semiconductor device, in which, after the process step shown in FIG. 28A of the previously described third embodiment, the cell contact mask 185 has been removed, in accordance with yet another embodiment of the present invention. The position of the cross section shows the same position as the position shown in FIG. 28A.

By selective epitaxial growth of silicon, a lower conductive plug 300, which is a silicon film including phosphorous as an impurity element, is formed on the semiconductor substrate (cell diffusion layers 76a and 76b) 20. The cell diffusion layers 76a and 76b are shown through the cell contact hole 186. The thickness of the lower conductive plug 300 made of silicon film is to be formed to be approximately the same as the gate conductive film 32.

The selective epitaxial growth is performed by using dichlorosilane ($SiH_2Cl_2$), hydrogen chloride (HCl), and hydrogen ($H_2$) as a source gas. Phosphine ($PH_3$) is an example of an impurity doping gas.

After this process step, the semiconductor device can be obtained by performing the same process steps starting with the step shown in FIG. 30 of the above-described third embodiment.

According to the present embodiment, the etching back of polycrystalline silicon film can be omitted, so that the manufacturing costs can be reduced. It is also possible to suppress the formation of a natural oxide film at the boundary with the semiconductor substrate 20, so that the effect of further reduction of the contact resistance can be achieved.

It is apparent that the present invention is not limited to the above embodiments, but may be modified and changed without departing from the scope and spirit of the invention.

For example, a MOS transistor may be a trench gate type in which a part of a gate electrode is buried within a trench, rather than a planar type.

Also, in addition to a semiconductor device including a memory cell region other than a DRAM, the present embodiment can be applied to a resistance random access memory (RRAM) and a phase-change memory (PRAM) or the like.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware that is constructed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

What is claimed is:

1. A method of forming a semiconductor device, the method comprising:
   forming a first transistor including a gate, and a first diffusion layer in a cell region of a semiconductor substrate, the first diffusion layer including a source region and a drain region;
   forming a second transistor including a second diffusion layer in a peripheral circuit region of the semiconductor substrate;
   forming a first contact layer comprising silicon, the first contact layer being in contact with the source region and the drain region of the first diffusion layer; and
   forming a metal film over the first and second transistors, the metal film being in contact with the first contact layer on the source region and the first contact layer on the drain region, the metal film being in contact with the second diffusion layer;
   patterning the metal film to form a first contact plug being in contact with the first contact layer and a second contact plug being in contact with the second diffusion layer; and
   forming a first suicide layer between the first contact layer and the first contact plug and a second silicide layer between the second diffusion layer and the second contact plug.

2. The method according to claim 1, further comprising:
   forming a first interlayer film over the first and second transistors; and
   forming a first contact hole, the first contact hole reaching the first diffusion layer,
   wherein forming the first contact layer comprises:
   forming a silicon film to fill the first contact hole; and
   etching back the silicon film so that a top of the silicon film is lower than a top of the first interlayer film.

3. The method according to claim 2, further comprising:
   forming a second contact hole before forming the metal film, the second contact hole reaching the second diffusion layer.

4. The method according to claim 1, wherein forming the metal film comprises:
   forming a second contact layer;
   forming a barrier layer on the second contact layer; and
   forming a core layer on the barrier layer, wherein the second contact layer comprises at least one of titanium and cobalt.

5. A semiconductor device formed by the method according to claim 1.

* * * * *